US007565189B2

(12) United States Patent
Mansfield et al.

(10) Patent No.: US 7,565,189 B2
(45) Date of Patent: Jul. 21, 2009

(54) MRI GRADIENT COILS WITH REDUCED NEURAL STIMULATION

(76) Inventors: Peter Mansfield, 68 Beeston Fields Drive, Bramcote, Nottingham NG9 3DD (GB); Roger M. Bowley, Mr Centre, University of Nottingham, University Park, Nottingham, NG7 26D (GB)

(*) Notice: Subject to any disclaimer, the term of this patent is extended or adjusted under 35 U.S.C. 154(b) by 910 days.

(21) Appl. No.: 10/494,549

(22) PCT Filed: Oct. 30, 2002

(86) PCT No.: PCT/GB02/04846

§ 371 (c)(1),
(2), (4) Date: Nov. 15, 2004

(87) PCT Pub. No.: WO03/038461

PCT Pub. Date: May 8, 2003

(65) Prior Publication Data

US 2005/0068030 A1 Mar. 31, 2005

(30) Foreign Application Priority Data

Nov. 1, 2001 (GB) ............................ 0126252.6
Aug. 15, 2002 (GB) ............................ 0218962.9

(51) Int. Cl.
*A61B 5/05* (2006.01)
*G01V 3/00* (2006.01)
(52) U.S. Cl. ................... 600/410; 600/421; 324/318
(58) Field of Classification Search ............... 600/410; 324/309, 318, 319, 322; 336/224
See application file for complete search history.

(56) References Cited

U.S. PATENT DOCUMENTS

| 5,198,769 A | 3/1993 | Frese et al. |
| 5,764,059 A | 6/1998 | Bowtell et al. |
| 5,865,177 A | 2/1999 | Segawa |
| 6,728,570 B2 * | 4/2004 | Kim .......................... 600/422 |

OTHER PUBLICATIONS

Bowtell, R. et al., "Analytic approach to the design of transverse gradient coils with co-axial return paths", Magnetic Resonance in Medicine, Mar. 1999, pp. 600-608, vol. 41 No. 3.
Bowtell, R. et al., "Analytical calculations of the E-fields induced by time-varying magnetic fields generated by cylindrical gradient coils", Magnetic Resonance in Medicine, Nov. 2000, pp. 782-790, Vo. 44 No. 5.
Brand, M. et al., "Stimulation Properties of Gradient Coils", Proceedings of the Natl. Resonance in Medicine, Apr. 21-27, 2001, p. 1765, vol. 3.

* cited by examiner

*Primary Examiner*—Eric F Winakur
*Assistant Examiner*—Michael T Rozanski
(74) *Attorney, Agent, or Firm*—Kilpatrick Stockton LLP

(57) ABSTRACT

A novel approach to the design of gradient coils for MRI is introduced which takes into account from the start the effects of induced E-fields and hence currents in a patient subjected to time dependent magnetic field gradients. The approach has led to conceptually novel designs of gradient coils which comprise distributions of electrodes or tessellae placed around the basic coil structure. When properly energised the electrode arrays are able, in the simplest case, to reduce the maximum E-field experienced by the patient by approximately a factor of three over that experienced with a standard fingerprint or distributed transverse gradient coil, the comparison being done for the same gradient strength, same coil diameter and same ROI.

30 Claims, 51 Drawing Sheets

Figure 1A:
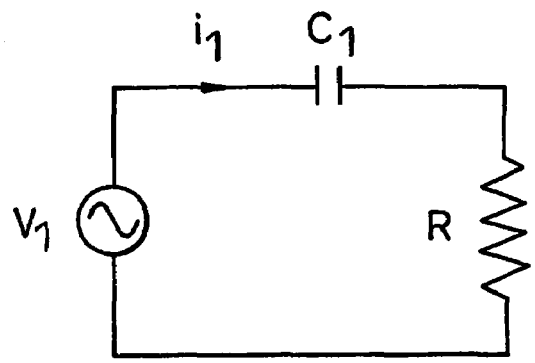

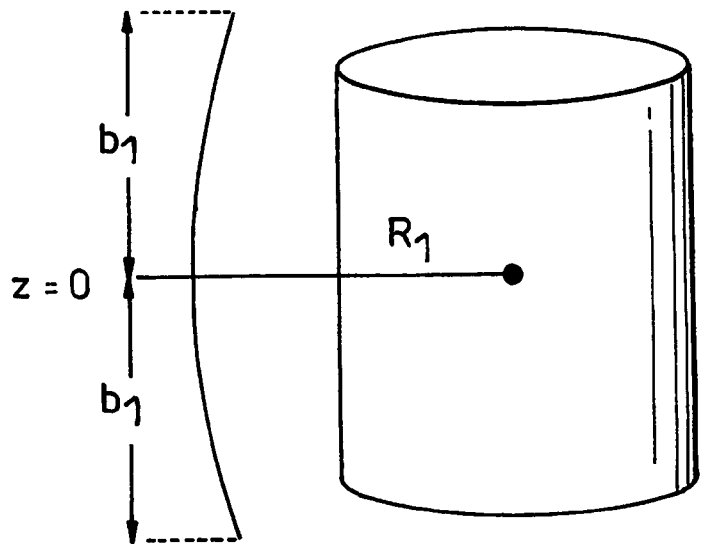
Fig. 20(a)
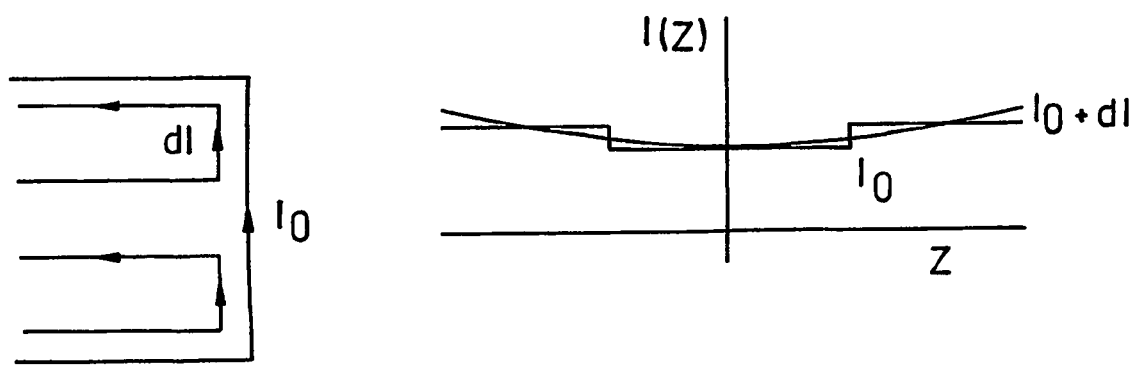
Fig. 20(c)
Fig. 20(b)

$Ve^{i\omega t + \phi}$

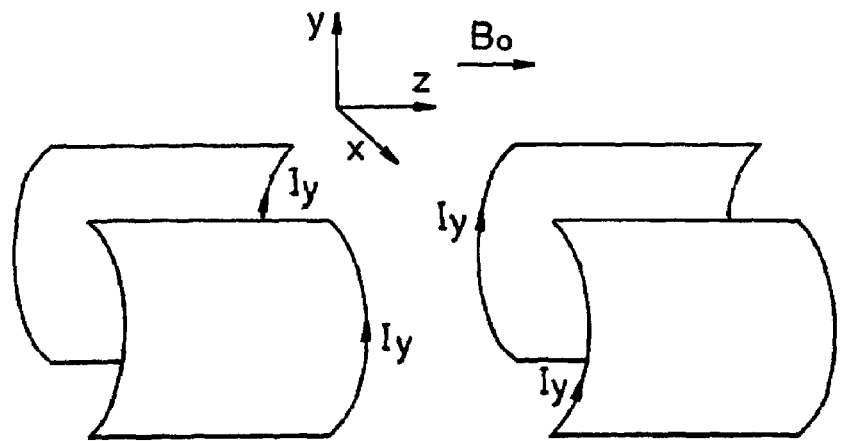
Fig. 28(a)
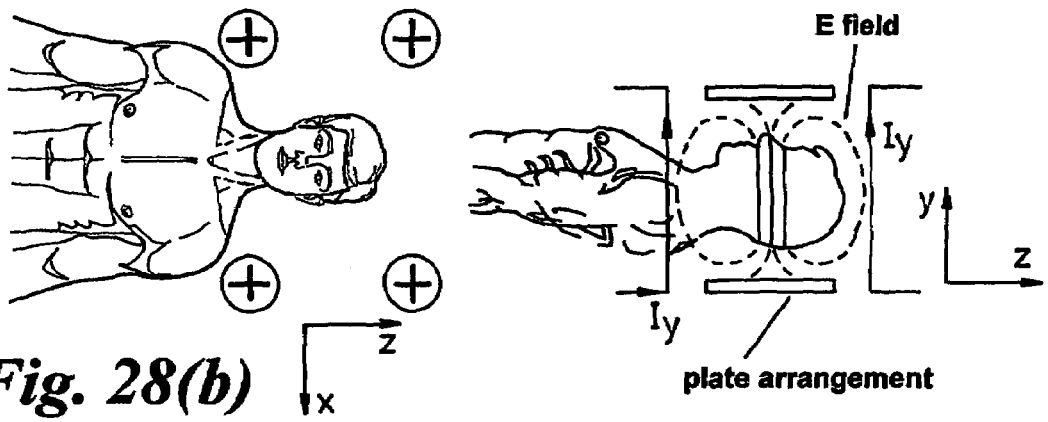
Fig. 28(b)
Fig. 28(c)
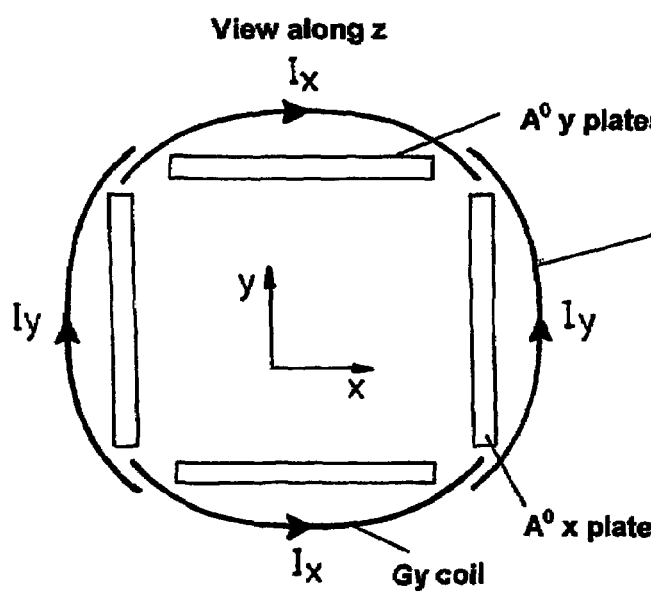
Fig. 28(d)

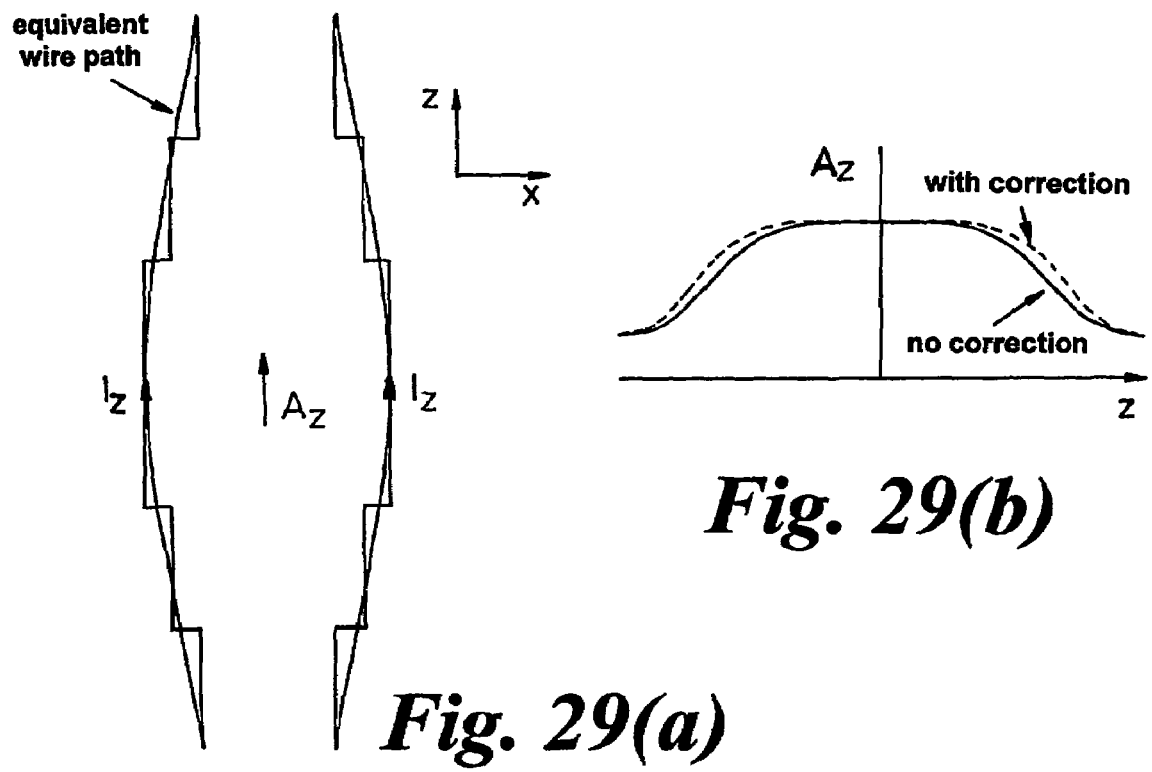
Fig. 29(a)
Fig. 29(b)
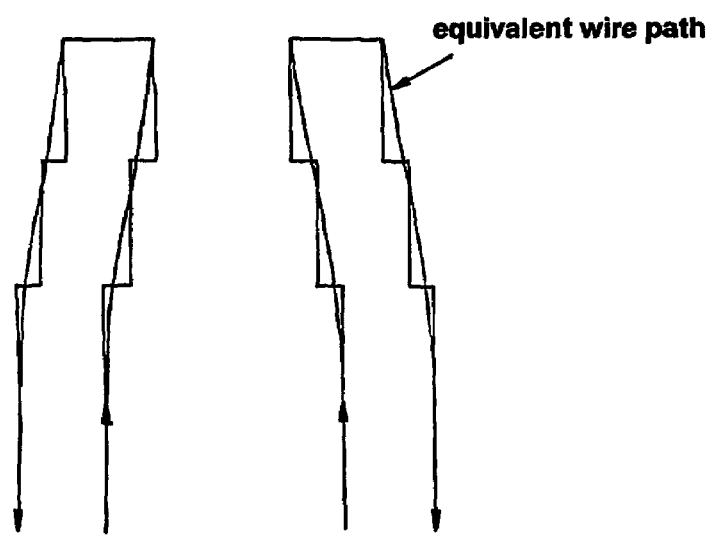
Fig. 29(c)

HEAD COIL
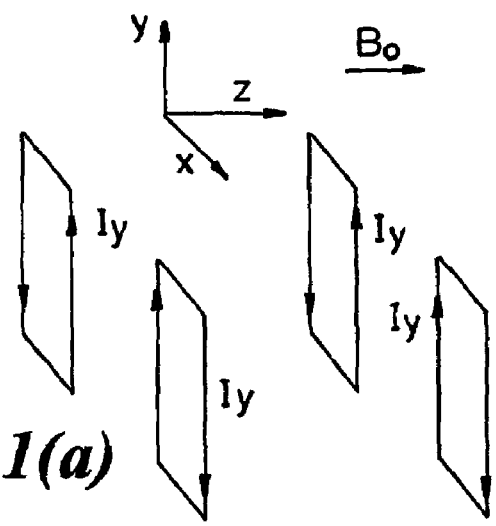
Fig. 31(a)
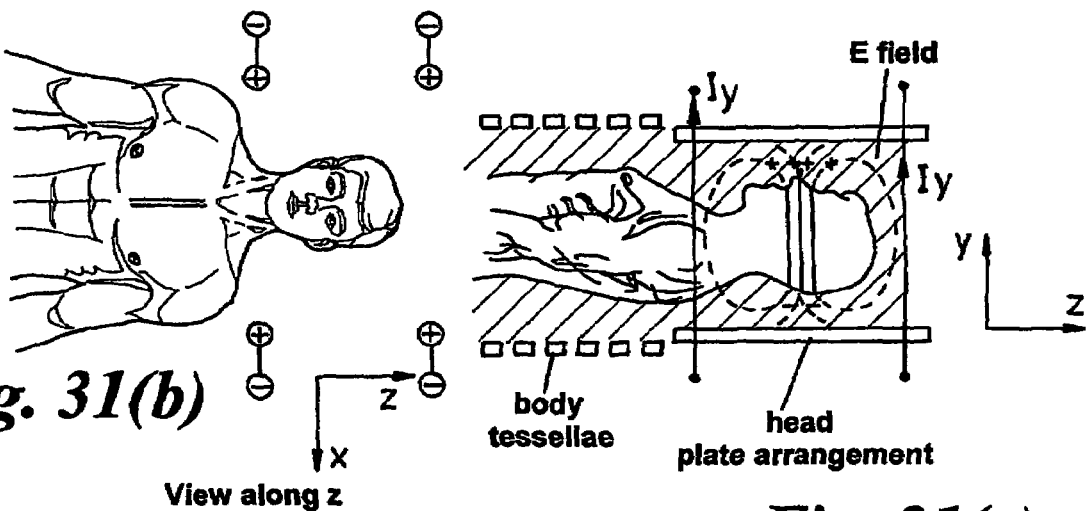
Fig. 31(b)
Fig. 31(c)
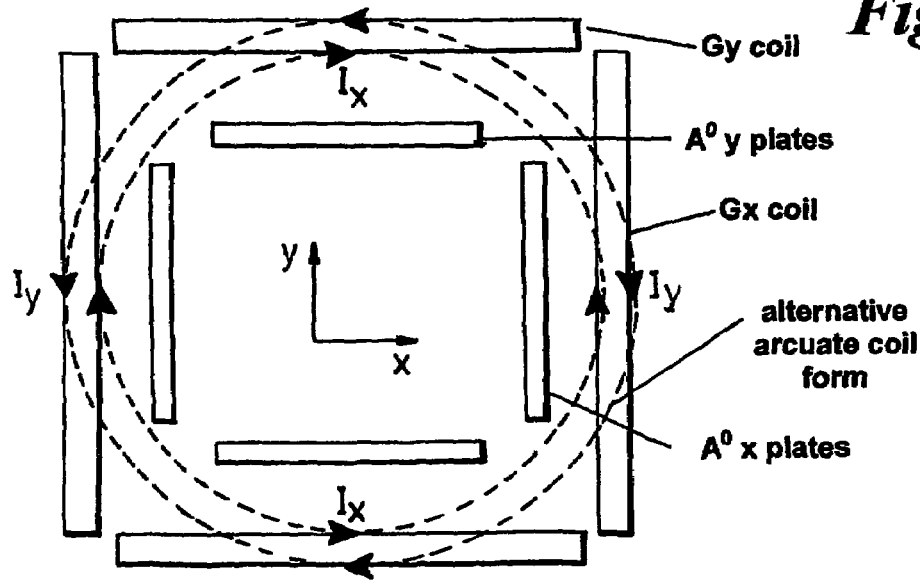
Fig. 31(d)

MRI GRADIENT COILS WITH REDUCED NEURAL STIMULATION

INTRODUCTION

The present invention relates to gradient coils for MRI and more particularly to the design of gradient coils for MRI which takes into account from the start the effects of induced E-fields and hence currents in a patent subjected to time dependent magnetic field gradients.

In order to satisfactorily implement ultra-high-speed clinical imaging at high static magnetic field strengths, three major obstacles must be overcome. The first is the ability to generate and switch large gradient magnetic fields within the close confines of a superconductive magnet. This problem has been virtually solved with the introduction of active magnetic screening in MRI. (P. Mansfield, B. Chapman, R. Turner and R. M. Bowley, Active Magnetic Screening in MRI, U.S. Pat. No. 4,978,920 Priority Date September 1985).

The second problem is the acoustic noise generated by the activated gradient coils when placed in a high static magnetic field. This problem is largely one of safety and patient comfort. Recent new approaches to deal with this problem, proposed by Mansfield and Haywood (P. Mansfield and B. Haywood, Principles of Active Acoustic Control in Gradient Coil Design, MAGMA, 147-151 (2000)), have demonstrated an active control scheme capable of serious reductions in acoustic output from suitably designed gradient coils.

The third problem, which remains outstanding, is that of induced currents within the patient or subject which arise directly from the rapid magnetic field flux changes caused by the time varying gradients.

Much has been written about the deleterious effects on the body of magnetically induced currents (P. Mansfield, P. G. Morris, "NMR Imaging in Biomedicine", p. 317, Academic Press, New York (1982).

J. P. Reilly, Peripheral nerve stimulation and cardiac excitation by time varying magnetic fields: a comparison of thresholds. The office of Science and Technology, Center for Devices and Radiological Health, US Food and Drug Administration (1990).

NRPB Revised Guidelines, Br. J. Radiol. 56, 974 (1983); see also NRPB Board Statement on Clinical MR Diagnostic Procedures, vol. 2, no. 1 (1991).

P. R. Harvey, P. Mansfield, Avoiding Peripheral Nerve Stimulation: Gradient Waveform Criteria for Optimum Resolution in Echo-Planar Imaging, Mag. Res. Med. 32, 236-241 (1994).

P. Mansfield and P. R. Harvey, Limits to Neural Stimulation in Echo-Planar Imaging: Mag. Res. Med. 29, 746-758 (1993).

J. P. Reilly, Peripheral nerve stimulation by induced electric currents: Exposure to time-varying magnetic fields: Med. & Biol. Eng. & Comput. 27, 101-110 (1989).

A. L. Hodgkin, "The Conduction of the Nervous Impulse", Liverpool Univ. Press (1967).

R. Plonsey and R. C. Barr, "Bioelectricity; A Quantitative Approach", New York, Plenum Press (1988).

R. D. Stoy, K. R. Foster,. H. P. Schwan, Dielectric properties of mammalian tissues from 0.1 to 100 MHz: A Summary of recent data: Phys. Med. Biol. 27, 501-513 (1982).

B. R. Epstein and K. R. Foster, Anisotropy in the dielectric properties of skeletal muscle: Med. & Biol. Eng. & Comput. 21, 51-55 (1983).

F. L. H. Gielen, W. Wallinga-de-Jonge, K. L. Boon, Electric conductivity of skeletal muscle tissue: Experimental results from different muscles in vivo: Med. & Biol. Comput. 22, 569-577 (1984).

M. S. Cohen, R. M. Weisskoff, R. R. Rzedzian and M. L. Kantor, Sensory stimulation by time-varying magnetic fields: Mag. Res. Med. 14, 409-414 (1990).

T. F. Budinger, H. Fischer, D. Hentschel, H. E. Reinfelder and F. Schmitt, Neural stimulation dB/dt thresholds for frequency and number of oscillations using sinusoidal magnetic gradient fields: Proc. 9th Ann. Mtg. SMRM, New York, 1, 276 (1990).

J. D. Bourland, J. A. Nyenhuis, G. A. Mouchowar and L. A. Geddes, Human peripheral nerve stimulation from z-gradients: Proc. 9th Ann. Mtg. SMRM, New York, WIP, 1157 (1990).

H. Yamagata, S. Kuhara, Y. Seo, K. Sato, O. Hiwaki and S. Ueno, Evaluation of dB/dt thresholds for nerve stimulation elicited by trapezoidal and sinusoidal gradient fields in echo-planar imaging: Proc. 10th Ann. Mtg. SMRM, San Francisco, WIP, 1277 (1991).

R. Bowtell and R. M. Bowley, Analytic Calculations of the E-Fields Induced by Time-Varying Magnetic Fields Generated by Cylindrical Gradient Coils, Mag. Res. Med.44: 782-790 (2000).

Lawrence K. Forbes, Stuart Crozier, On a possible mechanism for peripheral nerve stimulation during magnetic resonance imaging scans, Phys. Med. Biol. 46, 591-608 (2001)).

V. Bangert, P. Mansfield, J. Phys. E. 15, 235 (1982)).

Many attempts have been made to quantify the magnitude of the induced currents and their interaction with the body's neurological network (A. L. Hodgkin, "The Conduction of the Nervous Impulse", Liverpool Univ. Press (1967)). Even now, precise knowledge of the details of the neuronal interaction is at best hazy. That there are strong interactions is evident from the many experimental studies which have used in some cases small local coils or in other cases large whole body gradients to induce a number of sensations ranging from peripheral tingling through sharp pin prick sensations and eventually to muscle twitch (P. R. Harvey, P. Mansfield, Avoiding Peripheral Nerve Stimulation:

Gradient Waveform Criteria for Optimum Resolution in Echo-Planar Imaging, Mag. Res. Med. 32, 236-241 (1994).

P. Mansfield and P. R. Harvey, Limits to Neural Stimulation in Echo-Planar Imaging: Mag. Res. Med. 29, 746-758 (1993).

M. S. Cohen, R. M. Weisskoff, R. R. Rzedzian and M. L. Kantor, Sensory stimulation by time-varying magnetic fields: Mag. Res. Med. 14, 409-414 (1990).

T. F. Budinger, H. Fischer, D. Hentschel, H. E. Reinfelder and F. Schmitt, Neural stimulation dB/dt thresholds for frequency and number of oscillations using sinusoidal magnetic gradient fields: Proc. 9th Ann. Mtg. SMRM, New York, 1, 276 (1990).

J. D. Bourland, J. A. Nyenhuis, G. A. Mouchowar and L. A. Geddes, Human peripheral nerve stimulation from z-gradients: Proc. 9th Ann. Mtg. SMRM, New York, WIP, 1157 (1990).

H. Yamagata, S. Kuhara, Y. Seo, K. Sato, O. Hiwaki and S. Ueno, Evaluation of dB/dt thresholds for nerve stimulation elicited by trapezoidal and sinusoidal gradient fields in echo-planar imaging: Proc. 10th Ann. Mtg. SMRM, San Francisco, WIP, 1277 (1991).

R. Bowtell and R. M. Bowley, Analytic Calculations of the E-Fields Induced by Time-Varying Magnetic Fields Generated by Cylindrical Gradient Coils, Mag. Res. Med. 44:782-790 (2000).

Lawrence K. Forbes, Stuart Crozier, On a possible mechanism for peripheral nerve stimulation during magnetic resonance imaging scans, Phys. Med. Biol. 46, 591-608 (2001)).

Any sensation induced in a patient is undesirable, especially if the patient is required to remain still and calm during the imaging procedure. However, a more serious concern is that the induced currents might interfere with the patient's physiological function, for example, in inducing an epileptic fit or in the worst case causing cardiac fibrillation leading to death.

These concerns have been the main driving force behind the need to understand and eventually to predict the critical magnetic field gradient strengths and time dependences so as to avoid reaching the neural-stimulation threshold in various parts of the anatomy.

The concept of directly controlling the induced currents does not appear to have occurred to anyone up to now. Thus hitherto, all work on magnetically induced neural-stimulation has been carried out with a view to working with the nature of extant coil designs and the given neural-stimulation threshold levels.

The present invention provides a method of reducing induced electric fields and currents in patients being scanned by MRI who are subjected to time dependent magnetic field gradients generated by a gradient coil, said method comprising backing off at least the principal component of the electric induction field $E^A$, caused by the vector potential A created by the currents in the gradient coil.

In a first embodiment the backing off step is accomplished passively by placing a pair of plate electrodes on either side of the patient, said electrodes being connected by a highly electrically conductive wire.

Each plate may comprise a mosaic of smaller non contiguous electrodes.

In a further embodiment the backing off step is accomplished actively by driving the pair of plate electrodes from a suitable voltage source.

Each plate may comprise a mosaic of smaller non contiguous electrodes each electrode and its corresponding electrode in the second plate being actively driven in pairs from a plurality of suitable voltage sources.

In a further embodiment the backing off step is accomplished by independently creating a vector potential to oppose the vector potential created by the currents in the gradient coil.

The independently created vector potential may be created by a set of long solenoids or by suitably placed and sized toroidal coils.

The invention further comprises apparatus for reducing induced electric fields and currents in patients being scanned by MRI who are subjected to time dependent magnetic field gradients generated by a gradient coil, said apparatus comprising means for backing off at least the principal component of the electric induction field $E^A$, caused by the vector potential A created by the currents in the gradient coil.

Preferably the apparatus comprises a pair of plate electrodes placed on either side of the patient, said electrodes being connected by a highly electrically conductive wire.

Each plate electrode may comprise a mosaic of smaller non contiguous electrodes.

Alternatively, the apparatus comprises a pair of plate electrodes placed on either side of the patient, the electrodes being connected via a suitable voltage source.

Each plate may comprise a mosaic of smaller non contiguous electrodes each electrode and its corresponding electrode in the second plate being actively driven in pairs and including a plurality of suitable voltage sources.

The apparatus may comprise means for independently creating a vector potential to oppose the vector potential created by the currents in the gradient coil.

The independently created vector potential may be created by a set of long solenoids or by suitably placed and sized torroidal coils.

The invention further provides a method of designing a gradient coil system for an MRI apparatus such that the component of the vector potential along the body axis is substantially zero over a body volume.

The invention further provides apparatus for reducing the induced electric field in patients in MRI apparatus comprising in combination a gradient coil system designed to produce a minimum in the component of vector potential along a body axis and including means for backing off the contribution to the electric field from the vector potential created by the currents in the gradient coil and in directions orthogonal to the body axis.

The invention further provides a method of designing a gradient for an MRI apparatus such that the component of the vector potential along the body axis of the MRI apparatus is substantially zero over the body volume, said method further comprising backing off the contribution to the electric field from the vector potential created by the currents in the gradient coil in directions orthogonal to the body axis.

The invention further provides a coil for generating a gradient field for an MRI apparatus, said gradient field having a substantially zero component of magnetic vector potential along the body axis.

The invention further comprises apparatus for magnetically screening a gradient coil such that the coil generates no magnetic field outside the coil assembly and a substantially zero component of magnetic vector potential along the body axis over the body volume within an MRI apparatus.

The invention further comprises a method for magnetically screening a gradient coil such that the coil generates no magnetic field outside the coil assembly and a substantially zero component of magnetic vector potential along the body axis over the body volume within an MRI apparatus.

Embodiment of the present invention will now be described, by way of example, with reference to the accompanying drawings in which:

FIG. 1

Equivalent electrical circuit for a patient experiencing induced currents in a time dependent magnetic field.

(a) Equivalent RC circuit with $C_1$ representing body capacitance and R the body resistance. $i_1$ is the induced current flow and $V_1$ the driving voltage.

(b) The equivalent circuit when parallel plates are added with additional capacitance $C_2$ and a time dependent voltage generator $V_2$ added. The combined current $i = i_1 = i_2$.

(c) Equivalent circuit as in (b) above but with the applied voltage $V_2$ now set to $-V_1$. In this case $i = 0$.

(d) Tracing from an MRI scan of the mediastinum in a volunteer showing the thoracic cavity, tc, heart mass, h with la and ra the left and right atrium respectively and spinal column, sc. Also inscribed on this tracing is a circle of radius 9 cm circumscribing the heart, an intermediate circle circumscribing most of the mediastinal cross-section with radius 20 cm and an outer circle of radius 22.5 cm. Angular wedges are also indicated corresponding to the cos $2\phi$ term in which the electric field is reduced to 0.2 of its value at $\rho$=20 cm.

FIG. 2

(a) Sketch showing disposition of the four inner wires in a gradient coil on a cylinder of radius $r_1$. The aperture or axial patient access is $2a_1$.

(b) Cylindrical coordinate system showing the inner wire at $R_1$ and return wire at $R_2$.

FIG. 3

Disposition of wires for a transverse gradient set all carrying positive currents. $2a_1$ is the aperture and $2d_1$ is the spacing between wires 1-4 and wires 2 and 3.

FIG. 4

Plot of magnetic field variation $b_y$ (T) within the ROI (m) for a four wire gradient coil. The gradient produced $G_x$=22.4533 mT m$^{-1}$, I=4000 A.

FIG. 5

Figure 3:
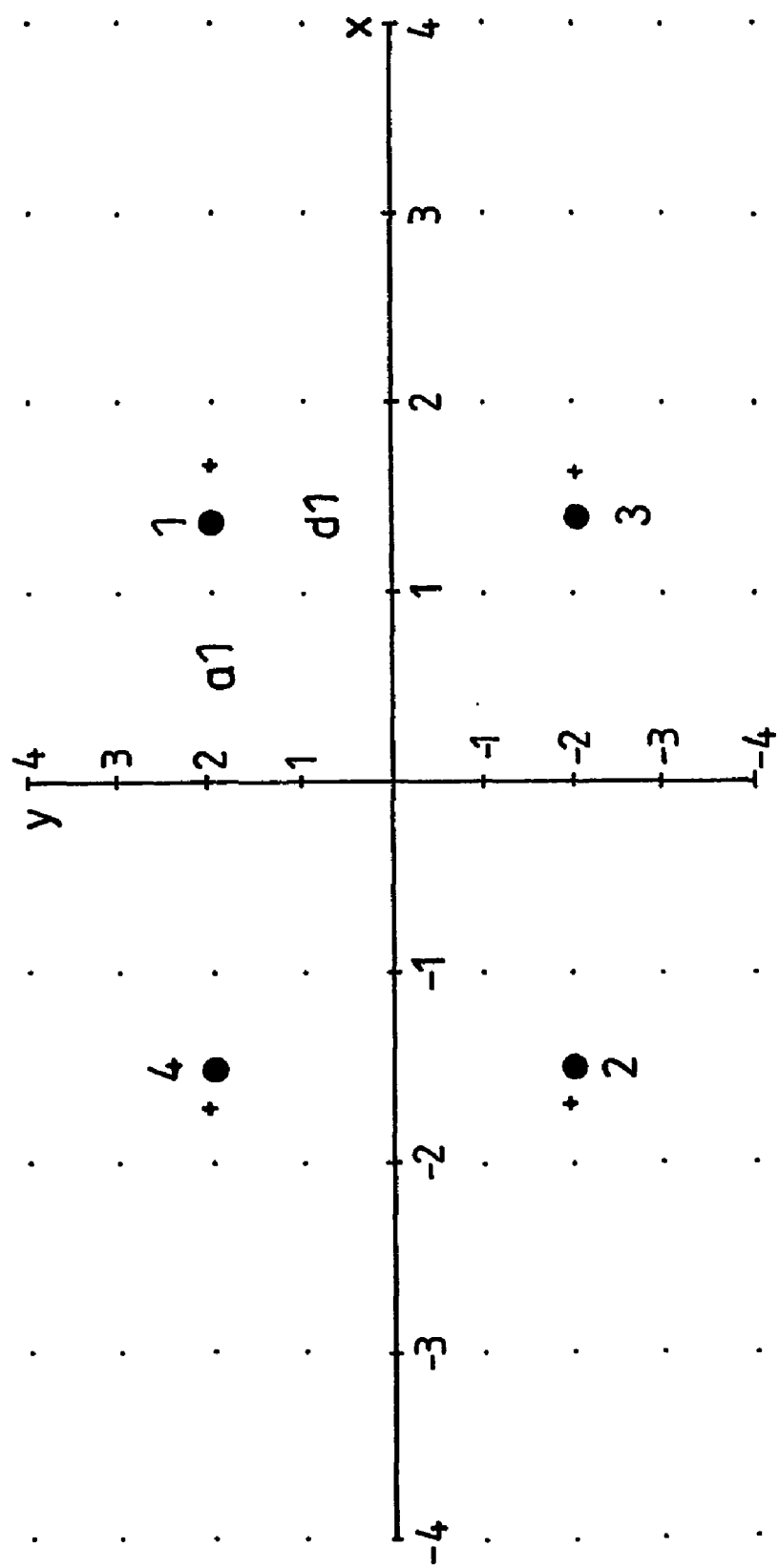
Figure 4:
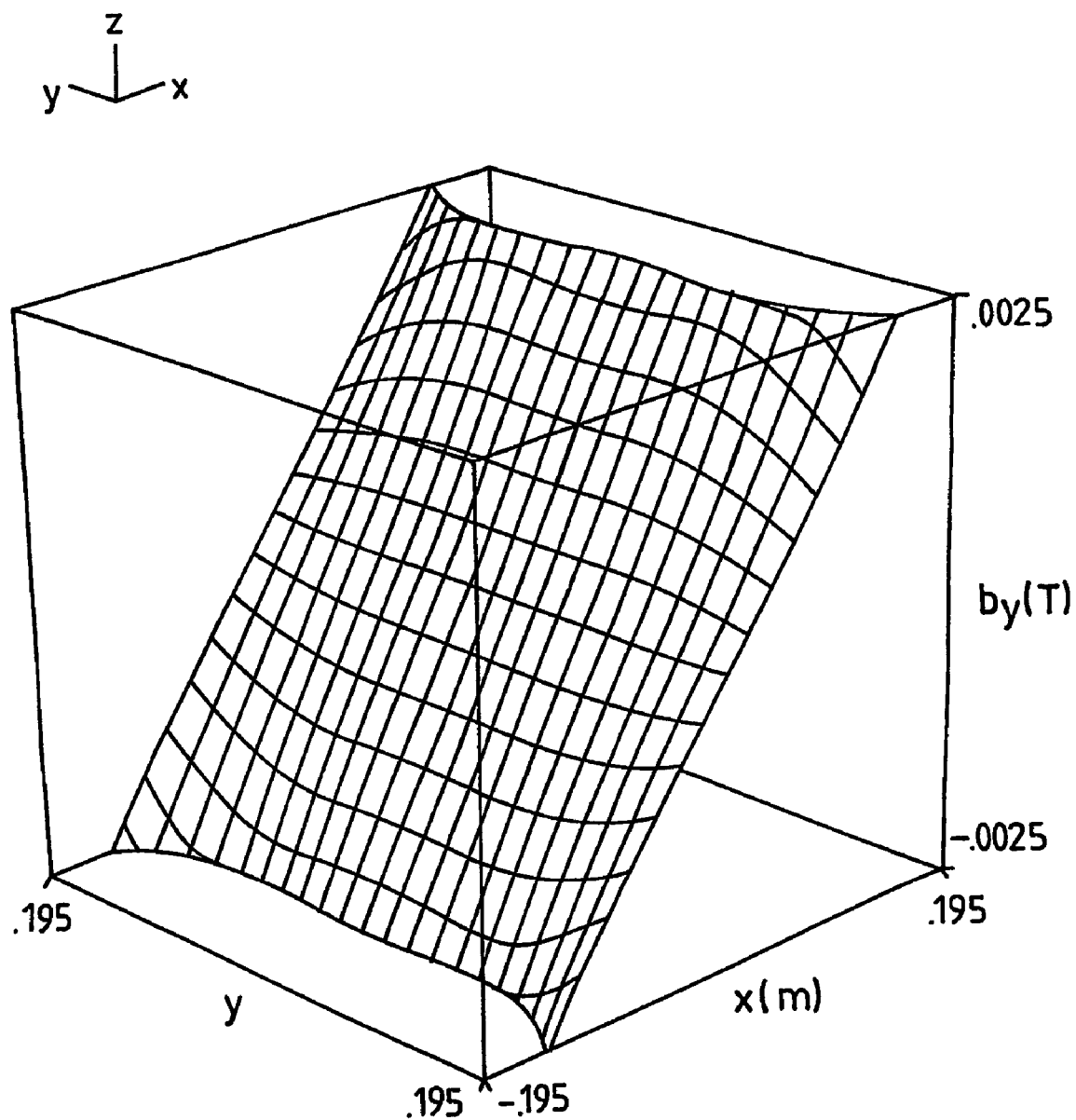

Plot of the vector potential $A_z$ for the gradient coil arrangement of FIG. 3 with $G_x$ as in FIG. 4.

FIG. 6

Plot of the vector potential $\Delta A_z = A_z - A_0 \Delta A_z$ shows a strong cos$2\phi$ dependence.

FIG. 7

Disposition of wires for a $G_y$ gradient coil. Note that wires 1 and 2 have positive current flowing and wires 3 and 4 have negative current flowing. $G_y$=33.915 mT m$^{-1}$ and I=4000 A.

FIG. 8

Figure 7:
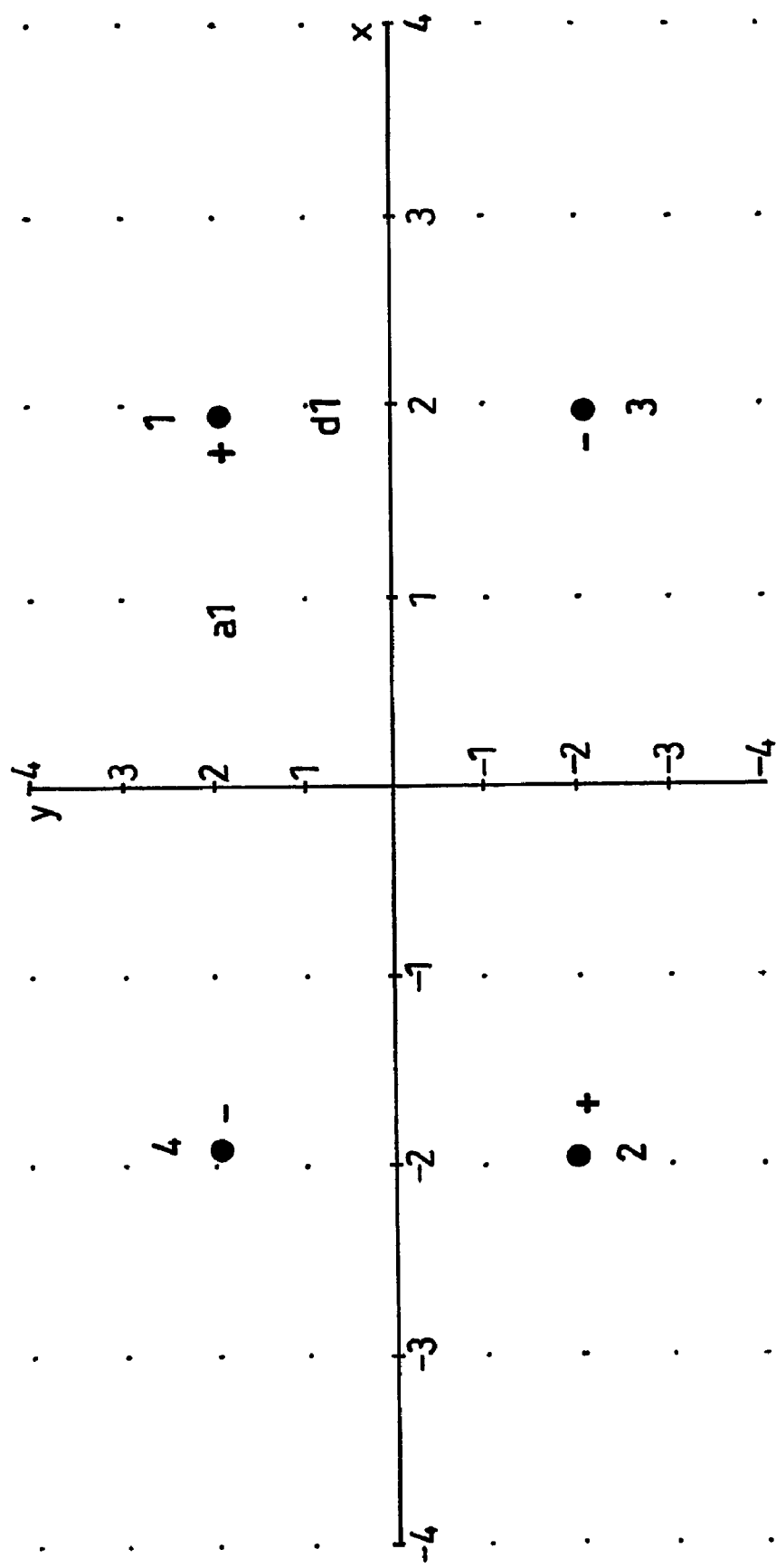

(a) Magnetic field $b_y$ (T) for the gradient coil arrangement of FIG. 7. With the standard ROI there is considerable non-linearity of the gradient field. $G_y$=33.915 mT m$^{-1}$ and I=4000 A.

Figure 8A:
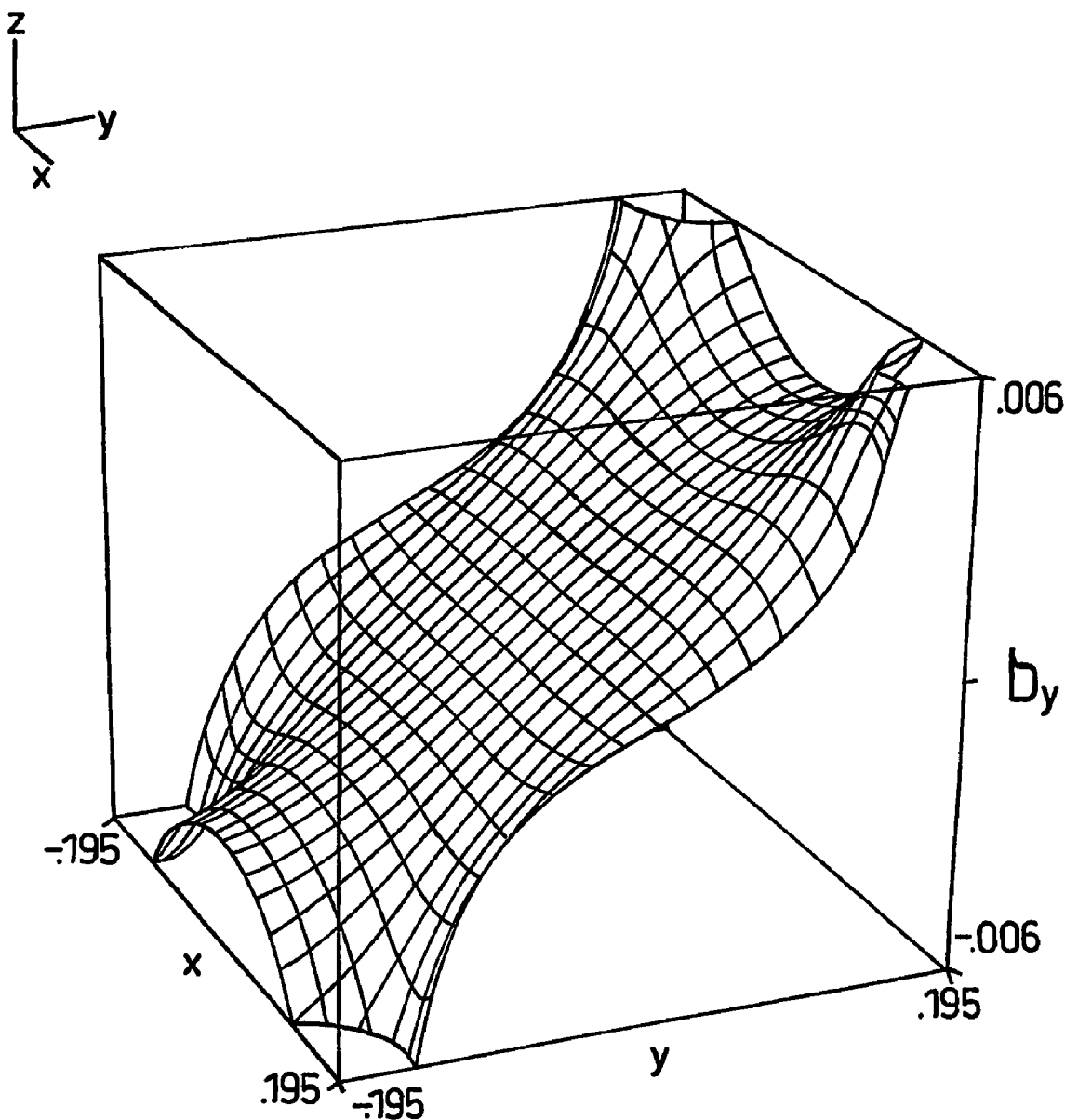

(b) The same magnetic field variation as in FIG. 8(a) above but with a reduced ROI showing a much more linear field variation.

FIG. 9

The vector potential $A_z$ for the gradient coil arrangement of FIG. 7 and magnetic field variation of FIG. 8(a).

FIG. 10

Disposition of wires for an alternative $G_x$ gradient coil. Note that wires 1 and 2 carry a positive current and wires 3 and 4 a negative current.

FIG. 11

Figure 10:
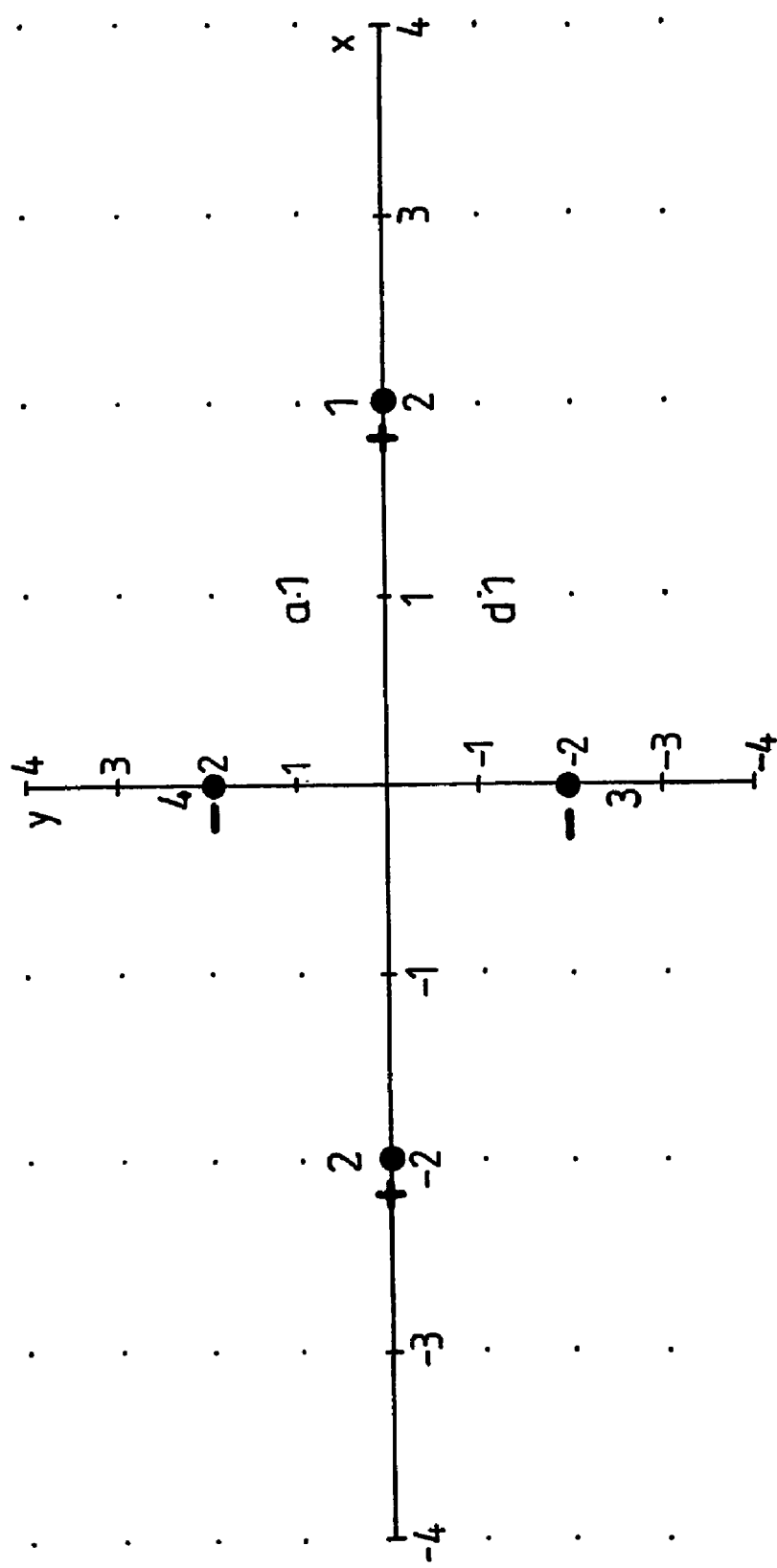

The magnetic field $b_y$ (T) is plotted for the coil arrangement described in FIG. 10. $G_x$=28.45 mT m$^{-1}$ and I=4000 A.

FIG. 12

Figure 11:
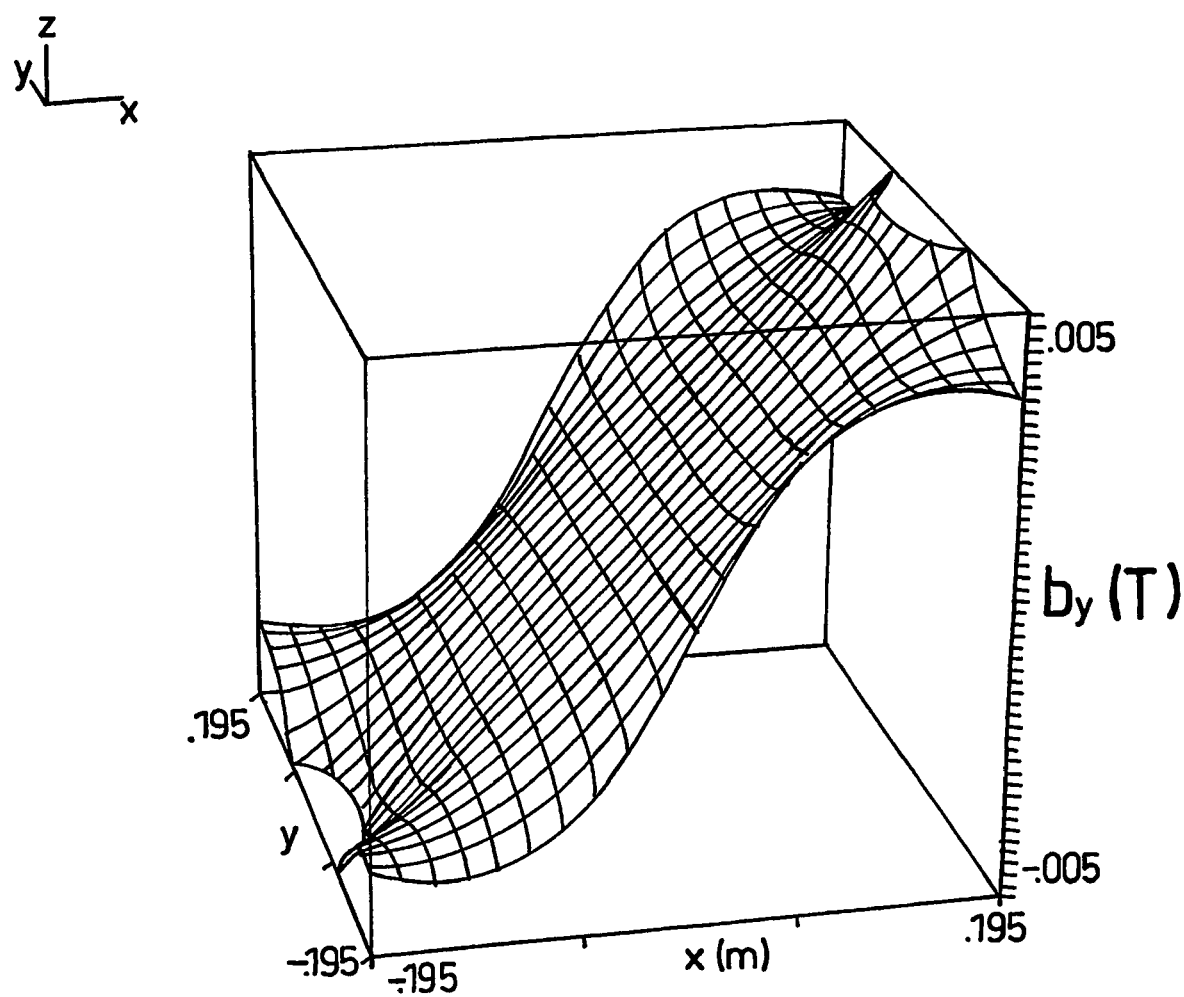

(a) The vector potential $A_z$ for the coil arrangement of FIG. 10 and the magnetic field of FIG. 11. This plot shows considerable asymmetry.

(b) Vector potential $A_z$ as in 12(a) above but with a reduced ROI. Asymmetry is still present.

FIG. 13

Sketch of patient equivalent cylinder with radius a and length 2l showing charge accumulation on top and bottom surfaces.

FIG. 14

Figure 13:
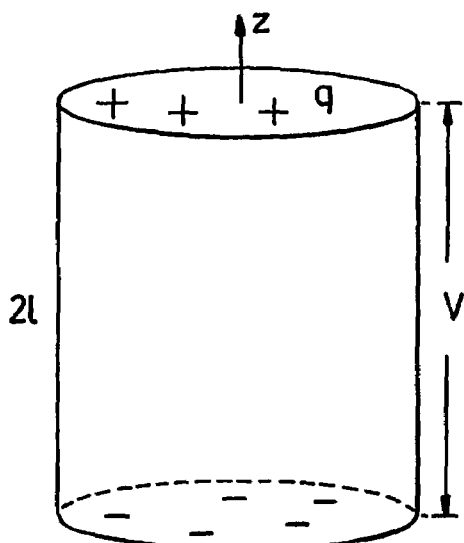

Waveforms associated with transient response in the patient equivalent cylinder of FIG. 13 when the vector potential A(r,t) is switched on but in a stepped fashion.

(a) Step input function lasting a period $t_w$.

Figure 14A:
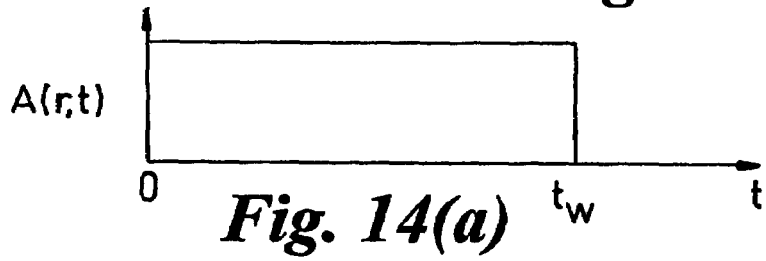

(b) The charge response, q(t), of FIG. 14(a) on the end surfaces of the cylinder.

(c) The induced current density response, j(t) within the cylinder body of FIG. 13.

FIG. 15

The equivalent electrical circuit for a patient equivalent cylinder of FIG. 13 subjected to an emf, $\mathscr{E}$(t), where $\rho$ and c are the resistivity and cylinder capacitance per unit area.

FIG. 16

Sketch showing the patient equivalent cylinder coordinate system and external plates coupled by a conductive wire.

FIG. 17

The vector potential $A_z$ versus z for the gradient coil arrangement along the central axis for the gradient coil of FIG. 3. The half length of the four wire gradient coil $b_1$ varies from 1.0 m to 2 m in steps of 0.1 m.

FIG. 18

Figure 17:
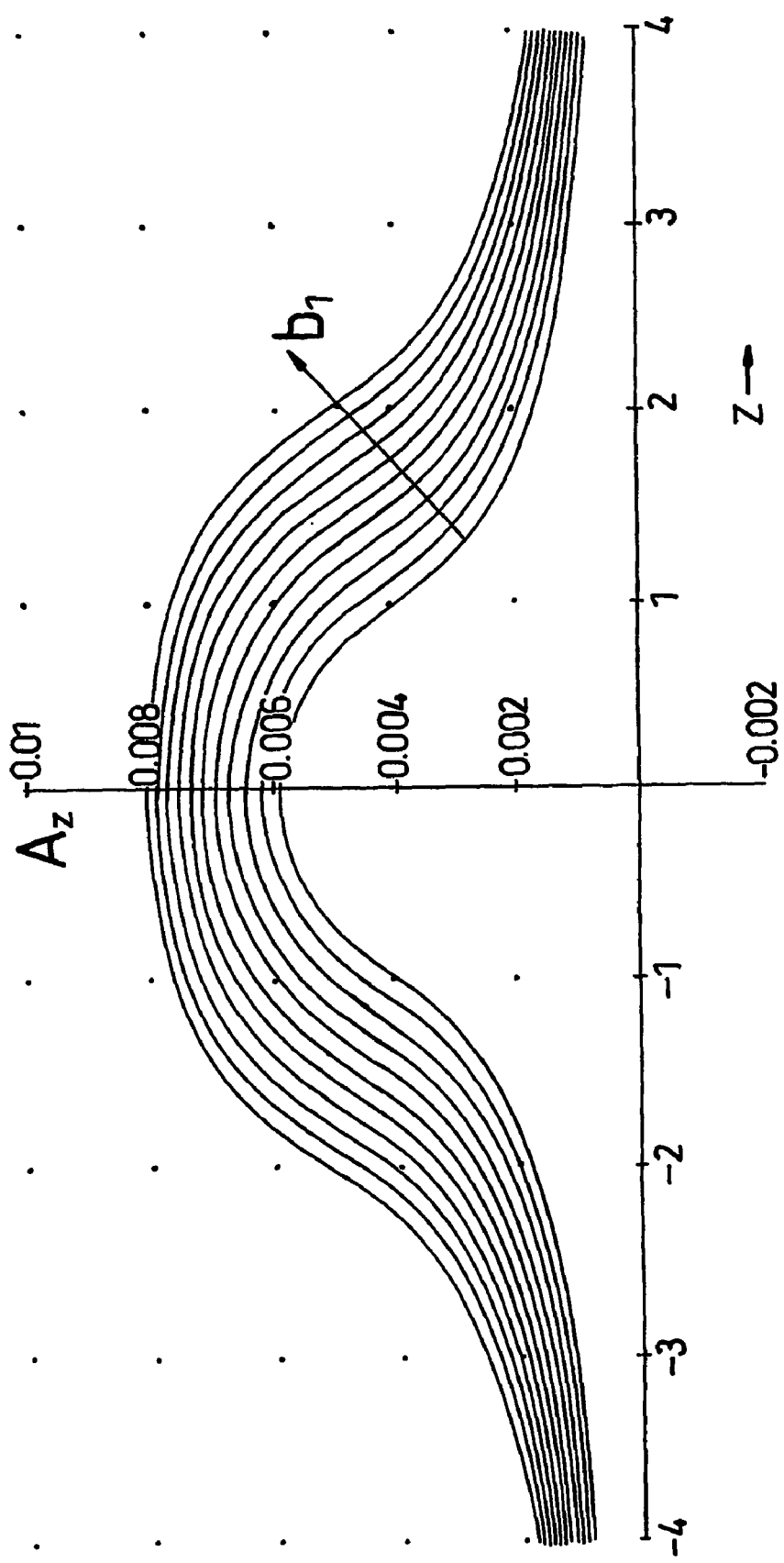

Vector potential expanded view of the data of FIG. 17.

FIG. 19

Graph showing the percentage deviation $\Delta A_z$=100[$A_z(0)$−$A_z(0.95)]/A_z(0)$ at z=0.95 m from its value at z=0 as a function of the coil half length $b_1$. At $b_1$=2 m the deviation is 5%.

FIG. 20

(a) Sketch showing the patient equivalent cylinder and the parabolic bending of one of the four gradient wires displaced from the cylinder centre $R_1$.

(b) Coil end current shims illustrated for one wire of a 4 or 6 wire gradient coil. The main current is $I_0$ and the shim current is $\delta I$.

(c) Sketch graph showing required parabolic current versus z and the stepped approximation.

FIG. 21

(a) Two-dimensional E-field solutions for $\nabla^2 V$=0. The two solutions are $a^2 = \rho^2 \cos 2\phi$ and $b^2 = \rho^2 \sin 2\phi$ where a and b are constants defining the electric fields and/or potentials. Curves (a) are for $a^2$=1, 3, 4, . . . , and curves (b) are for $b^2$=0.5, 1, . . . .

(b) Graph of $|E_2'|=|E_2|/K_2$ versus $\alpha_2$, Eq.(85), for various values of the parameter R=l/a.

FIG. 22

$E_2$-field components versus z for the patient equivalent cylinder using the scalar potential function, Eq. (86) for a gradient switching rate of 100 T m$^{-1}$ s$^{-1}$.

(a) Graph of $E_{2z}^V$ versus z, Eq. (93) evaluated at $\phi$=0 and $\rho$=a for the first two modes only.

(b) Graph of $E_{2\phi}^V$ versus z, Eq. (92) evaluated at $\phi=\pi/4$ and $\rho$=a for the first two modes only.

FIG. 23

Composite graph of |E| versus z for the patient equivalent cylinder for a number of potential functions when $\phi$=0 and $\rho$=0.2 m. Curve A corresponds to Eq. (85) and shows a linear increase of electric field from zero up to $|E_2| \approx 18$ V m$^{-1}$ at z=1 m. Curve B corresponds to Eq. (98) when k=$\pi/2$. We see some correspondence between the two curves over the sector range z=±0.3 m but curve B then reduces to $\approx 12.0$ V m$^{-1}$ at z=1 m. Curve C corresponds to Eq.(103) when k=$3\pi/2$. In this case we have two regions of low electric field corresponding to discs approximately 40 cm thick centred at z=±0.666 m. The electric field peaks at $E_2 \approx 5.5$ V m$^{-1}$ approximately z=±0.3 and z=±1 m. Curves D and E have the best overall performance producing a maximum value for $|E_2|$=3.5 Vm$^{-1}$ with disc-like regions of very low $E_2$-field within the patient cylinder. Curve D is Eq. (98) with k=$5\pi/2$ and curve E is Eq. (103) with k=$5\pi/2$.

FIG. 24

Figure 23:
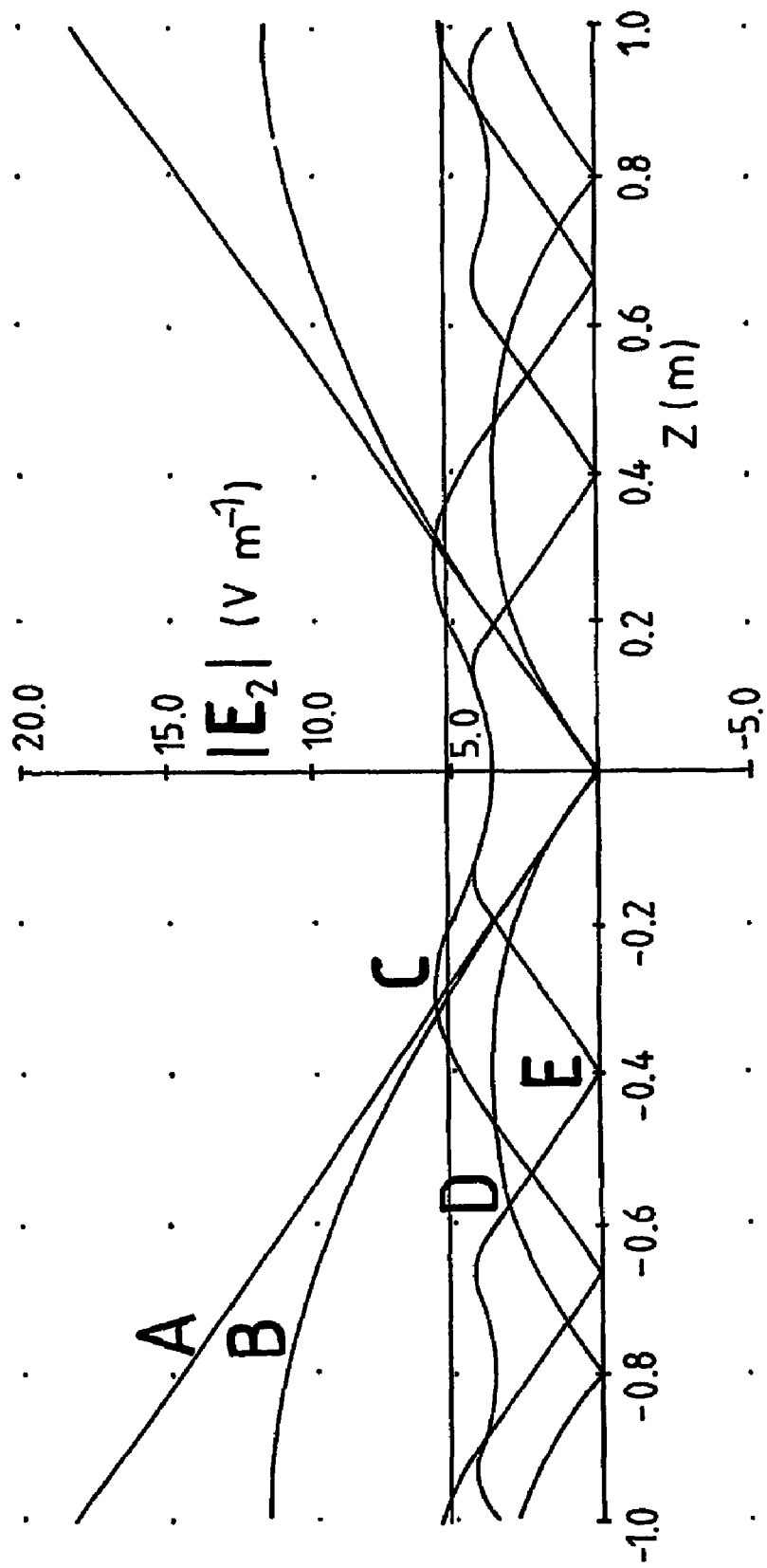

(a) Graph showing the $E_2$-field modulation versus z for curve B in FIG. 23. $f_1(z)$ is the modulation of the $E_{2z}$-component and $f_2^0(z)$ is the amplitude of the transverse $E_2$-field solution corresponding to FIG. 21(a). The straight line corresponds to the transverse $E_2$-field amplitude modulation of curve A in FIG. 23.

Figure 21A:
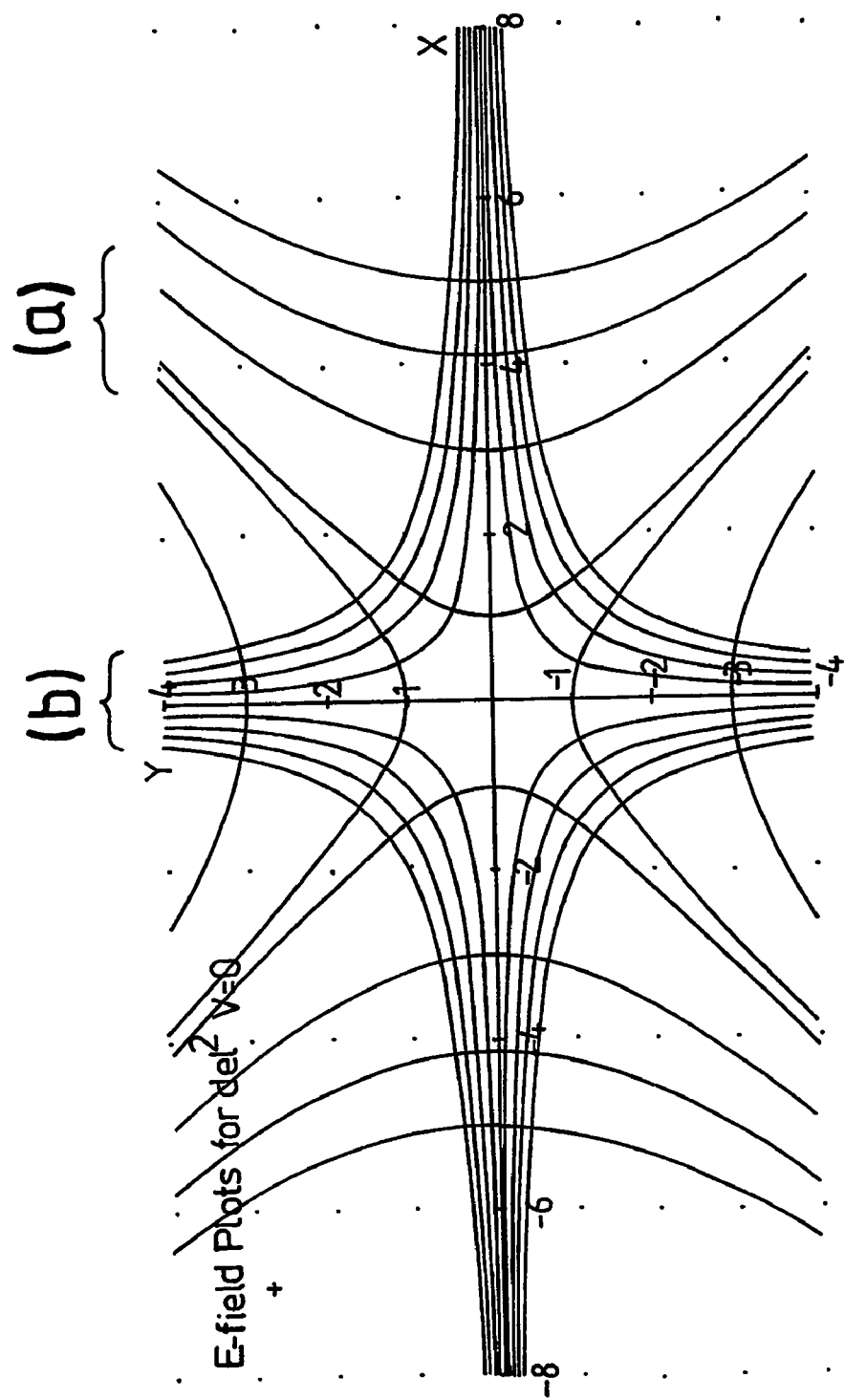

(b) $E_2$-field modulation corresponding to curve C of FIG. 23 showing the $E_{2z}$ modulation curve $f_1(z)$ and the transverse modulation, of the 2D solutions to the Laplace equation, FIG. 21(a).

FIG. 25

Sketches showing the practical arrangements of the invention.

(a) A plan view of the 4-coil arrangement with cut away top plate and patient disposition dotted. Also shown are positions of conductive rods to lower plate.

(b) Front elevation of gradient coil arrangement showing patient disposition, the coil positions and the top and bottom conductive plates.

(c) Third angle projection view of top plate detail and coil positions. Also shown are the conductive rods to plates below.

(d) Front elevation view of the coil and plate arrangement with conductive rods connecting top and bottom plates shown dotted.

(e) Front elevation of gradient coil arrangement showing coil and top and bottom plates actively driven by a voltage generator $Ve^{i\omega t+\Phi}$.

FIG. 26

Sketches showing alternative arrangement for generating the vector potential.

(a) Pair of long solenoids with equal and opposite magnetic fields B within the solenoids and B=0 outside the solenoids. The vector potential between the solenoids is 2A.

Figure 26A:
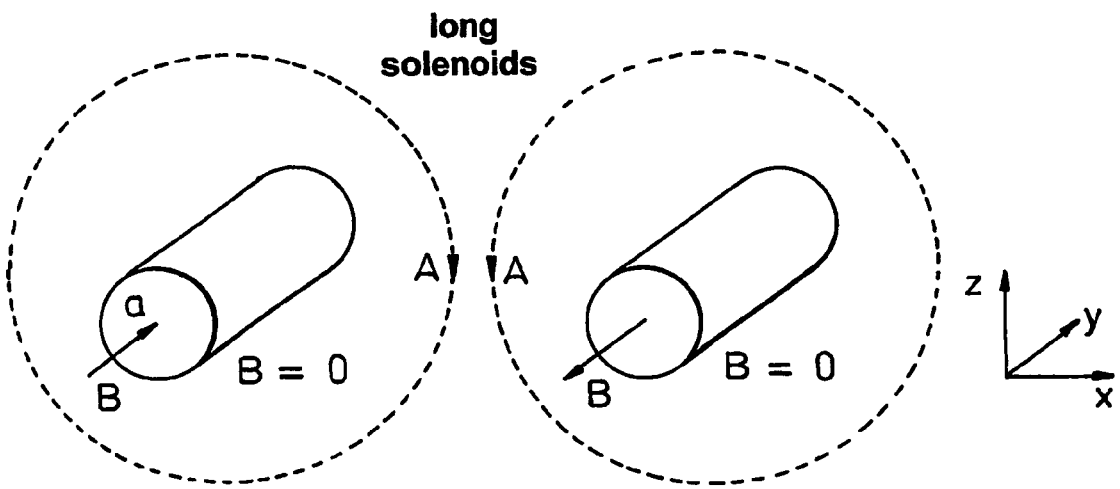

(b) As in FIG. 26(a) above but where the circular section solenoids are replaced by square section solenoids.

FIG. 27

Sketch showing alternative conductive plate arrangement as in FIG. 25 in which the plates are constructed in the form of a tile or tessera array.

(a) Rectangular plate formed of a mosaic array of conductive but insulated tiles. Also shown is the plate's disposition with respect to the gradient coil wires.

(b) Front elevation of the coil and plate arrangement showing two sectors comprising rectangular coil loops forming the gradient coil and two mosaic array plates top and bottom. Also indicated are the passive connections between corresponding tessellae i to i' and k to k'.

(c) Tessellated plates as in (b) above in which corresponding tessellae p,p' and q,q' are actively connected via voltage generators $V_p e^{i\omega t+\Phi q}$ and $V_q e^{i\omega t+\Phi p}$.

FIG. 28

Figure 27A:
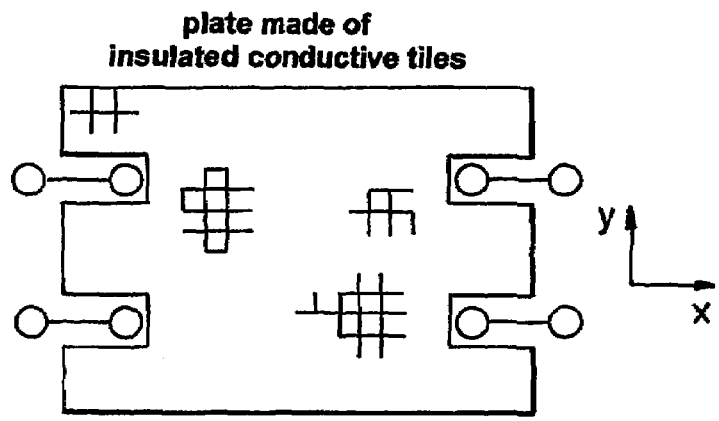
Figure 27B:
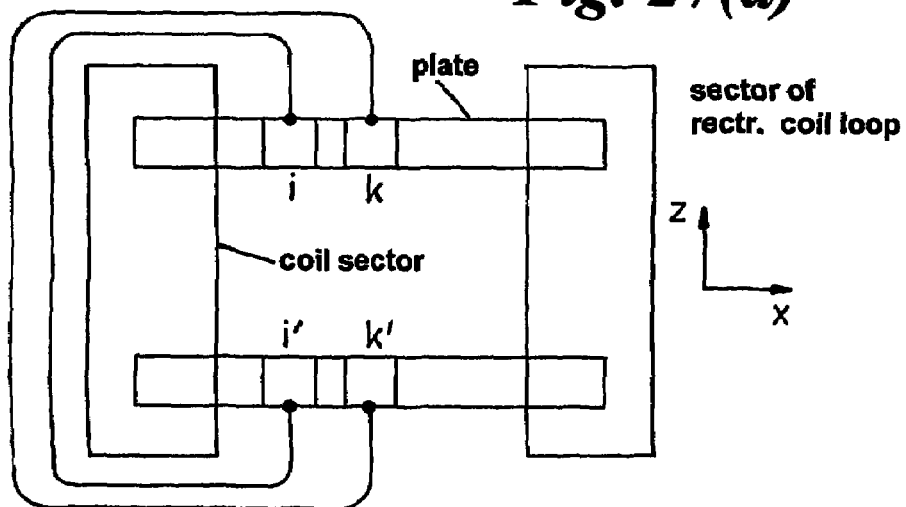
Figure 27C:
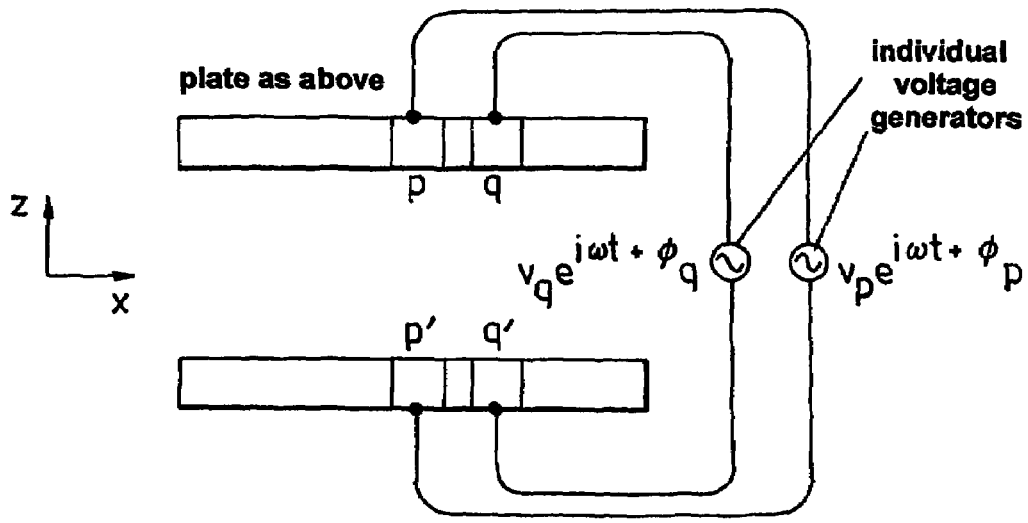

Sketches showing the application of the electrode/tessellated array arrangements of FIGS. 25 and 27 applied locally in a standard saddle or a Golay or a distributed 'fingerprint' transverse gradient coil applied over the head of a patient.

(b) and (c) Sketch showing the patient disposed with respect to the inner 4 conductors of a Golay coil in plan view and with side elevation respectively.

(d) Detail of the electrode plate arrangement looking along the z-axis of a standard transverse gradient coil showing the $G_x$ and $G_y$ coils and dispositions for the $A_{0x}$ and the $A_{0y}$ plates.

FIG. 29

Sketches showing details of the A(z) end effect correction arrangements.

(a) Two wires of a 4-wire coil arrangement in which the wires are stepped in but remain parallel.

Figure 18:
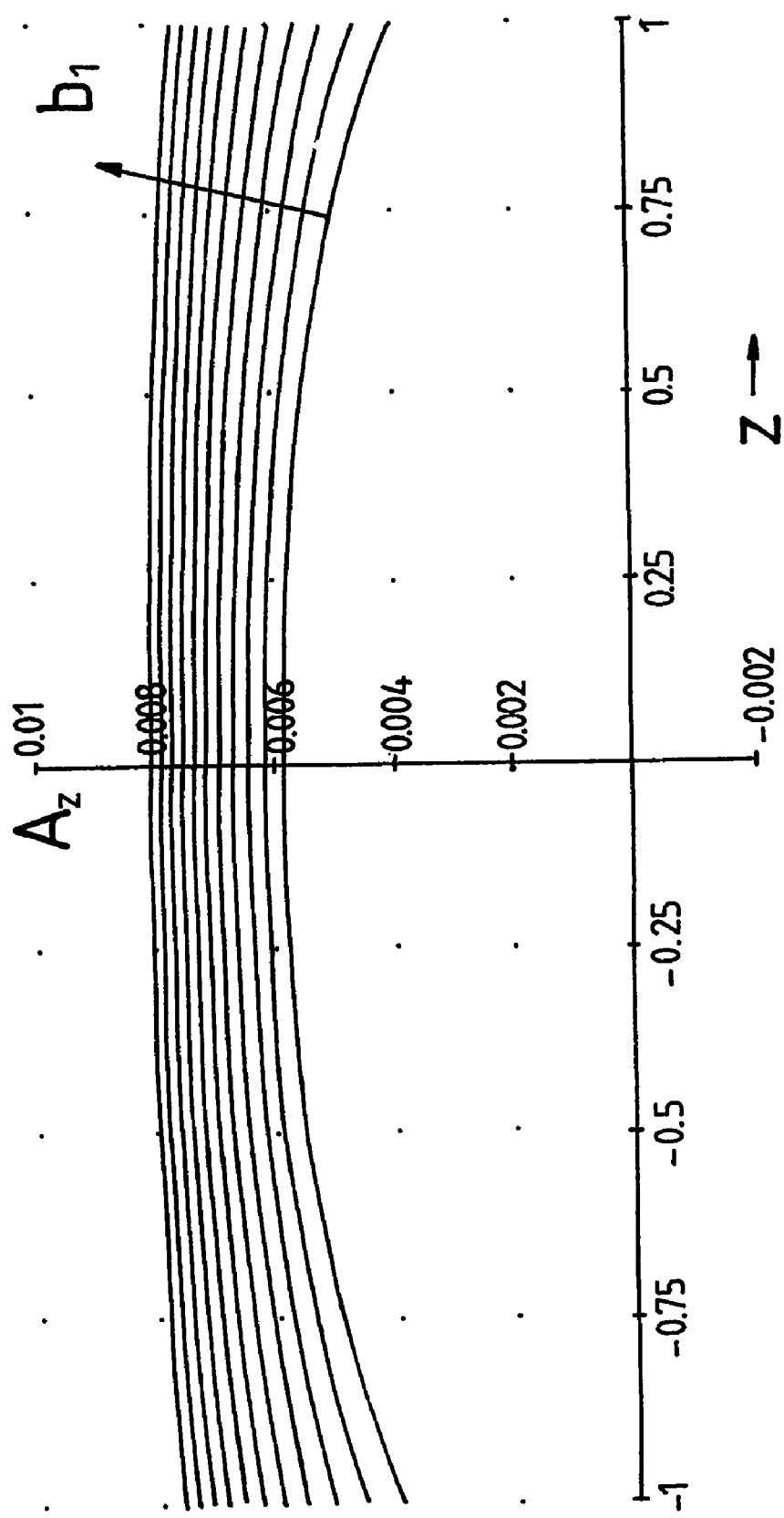

(b) Sketch showing the plot of $A_z(z)$ versus z for straight wires with correction dotted and with no correction (see FIGS. 17 and 18).

(c) Detail of part of the coil arrangement as in (a) above with inner and return wires. (See also FIG. 20 and §9).

FIG. 30

Sketches showing the disposition of electrode plates around the patient equivalent cylinder. The plates may be hyperbolic (as indicated), flat or cylindrical (convex or concave) to suit the boundary conditions.

(a) Shows two sets of hyperbolic plates corresponding to the two orthogonal solutions of the two-dimensional Laplace equation, see FIG. 21. The solid and dotted lines correspond to the electric fields produced by the two solutions for particular applied potentials $V_1$ and $V_2$. Also shown are the positions of the four inner coil wires.

(b) Side elevation of the complete coil assembly showing the gradient wires, the top and bottom electrode plates and the insulated tesserae running external to and along the axis of the coil assembly. Each tessera is supplied with a voltage which is $\pm V_{1n}$ or $\pm V_{2n}$ where n is an integer corresponding to the position of the tessera along the coil axis.

FIG. 31

Sketch of coil set comprising a plurality of rectangular closed current loops (a) or arcuate shaped current loops. (b) Plan view of the disposition of the patient's head within the gradient coil. (c) Side elevation of patient within the head coil showing position of the body tessellae and the head plate arrangement. Also shown is the induced electric field within the head when no external E-field is applied.

(d) View along the z-axis of the gradient coil assembly and electrode plates. Also shown (dotted) are the alternative arcuate coils forming the transverse gradients coil.

FIG. 32

Sketch showing a 4-sector closed loop arcuate coil arrangement carrying current $I_1$, magnetically screened by a series of closed loop arcuate coils, all carrying a current $I_2$.

(a) shows the coil arrangement viewed along the z-axis.

(b) shows a transverse view indicating the coil distribution along the z-axis.

FIG. 33

Transverse gradient coil comprising three cylindrical concentric "fingerprint" coils.

(a) shows a view of the coil arrangement along the z-axis.

(b) shows a transverse view.

FIG. 34

Sketch of a 4-sector closed loop arcuate transverse gradient coil screened by two concentric "fingerprint" coils.

(a) shows a view along the z-axis.

(b) shows a transverse view indicating the positions of the arcuate coil sectors.

FIG. 35

Sketches showing details of a 4-sector gradient coil producing an x-gradient.

A. Plan view showing the coil sectors and wooden support plate and E-field screening plate.

B. Angled side view of coil assembly showing the removable conductive rods used to short the screening plates.

C. Disposition of patient and gradient coil, used as a head coil.

D. Side view of patient head and disposition of E-field screening plates. As shown screening plates are open circuit.

FIG. 36

Three-dimensional plot of magnetic field $b_z$ versus x, z for two gradient sets with centres at y=0 and y=$5d_1$. With this arrangement the region of uniform gradient is significantly extended along the y-axis.

FIG. 37

Figure 2A:
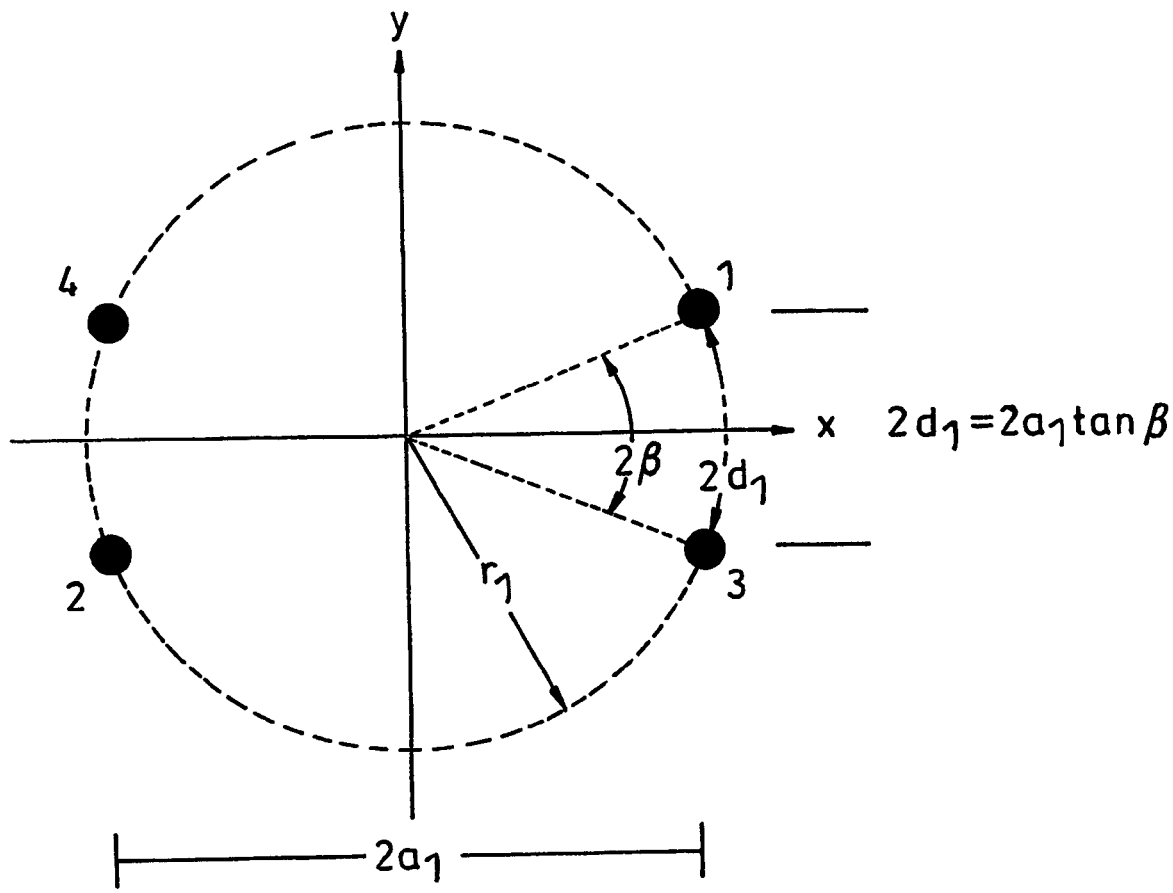
Figure 2B:
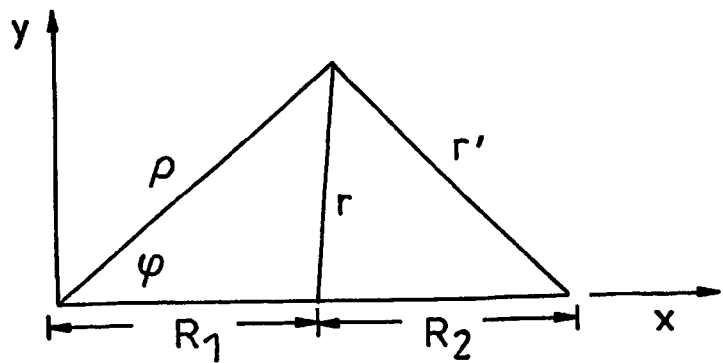

Three-dimensional plot of vector potential $A_y$ versus x, z corresponding to the magnetic field plot of FIG. 2 above.

FIG. 38

Vector potential $A_y$ versus z for x=0 corresponding to FIG. 3.

A. The central section of FIG. 3, ie the whole gradient coil arrangement.

B The central section through a single pair of coil sectors. This corresponds to the transfer function for a pair of coil sectors. NB These calculations are for the case when the coil sector planes are normal to the z-axis.

FIG. 39

Photo of a 4-sector gradient set with E-field screening plates.

FIG. 40

A. Series resonant circuit arrangement for driving the gradient coil at 3 kHz.

B. Plan view of gradient coil sectors showing supporting wooden plate and disposition of brass plates. Also indicated are the probe positions 1-4.

FIG. 41

Figure 39:
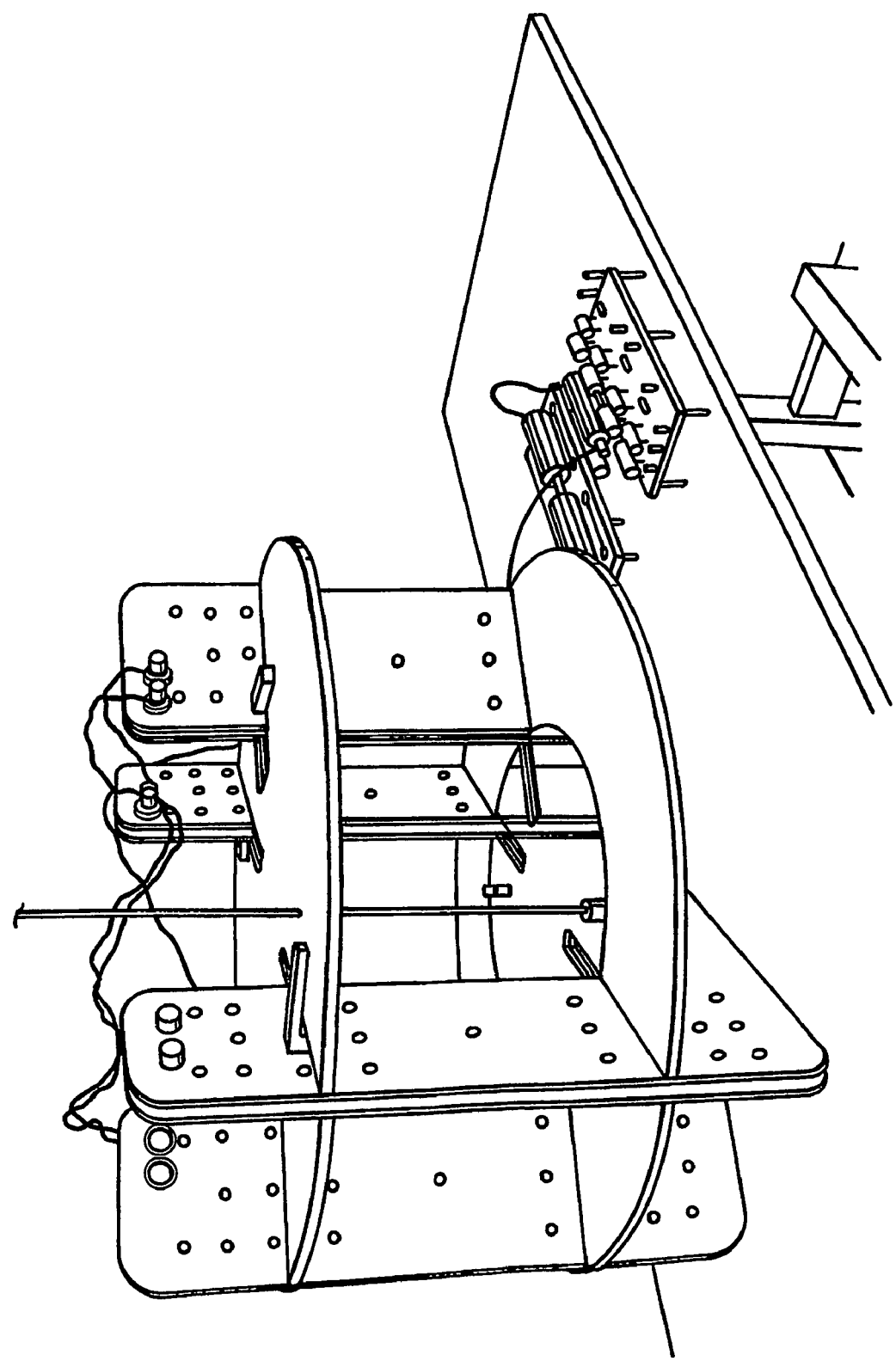

Two-dimensional plot of the vertical component of the electric induction field, $E^A_y$, calculated for the magnetic gradient coil of FIGS. 35 and 39 for I=24 A and 16 turns with an operating frequency of f=2.859 kHz.

FIG. 42

Figure 41:
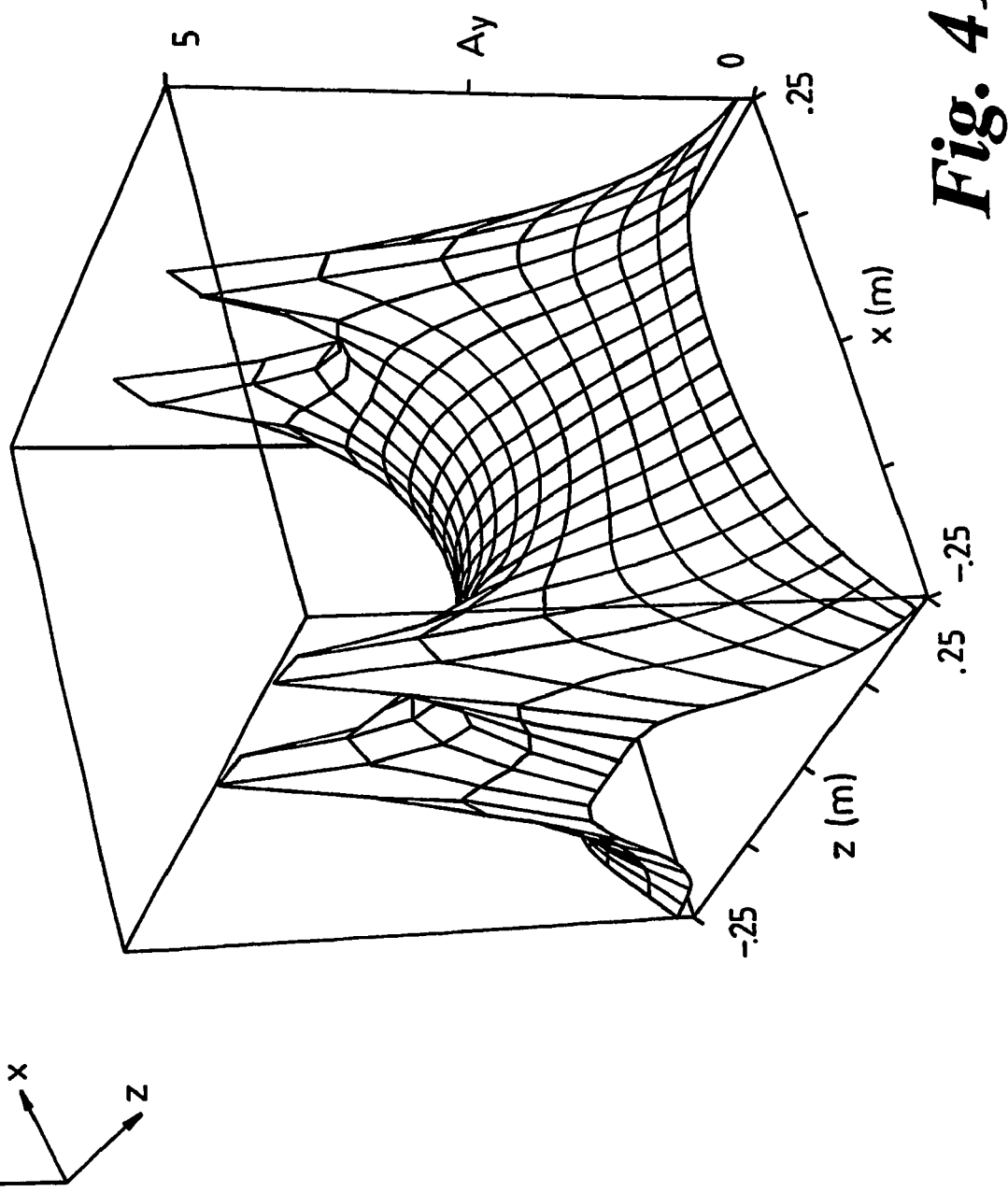

Graph $E^A_y$ (V/m) versus z (m) for the mid-line of FIG. 41 at x=0 (solid line). Also plotted are experimental data when the plates are open circuit (square points). The data are normalised to the theory at z=0 with a factor 25.1 The same factor is applied to the short circuit data (round points).

FIG. 43

A transverse gradient (arbitrary units) for a pair of arcuate coils as a function of position, with $R_1$=0.32 m, $R_2$=0.42 m, $R_3$=0.42 m, $R_4$=0.49 m and $z_1$=0.10175 m The solid curve shows the variation of gradient with z for ρ=0; the broken curve is the variation of gradient with ρ for z=0.

FIG. 44

The electric field due to the vector potential for the arcuate pair (FIG. 43) when placed over the torso; the solid curve shows the variation of the radial components of the electric field at the surface of the cylinder; the broken curve shows the variation in the Φ component of the electric field.

FIG. 45

Electric field versus position z for the arcuate gradient coil (FIG. 43) for the choice of the scalar potential described in the text; solid curve $E_\phi$ and the broken curve $E_z$.

FIG. 46

The variation of the scalar potential on the curved surface of the cylinder (corresponding to the choice made in FIG. 45) versus position z.

FIG. 47

Figure 45:
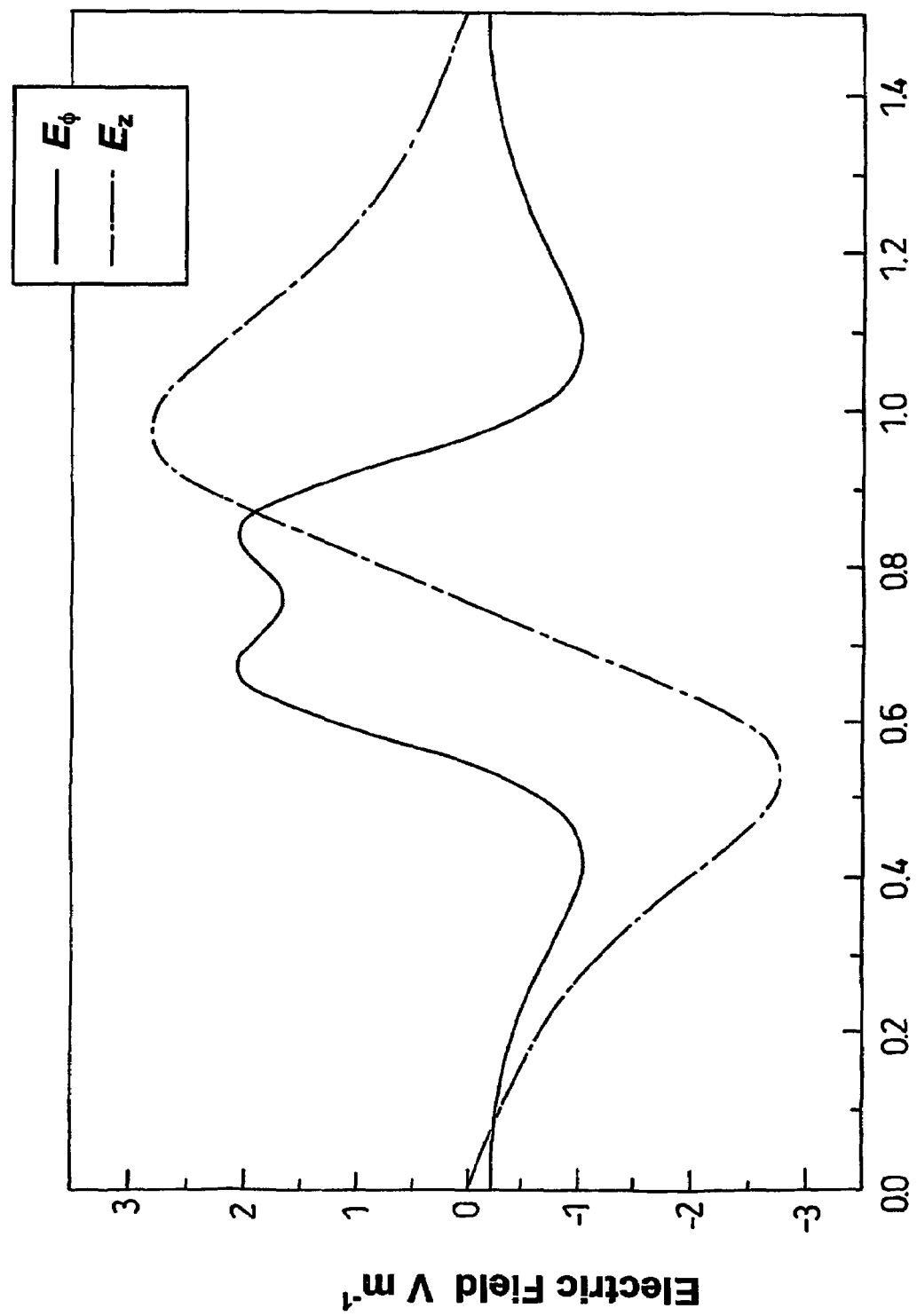

Electric field versus z for a scalar potential which is 90% of that used in FIG. 45; solid curve $E_\phi$; broken curve $E_z$.

FIG. 48

Electric field due to the vector potential versus z for a head coil centred at position $z_0$=−0.2 m; solid curve $E_\rho^A$; broken curve $E_\phi^A$. The head coil has the same dimensions as those used in FIG. 43.

FIG. 49

The maximum values of the electric field components $E_\phi$ and $E_z$ at ρ=R for a head coil as described in the text when the potential is $V_1$.

FIG. 50

The maximum values of the electric field components $E_\phi$ and $E_z$ at ρ=R for a head coil as described in the text when the potential is $V_2$.

PART 1

1.1 Active Electric Field Screening

In this Patent, we consider alternative gradient coil designs and their magnetic interaction with the patient. We aim to show that there are classes of gradient coil that can be appropriately modified to produce the desired gradient strength and time dependence but in which the induced currents within the body can be substantially reduced.

Figure 1B:
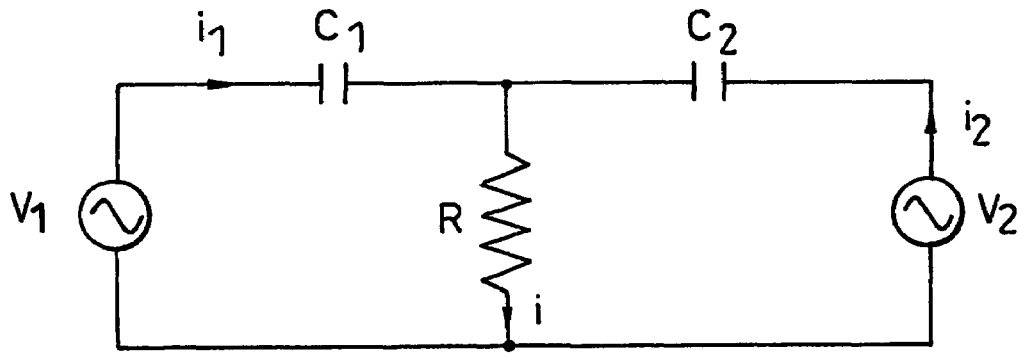
Figure 1C:
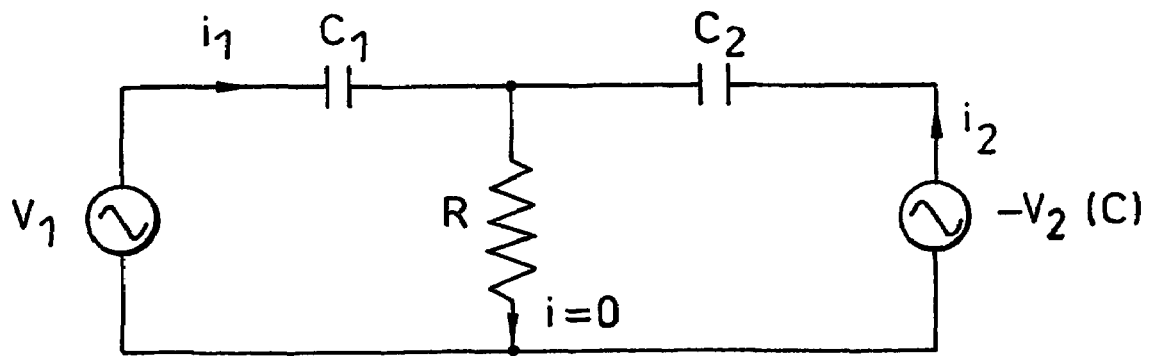

As a simple explanation of our invention we assert that for a gradient coil made up of straight wires, interaction of the patient and transverse gradient field can be represented by an equivalent electrical circuit comprising an induced voltage, $V_1$, (deriving from the gradient field) a capacitor, $C_1$, corresponding to the patient's capacitance and a resistor, R, corresponding to losses in the body. The RC circuit is sketched in FIG. 1A. In FIG. 1B we add to FIG. 1A a parallel plate capacitor, $C_2$, between the plates of which the patient is sandwiched. Across these plates a time dependent voltage generator, $V_2$ expi(ωt+$\phi_2$) is applied. When the amplitude $V_2$ and the phase $\phi_2$ are adjusted the current i=$i_1$+$i_2$ through R may be substantially reduced. This in essence is the actively controlled version of the patent. A passive version of the patent occurs if $V_2$=−$V_1$, that is to say, when $C_2$ is allowed to discharge in anti-phase with $V_1$. This is achieved when $C_2$ is effectively shorted in the presence of the gradient field, see FIG. 1C.

1.2 Passive Electric Field Screening

We represent the patient by a conductive cylinder of saline. A magnetic field gradient is generated by a coil that creates only a z-component of the vector potential. The electric field has two components: the part due to the rate of change of the vector potential A which we write as $E^A$ and a part due to the scalar potential V which is written as $E^V$.

$$E = -\nabla V - \frac{\partial A}{\partial t} = E^V + E^A \quad (1)$$

The magnetic induction field is given by B=∇×A. When a transverse magnetic induction field gradient is switched, $E^A$ is finite, an electric current flows along the cylinder and the ends of the conductive cylinder charge up. Eventually, the surface charge produces exactly the amount of $E^V$-field to back off the $E^A$ term produced by the A-field.

In our passive screen arrangement, additional highly conductive plates are introduced, effectively sandwiching but not touching the conductive cylinder. By joining the pair of plates with a good conductor, we mimic the natural process described above that occurs in a bare cylinder. For a constant vector potential along the z-direction, this passive arrangement ensures that the z-component of the electric field between the plates rapidly falls to zero.

For a vector potential needed to produce a transverse field gradient there is a residual electric field within the cylinder and much reduced currents and charges appear in and on it. To reduce the currents additional conductive plates can be placed around the curved surface of the cylinder with the electric potential on the plates chosen so as to minimize the electric field in the cylinder. The wires connecting the extra plates are placed in such a way as not to affect the component of the electric field $E^A$.

The action described is similar to but not equal to a Faraday screen. In a Faraday screen the total electric field $E=E^V+E^A$ exists outside but not inside the screen. In our case the electric field is not screened completely for to do so would remove $E^A$, thereby removing the vector potential and the transverse field gradient. The only part of the electric field which is modified is the part $E^V$.

1.3 Additional Reduction of E in Localised Regions of the Body

As well as a general reduction in the electric field induced in a patient as indicated above and detailed in subsequent sections, we also point out that due to the specific form of the lowest order term in the vector potential; $A_2\rho^2 \cos 2\phi$ required to generate the field gradient, there are regions within the representative cylinder for the patient where the electric field naturally becomes very small.

Figure 1D:
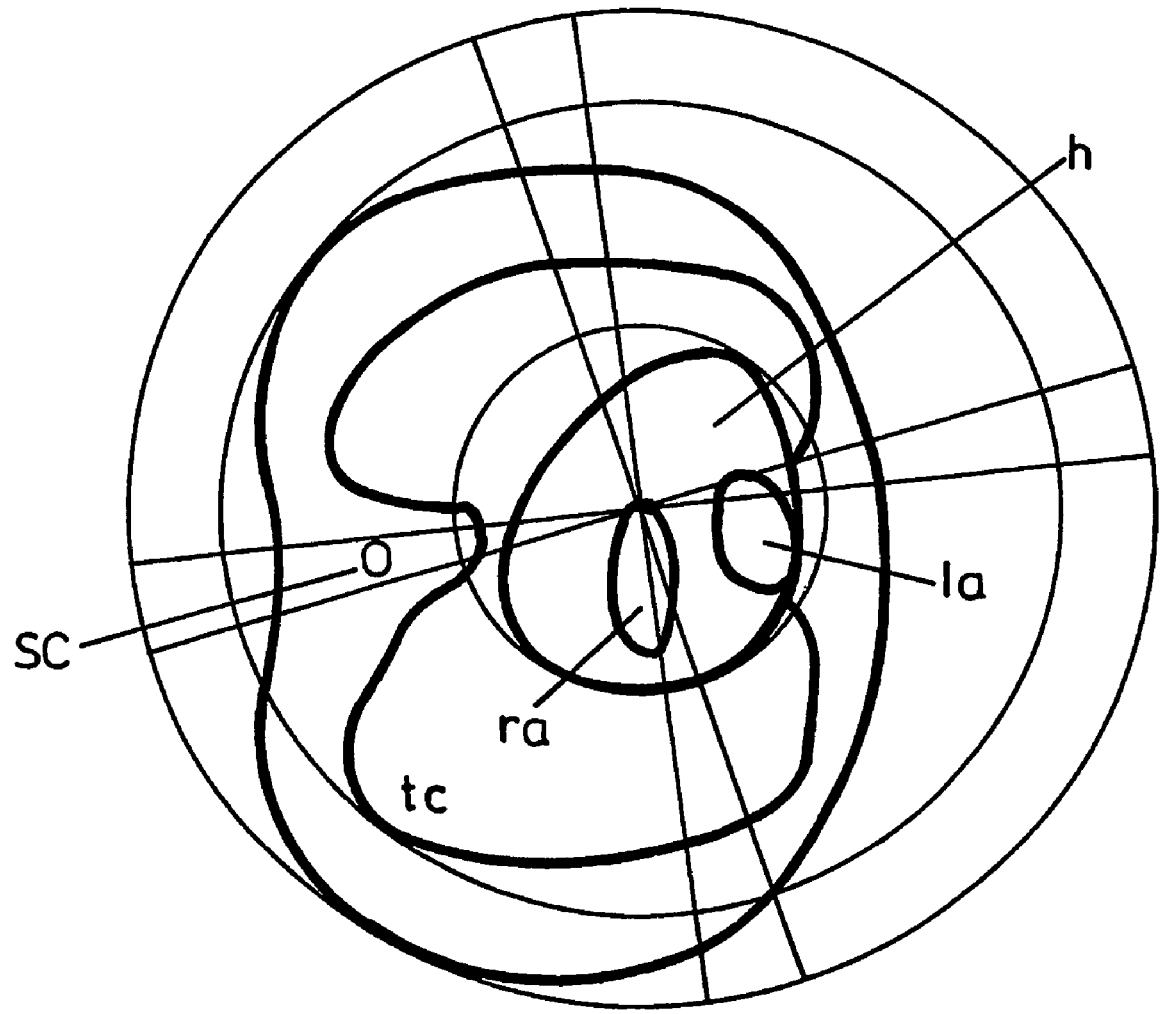

FIG. 1D shows a tracing of an MRI scan through the mediastinum of a volunteer. In this tracing the heart mass is placed at the centre of a circle of radius 9 cm. Two larger circles circumscribing the bulk of the thoracic region are also shown with the inner radius of 20 cm and the outer radius of 22.5 cm. Because of the specific form of the vector potential the important term described above means that the induced electric field varies as $\rho^2$ and also with azimuthal angle $\phi$.

Nowhere within the circle covering the heart does the electric field $E^A$ get greater than 0.2 of its value at $\rho=20$ cm. If we impose the same condition on the $\cos 2\phi$ expression we find that within the angular wedges indicated corresponding to $\phi=\pm 5.5°$ the value of $\cos 2\phi$ does not exceed 0.2. This means that the body can be orientated in such a way as to include both the heart and spinal column in an electric field which is typically $\frac{1}{15}$ of the maximum value of $|E|$ for a conventional fingerprint transverse gradient coil quoted in R Bowtell and R. M. Bowley Mag. Res. Med. 44:782-790 (2000), henceforth referred to as BB. We point out that the circle of radius 20 cm corresponds to the region of interest (ROI) of BB. But we also notice that part of the thoracic wall protrudes beyond this point and therefore this region would be subjected to a maximum E-field which is close to $\frac{1}{3}$ of the BB value.

1.4 Effect of E-field Reductions on Imaging Strategies

At the moment the safety agencies such as the FDA and NRPB[5] have laid down clinical operational guidelines concerning the rate of change of the gradient fields applied to patients undergoing MRI scans. These rates are derived from experimental observations that neuro-stimulation for both peripheral nerves and cardiac muscle occur at a threshold electric field of 6.2 V m$^{-1}$, corresponding to an induced current density of 1.2 A m$^{-2}$ assuming a tissue conductivity of 0.2 S m$^{-1}$. These values in turn correspond to magnetic field changes of between 40 and 60 T s$^{-1}$ for conventionally designed MRI coils, depending on the orientation of the magnetic field vector with respect to the patient axis, the lower threshold corresponding to magnetic field application transverse to the long axis of the subject. NRPB, for example, propose a safety factor of 2 or 3 suggesting that for switching times, t>3 ms, magnetic field changes of up to 20 T s$^{-1}$ should avoid peripheral nerve and cardiac muscle stimulation. This corresponds to a maximum induced current density of 400 mA m$^{-2}$. For rapid gradient switching in times t in the range 45 μs<t<3 ms the formula $(dB/dt)t<60\times 10^{-3}$ T should be observed.

The above invoked relationship between dB/dt and induced electric field E depends on the gradient coil design. Standard coil designs by and large follow the expression above and correspond to all current commercial gradient sets. However, if the relationship between dB/dt and induced E-field can be modified, the above safety guidelines can be radically changed. This is exactly what is proposed in this Patent. We believe we can modify the relationship such that dB/dt produces an induced E-field which is at least 3 times lower than standard coils. Said another way, the effect of the new coil design will be to allow an increase of dB/dt to 60 T s$^{-1}$ for switching times >3 ms, and still avoid both peripheral nerve and cardiac muscle stimulation. For faster gradient switching in times ranging from 45 μs<t<3 ms the safety formula would be changed to $(dB/dt)t<180\times 10^{-3}$ T at a minimum.

The immediate result of these changes will be to allow either a threefold image resolution improvement in high-speed snap-shot imaging, or a three times faster imaging strategy. Of course, intermediate cases would allow both an increase in speed and resolution. These improvements will have a profound effect on the course of real-time movie imaging and fluoroscopic imaging.

2. THEORY

In magnetic resonance imaging (MRI) magnetic field gradients in the x-, y- and the z-directions are switched rapidly thereby inducing electric fields in the patient which can lead to neural stimulation. Here, several coil designs are considered which comprise four wires lying on the surface of a cylinder, radius $R_1$, the wires running parallel to the cylindrical axis. The current at the ends of the wires is carried out in a radial direction, and then returns along wires parallel to the cylindrical axis at a radial distance $R_2$. Gradient coils for MRI based on straight wires have been described elsewhere. (V Bangert, P. Mansfield, J. Phys. E. 15, 235 (1982)). A plan view of the general arrangement is shown in FIG. 2. The wires may carry all positive currents or a maximum of two positive and two negative currents. The object of the calculation is to determine the induced electric field, E, in a person standing in the coil along the cylindrical z-axis.

To simplify matters, we consider the patient to be a cylinder, length 2l, radius a of uniform non-magnetic material (relative permeability $\mu_r=1$) of high relative permittivity and with a uniform conductivity of 0.2 $\Omega^{-1}$ m$^{-1}$. The object of this work is to design a set of coils to generate the uniform field gradient over the cylinder in such a way as to minimize the electric field experienced inside the cylinder.

2.1 FORMULATION

Maxwell's equations, when described in terms of the vector potential A and scalar potential V in the Lorentz gauge condition $$\nabla \cdot A + \epsilon_0 \mu_0 \frac{\partial V}{\partial t} = 0, \qquad (2)$$

can be written as the pair of equations $$\nabla^2 V - \epsilon_0 \mu_0 \frac{\partial^2 V}{\partial t^2} = -\frac{\rho_c}{\epsilon_0}, \qquad (3)$$

$$\nabla^2 A - \epsilon_0 \mu_0 \frac{\partial^2 A}{\partial t^2} = -\mu_0 j. \qquad (4)$$

Here $\rho_c$ is the total charge density (including polarization, free charges and surface charges) and j is the total current density (including free currents and polarization currents). The source of V is the charge density, $\rho_c$; the source of the vector potential is the current density j due to current in the coils and currents induced in the cylinder.

The electric field in the cylinder is given by $$E = -\nabla V - \frac{\partial A}{\partial t} = E^V + E^A \qquad (1)$$

where $E^V = -\nabla V$ and $E^A = \partial A/\partial t$. In the limit of low frequency the terms in $\epsilon_o \mu_o \partial^2 V/\partial t^2$ in the equation for V and the term in $\epsilon_o \mu_o \partial^2 A/\partial t^2$ in the equation for A are negligibly small and we can write $$\nabla^2 V = -\frac{\rho_c}{\epsilon_0}, \qquad (5)$$

and $$\nabla^2 A = -\mu_0 j. \qquad (6)$$

These equations have solutions $$V(r) = \frac{1}{4\pi\epsilon_0} \int\int\int_T \frac{\rho_c(r')}{|r - r'|} d^3 r'; \qquad (7)$$

$$A(r) = \frac{\mu_0}{4\pi} \int\int\int_T \frac{j(r')}{|r - r'|} d^3 r'. \qquad (8)$$

Knowing the current density in the coils, $j_{coil}$, we can calculate the contribution to the vector potential, $A_{coil}$ from $j_{coil}$; $A_{coil}$ gives rise to an electric field in the cylinder and induces small electrical currents therein, which in turn create an additional contribution to the vector potential. For a poorly conducting medium, such as human tissue, the induced current in the cylinder gives a contribution to the vector potential which is negligible in comparison to $A_{coil}$.

The main effect of the current in the body is to distribute charge on the surface of the body which acts as a source of the scalar potential V. At low frequencies we solve Eq. (5) in which $\rho_c$ becomes a surface charge density. For example, on the end of the cylinder at z=l we write $$\rho_c = q(x, y)\delta(z-l) \qquad (9)$$

3. SIMPLE MODEL

In the coordinate system we are using for these calculations the large, static, external magnetic field points along the y-axis so that there is a large $B_y^0$.

The magnetic induction $B = \nabla \times A$ in the low frequency limit satisfies Ampère's law $$\nabla \times B = \mu_0 j_{coil} \qquad (10)$$

in the approximation where we neglect the induced current in the cylinder. It follows that inside the coil $\nabla \times B = 0$ which means $$\nabla \times (\nabla \times A) = \nabla(\nabla \cdot A) - \nabla^2 A = 0. \qquad (11)$$

In the low frequency limit the Lorentz condition becomes $$\nabla \cdot A = 0 \qquad (12)$$

which is known as the Coulomb gauge. In the Coulomb gauge $\nabla^2 A = 0$ which means that each Cartesian component of A satisfies Laplace's equation. One such solution is the vector potential $(0, 0, A_z)$ with $$A_z = A_2 \rho^2 \cos(2\phi) = A_2(x^2 - y^2). \qquad (13)$$

For such a vector potential $\nabla \cdot A = 0$ and $$B = \nabla \times A = -2A_2(\hat{\imath} y + \hat{\jmath} x) \qquad (14)$$

where $\hat{\jmath}$ is a unit vector in the y-direction. Since the main magnetic induction field is in the y-direction, there is a transverse gradient $G_x = \partial B_y/\partial x = -2A_2$.

If this field gradient oscillates at a single angular frequency, ω, the electric field has a maximum magnitude $|E^A| = \frac{1}{2}\omega G_x \rho^2$. To make a useful comparison with the conventional coil arrangement we use the same values as those taken by BB: they used for the radius of the patient—equivalent cylinder a=0.195 m; their transverse coil design produces a field gradient of 20 mT m$^{-1}$, and oscillates in such a way as to produce a maximum rate of change of gradient field of 100 T m$^{-1}$ s$^{-1}$, equivalent to ω=5000 rad s$^{-1}$.

With these values the maximum induced E-field found for the coil which produces $A_z = A_2 \rho^2 \cos(^2\phi)$ is 1.9 V m$^{-1}$; for a conventional saddle-coil arrangement the corresponding value found by BB is 5.25 V m$^{-1}$ which is nearly three times larger.

If the term $A_z = A_2 \rho^2 \cos(2\phi)$ in the vector potential were the only term there would be a uniform field gradient across the cylinder and an electric field which is about three times smaller than for other designs of gradient coils.

4. FOUR INFINITE WIRES

One way of generating this vector potential is to use four wires of infinite length running in the z-direction as shown in FIG. 3. For one infinitely long wire of radius b carrying current I the vector potential is $$A_z = -\frac{\mu_0 I}{2\pi} \ln(r/b) \qquad (15)$$

where r is the perpendicular distance to the wire. If the wire is displaced from the origin along the x-direction a distance $R_1$, (see FIG. 2B), so that $$r^2 = R_1^2 + \rho^2 - 2\rho R_1 \cos\phi \qquad (16)$$

then the vector potential for $\rho<R_1$ is $$A_z = -\frac{\mu_0 I}{4\pi}\ln(R_1^2 + \rho^2 - 2\rho R_1 \cos\phi) + \frac{\mu_0 I}{4\pi}\ln(b^2) \quad (17)$$
$$= -\frac{\mu_0 I}{2\pi}\ln(R_1/b) + \frac{\mu_0 I}{2\pi}\sum_{p=1}^{\infty}\frac{1}{p}\left(\frac{\rho}{R_1}\right)^p \cos(p\phi).$$

Suppose the current in the wire returns at a distance $R_2$ from the origin at the same angle. Then from FIG. 2B we have $$r'^2 = R_2^2 + \rho^2 - 2\rho R_2 \cos\phi. \quad (18)$$

Since the current is in the opposite direction, these two wires give $$A_z = -\frac{\mu_0 I}{4\pi}\ln\left(\frac{R_1^2 + \rho^2 - 2\rho R_1 \cos\phi}{R_2^2 + \rho^2 - 2\rho R_2 \cos\phi}\right) \quad (19)$$

For $\rho<R_1$ the z-component of the vector potential is $$A_z = -\frac{\mu_0 I}{2\pi}\ln(R_1/b) + \frac{\mu_0 I}{2\pi}\sum_{p=1}^{\infty}\frac{1}{p}\left(\frac{\rho}{R_1}\right)^p \cos(p\phi) + \quad (20)$$
$$\frac{\mu_0 I}{2\pi}\ln(R_2/b) - \frac{\mu_0 I}{2\pi}\sum_{p=1}^{\infty}\frac{1}{p}\left(\frac{\rho}{R_2}\right)^p \cos(p\phi).$$

We can write $$A_z = A_0 + A_1\rho\cos(\phi) + A_2\rho^2\cos(2\phi) + \quad (21)$$
$$A_3\rho^3\cos(3\phi) + A_4\rho^4\cos(4\phi) + \cdots.$$

with $$A_0 = \frac{\mu_0 I}{2\pi}\ln(R_2/R_1), \quad (22)$$

and $$A_p = \frac{\mu_0 I}{2\pi p}\left(\frac{1}{R_1^p} - \frac{1}{R_2^p}\right) \text{ for } p \geq 1. \quad (23)$$

Let us consider four wires disposed around the cylinder of radius $R_1$, with wires at angles $\beta=\pm\pi/8$ and at $\beta=\pm7\pi/8$ all carrying current I with return paths at distance $R_2$. See FIG. 3. With this choice all odd order terms and the fourth order term vanish and we get $$A_z = A_0 + A_2\rho^2\cos(2\phi) + O(\rho^6\cos(6\phi)) \quad (24)$$
with
$$A_0 = \frac{2\mu_0 I}{\pi}\ln(R_2/R_1) \quad (25)$$
and
$$A_2 = \frac{\mu_0 I}{\pi}(R_1^{-2} - R_2^{-2})\cos(\pi/4). \quad (26)$$

Any other arrangement of wires and return wires which removes the term $A_4\rho^4\cos(4\phi)$ is equally advantageous.

The disadvantage is that there is an $A_o$ term. However, if we can remove the $A_o$ term completely there is a great advantage of uniformity of the field gradient to be obtained because the $A_4$ term is zero.

It is also possible to remove both the $A_4$ and the $A_6$ terms completely if six wires are used with all wires disposed around the cylinder of radius $R_1$, with return paths at distance $R_2$. To do this: four of the wires are at angles $\pm\beta$ and at $\pi\pm\beta$ and carry current $I_1$, the remaining two are at 0 and $\pi$ and carry current $I_0$; the angle $\beta$ is chosen so that $\cos(6\beta)=\cos(4\beta)$ or $\beta=0.628$ radians; the current $I_0=1.6178\, I_1$.

The great benefit of using an infinitely long wire in the z-direction is that there is no z-dependence to the vector potential because of translational invariance along the z-axis. Consequently we can ignore the z-dependence of the parameters $A_o$, $A_2$, etcetera. Of course in reality all wires are finite in extent; a consequence is that there is some z-dependence and we shall take some trouble to minimize it.

5. FOUR WIRES OF FINITE LENGTH

The solution of the equation $\nabla^2 A=-\mu_o j_{coil}$ for a finite wire running along the z-axis from $z=-b_1$ to $z=b_1$ is $$A(r) = \frac{\mu_0 I}{4\pi}\int_C \frac{dl'}{|r-r'|}. \quad (27)$$

This expression can be used to calculate the contribution to the vector potential from wires that are parallel to the z-axis. We work these out in the plane $z=0$.

5.1 Coil 1

In the first set of calculations, the coil has four wires disposed around the cylinder, all carrying positive currents and with included angle $2\beta=\pi/4=45°$: see FIG. 3. All calculations have been performed with currents $I_1=I_2=I_3=I_4=4000$ A. The radius of the cylinder is chosen to agree with BB and is equal to 0.327 m. The length of the wires is $2b_1=2.0$ m. For the arrangement in FIG. 2A the aperture $2a_1$ is equal to $2\times0.302109$ m.

With the constants and parameters described, Coil 1 gives a transverse gradient $G_x=22.4533$ mT m$^{-1}$. FIG. 4 shows the magnetic induction field $B_y$ as a function of y and x over a region of interest (ROI) with $x_{max}=y_{max}=\pm0.195$ m in correspondence with BB.

5.1A Vector Potential Calculation

The vector potential A has been calculated for coil 1 for the case when the currents in all the wires equal 4000 A. For a finite wire of length $2b_1$ at $(x_1, y_1)$ the vector potential for one wire running parallel to the z-axis from $z=-b_1$ is $$A(r) = \hat{k}\frac{\mu_0 I}{4\pi}\int_{-b_1}^{b_1}\frac{dz'}{((z-z')^2 + d^2)^{\frac{1}{2}}} \quad (28)$$
$$= \hat{k}\frac{\mu_0 I}{4\pi}(\sinh^{-1}((b_1-z)/d) + \sinh^{-1}((b_1+z)/d))$$
where
$$d^2 = (x-x_1)^2 + (y-y_1)^2 \quad (29)$$

Figure 5:
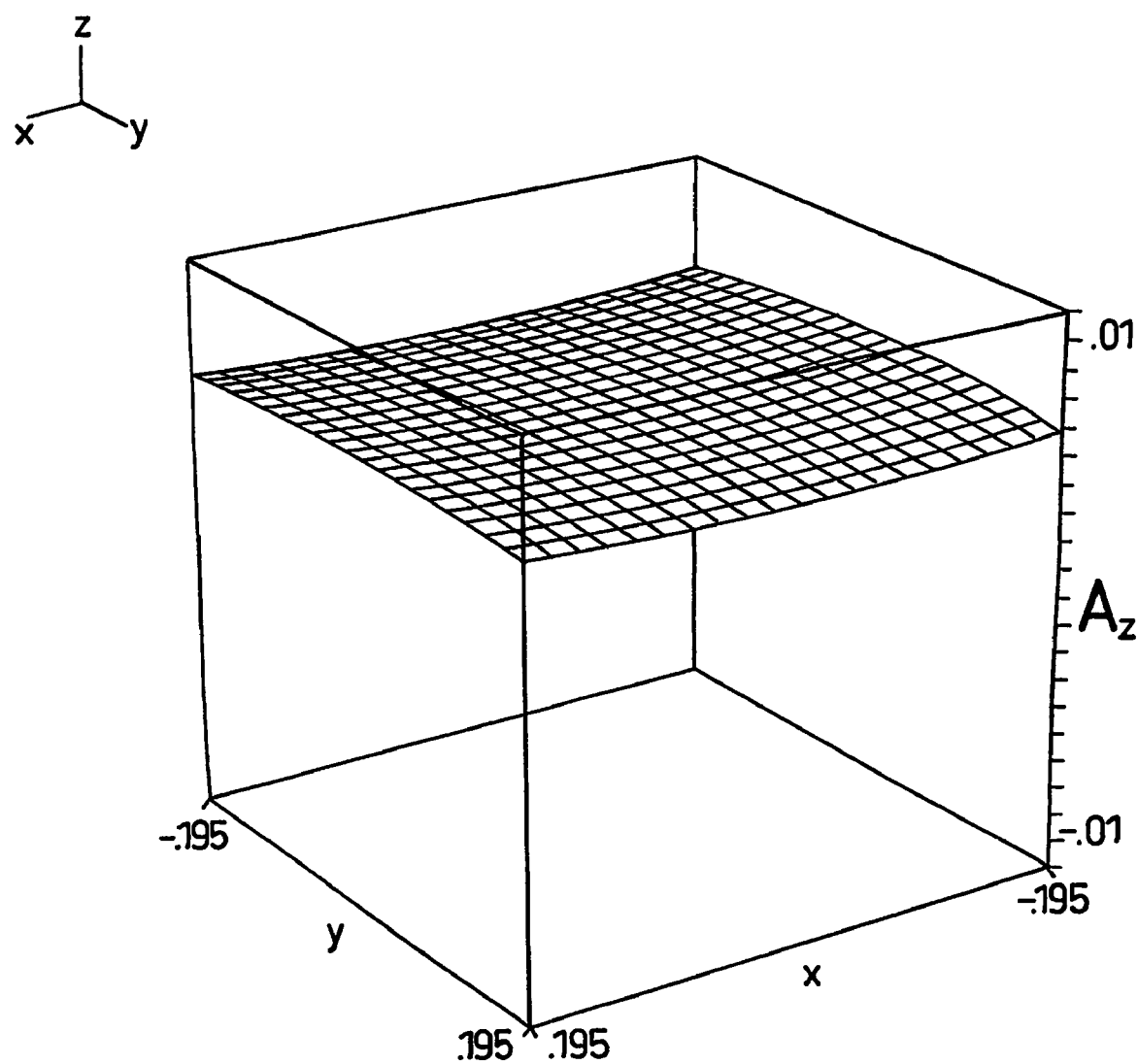
Figure 6:
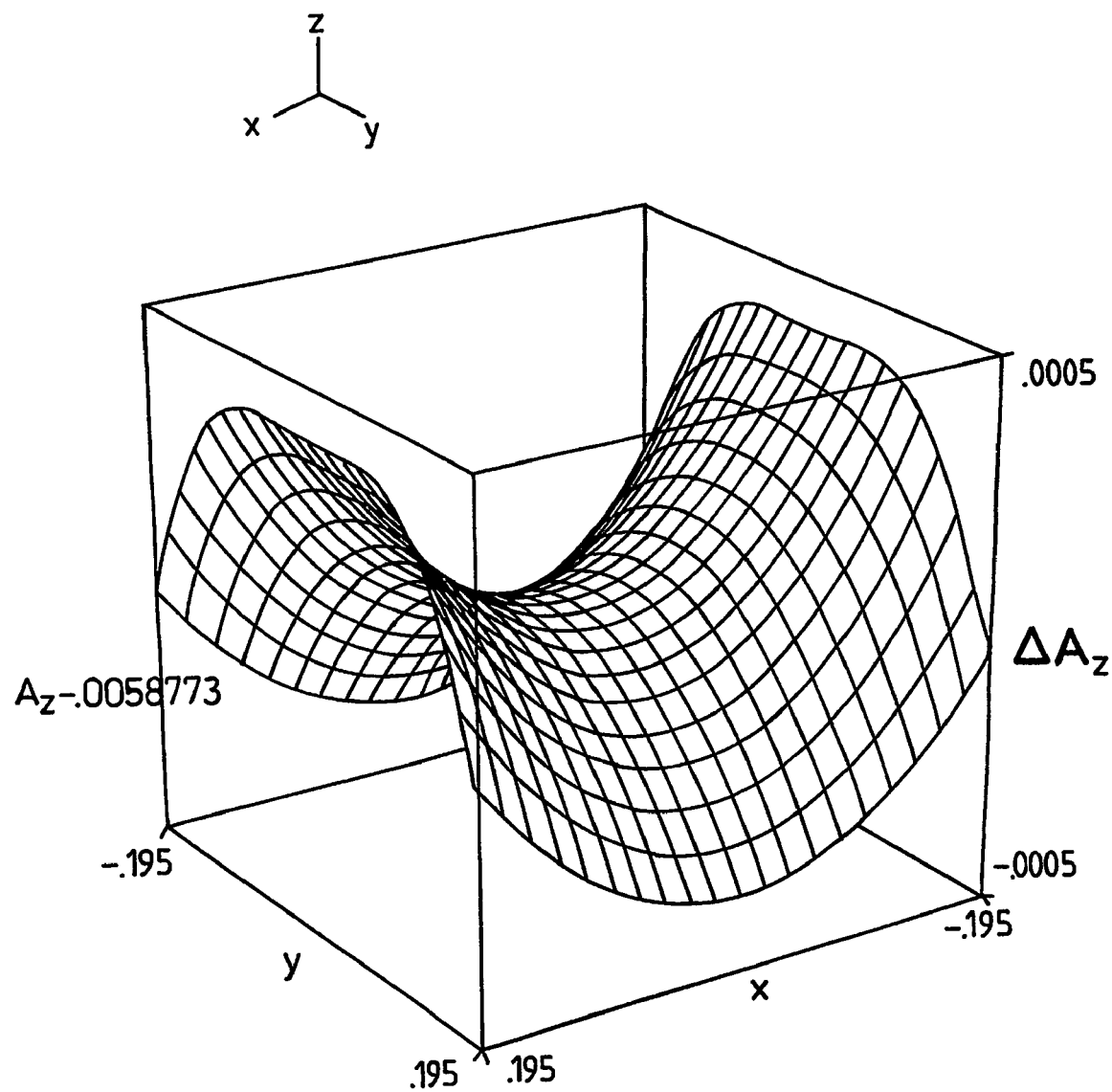

The result of the calculation for 4 wires is shown in FIG. 5. We can write $$A = \hat{z}(A_0 + A_2\rho^2\cos(2\phi) + A_4\rho^4\cos(4\phi) + \ldots) \text{ tm} \quad (30)$$

where $\rho^2=x^2+y^2$ and $R_1^2=x_1^2+y_1^2$. The value of $A_o$ is 0.00588 T m. We assume that this part of the vector potential can be removed completely so that the important term is the residual vector potential difference.

$$\Delta A = A - \hat{z} A_0. \tag{31}$$

which is shown in FIG. 6. $\Delta A$ is mainly determined by $A_2 \rho^2 \cos(2\phi)$, a term which cannot be reduced for it is needed to create the magnetic field gradient. The maximum excursion $\Delta A$ in the ROI is $\pm 0.00040$ T m. Any reduction in $\Delta A$ would correspond directly to a reduction in $G_x$.

5.1B Discussion of Coil 1 Results

To produce a proper comparison between the present Coil 1 and the BB results, two things must be done: we must scale our results so as to compare them with the same gradient strength of 20 mT m$^{-1}$; we must also scale to the same rate of change of magnetic field gradient of 100 T m$^{-1}$ s$^{-1}$. When the first of the scaling procedures is introduced and implemented the new residual vector potential in the ROI is $\Delta A = \pm 0.000356$ T m. The residual E-field associated with this at a frequency of 1 kHz is $\Delta E = \pm 2\pi f \Delta A = \pm 2.2387$ V m$^{-1}$. The maximum value of $dG_x/dt$ is $20 \times 10^{-3} \omega = 125.664$ T m$^{-1}$s$^{-1}$ in Coil 1. In BB they quote 100 T m$^{-1}$s$^{-1}$. Scaling frequency to compare with BB gives f'=0.79578 kHz so that $\Delta E'$ is further scaled down to $\Delta E''=1.78$ V m$^{-1}$. This result is 0.34 of the BB result and suggests that, using the new coil, we could run at approximately three times the gradient strength before reaching the neural stimulation threshold provided the term $A_o$ can be removed.

The term $A_o$ after scaling to 20 mT m$^{-1}$ and to 100 T m$^{-1}$s$^{-1}$ as described above, corresponds to an electric field of magnitude $\omega A_o = 26.15$ V m$^{-1}$, some five times larger than that obtained by BB. Coil 1 is only viable if the term in $A_o$ can be completely removed, for then the maximum electric field is only 1.78 V m$^{-1}$.

5.2 Coil 2

In any magnetic resonance imaging arrangement the coil system must be capable of producing three orthogonal gradients, $G_x$, $G_y$, and $G_z$. In the coordinate system we are using for these calculations the large external magnetic field points along the y-axis. This means that the $G_x$ gradient coil already calculated can be physically rotated about the y-axis to give a $G_z$ coil; we now consider generating $G_y$ using the four wire arrangement of FIG. 2. However, in this case two of the currents are reversed and the angle, $2\beta$, is now $\pi/2=90°$. The arrangment is sketched in FIG. 7. All other dimensions are as described previously, but now $I_1=I_2=4000$ A and $I_3=I_4=-4000$ A.

Figure 8B:
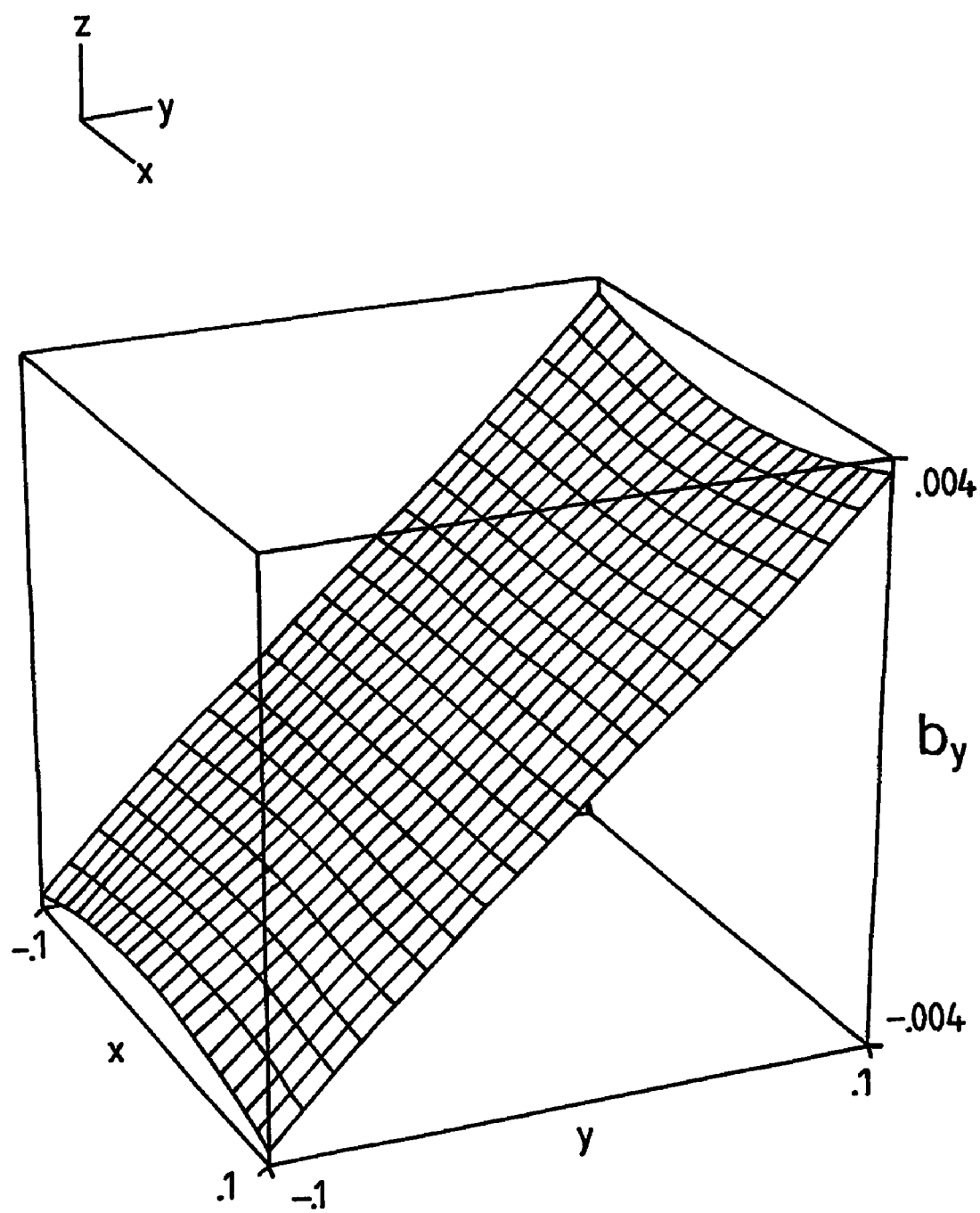

Although the gradient strength is higher for $G_y$ the linearity is not so good, as shown in FIG. 8A. Over a restricted ROI square of side $2x=\pm 0.39$ m, Coil 2 gives a gradient $G_y=33.915$ mT m$^{-1}$ as shown in FIG. 8b. In this arrangement $a_1=R_1=0.231$ m.

5.2A Vector Potential Calculation

Figure 9:
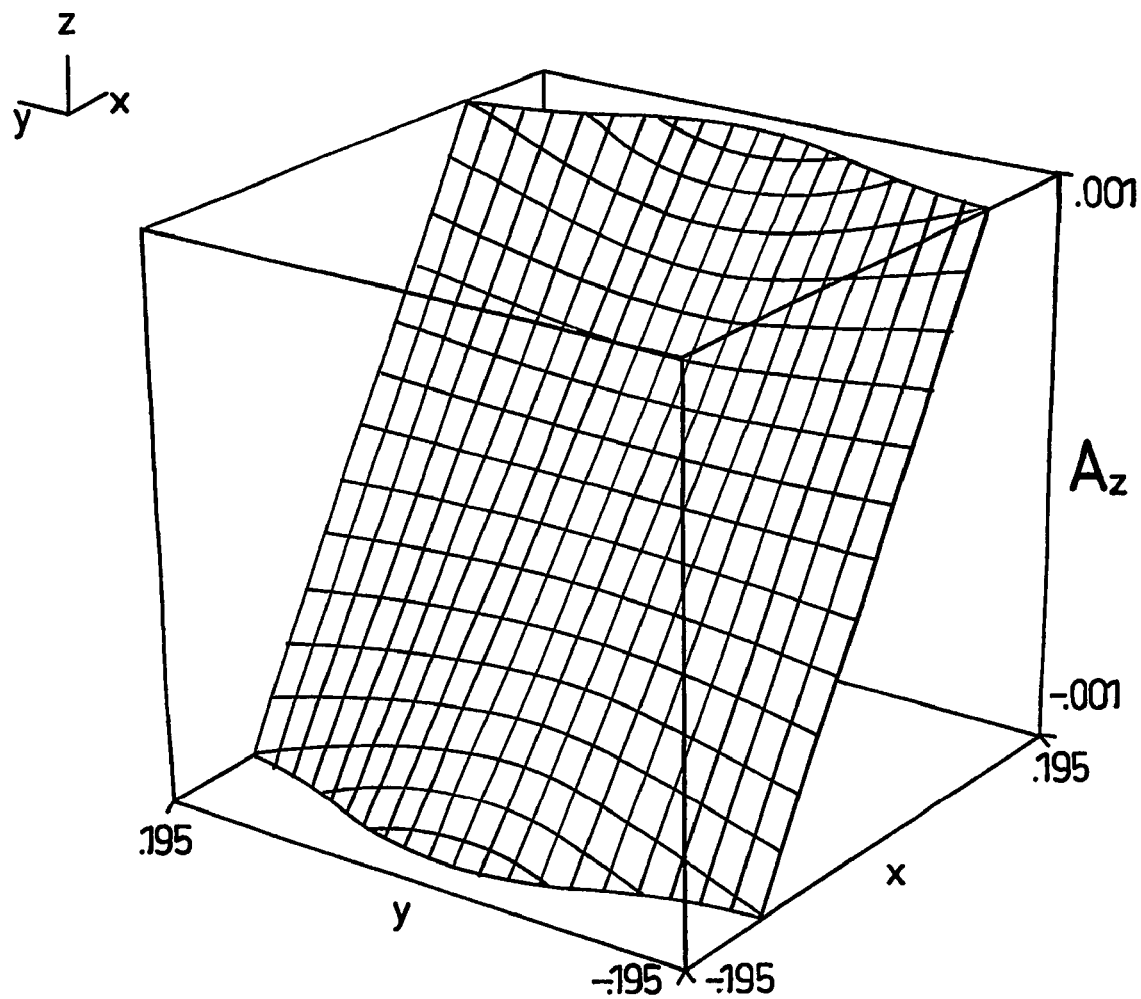

The vector potential has been calculated for Coil 2 for the current arrangement of FIG. 7 with I=4000 A. The vector potential for an ROI square of side $2x=0.39$ m is shown in FIG. 8. From FIG. 9 we see that the maximum change of $\Delta A = \pm 0.001$ T m over the ROI.

5.2B Discussion of Coil 2 Results

As with Coil 1 the results of Coil 2 must be scaled to 20 mT m$^{-1}$ and to 100 T m$^{-1}$ s$^{-1}$. It is noted that $A_o=0$ for Coil 2. Scaling $\Delta A$ down to the corresponding gradient of 20 mT m$^{-1}$ gives $\Delta A'=0.00059$ T m. The residual E-field associated with this is $\Delta E'=2\pi f \Delta A'=\pm 3.7$ V m$^{-1}$ evaluated at f=1 kHz. Scaling $\Delta E'$ to $\Delta E''$ at 0.79578 kHz gives $\Delta E''=2.95$ V m$^{-1}$. This is 0.84 of the BB result for their $G_z$ coil.

5.3. Coil 3

Finally we discuss an alternative coil arrangement for producing a $G_x$ gradient. The wire arrangement is similar to FIG. 7 but with the wires rotated clockwise through 45° to give the arrangement shown in FIG. 10. The currents and directions are the same as in FIG. 7. This wire arrangement is capable of producing a field, $B_y$, which varies in the x-direction as shown in FIG. 11.

It is noted that over the ROI square with side $2x=0.39$ m the field variation is non-linear at the edges. In the centre the gradient produced is $G_x=28.45$ mT m$^{-1}$.

5.3A Vector Potential Calculation

Figure 12A:
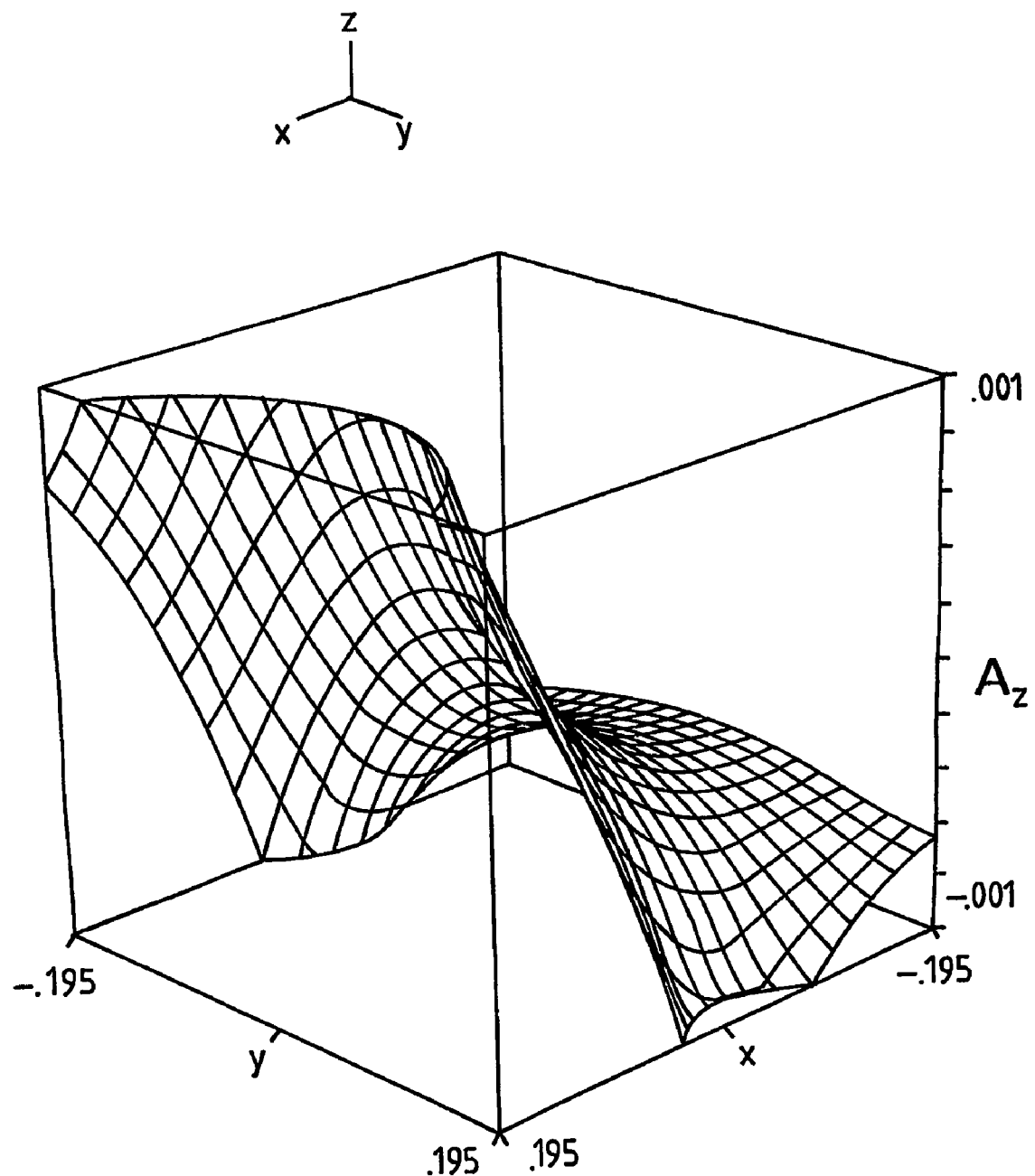
Figure 12B:
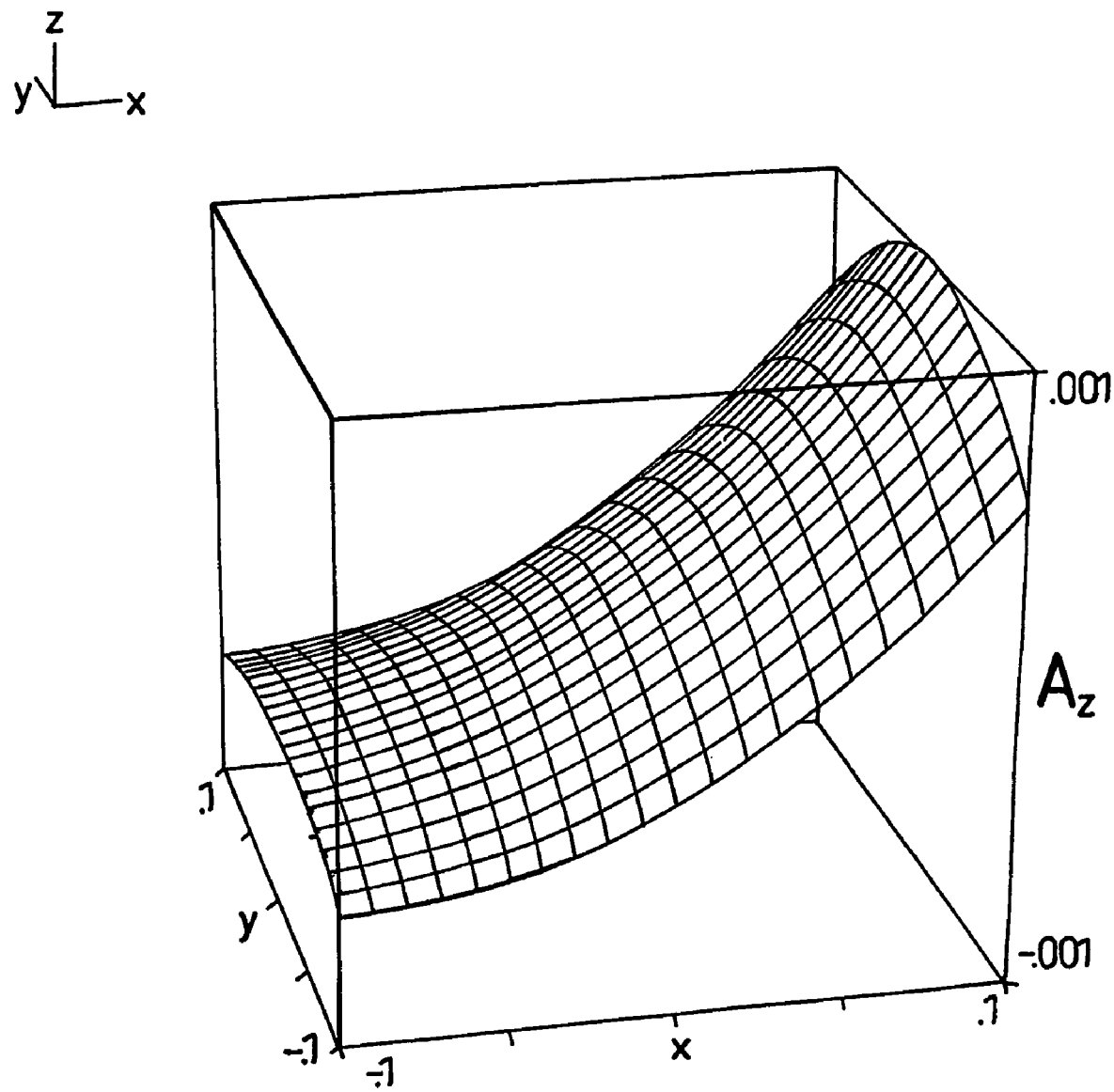

The vector potential has been calculated for Coil 3 and is plotted in FIG. 12a. Again we note that $A_o=0$. Over the square ROI with side $2x=0.39$ m the variation $\pm A=\pm 0.001$ T m. Over the restricted ROI of FIG. 12B the maximum change of $\Delta A=0.001$ T m and the minimum is $\Delta A=-0.00032$ T m.

5.3B Discussion of Coil 3 Results

As with the previous coils the results of Coil 3 must be scaled to 20 mT m$^{-1}$ and to 100 T m$^{-1}$ s$^{-1}$. Scaling $\Delta A=0.001$ T m down to the corresponding gradient of 20 mT m$^{-1}$ gives $\Delta A'=0.0007$ T m. The residual E-field associated with this, $\Delta E'=2\pi f \Delta A'=+4.4$ V m$^{-1}$ evaluated at 1 kHz. Scaling $\Delta E'$ at 1 kHz to $\Delta E''$ at 0.79578 kHz gives $\Delta E''=3.5$ V m$^{-1}$. This is 0.66 of the BB result for the $E_{max}$ in their $G_x$ coil. However, it is noted that so far as linearity is concerned Coil 3 has a generally worse performance than Coil 1. Since $E_{max}$ is larger than that of Coil 1 it is proposed that we do not pursue Coil 3 further but concentrate purely on Coils 1 and 2.

6. EFFECT OF $A_o$ TERM

The presence of an $A_o$ term leads to a contribution to the electric field of magnitude $\omega A_o$ which can be very large leading to a significant current along the z-direction. Knowing the vector potential $A(r,t)$ would be sufficient to calculate the electric field E and hence the current density j were no electrical charges present. However, when the normal component of $A(r,t)$ on the boundaries is non-zero, charges appear, leading to a scalar potential $V(r,t)$. The vector equation to be solved is $$j = \sigma E = \sigma\left(-\nabla V(r,t) = \frac{\partial A(r,t)}{\partial t}\right) \tag{32}$$

where $\sigma$ is the tissue conductivity. To solve this equation we choose a specific tissue model in the form of an homogeneous cylinder of length 2l with cylindrical axis along the z-direction, as sketched in FIG. 13. The end faces of the cylinder are normal to the z-axis. We take the tissue permittivity as $\epsilon_o \epsilon_r$ where $\epsilon_o$ is the permittivity of free space and $\epsilon_r$ is the relative permittivity of the tissue; the speed of light, v, in the dielectric medium is given by $v^2=1/\mu_o \epsilon_o \epsilon_r$.

6.1 Steady State Solution

In order to deal with Eq. (32) it is convenient to treat the surface electric charge per unit area, q(t) given by $$q(t) = \int_{t_0}^{t} j_z(t') dt'. \tag{33}$$

The term $\nabla V(r,t) = -E^V(r\,t)$ in Eq. (32) is the contribution to the electric field arising from the induced charge, $q(t)$. We shall assume that $E^V(r,t)$ lies along the z-direction only and is a constant so that the electric potential is $$V(r,t) = -zE_x^V(t). \tag{34}$$

However, we know that the charge per unit area is $$q = cV \tag{35}$$

where $c = \epsilon_o\epsilon_r/2l$ is the capacitance per unit area across the cylinder ends. Let us concentrate on the end at $z=l$. Integrating Eq. (32) with respect to time we have $$q(t) = \int_{t_0}^{t} j_z(t') dt' = -\sigma \int_{t_0}^{t} \frac{\partial V}{\partial z} dt' - \sigma A_z \tag{36}$$
$$= -\sigma \int_{t_0}^{t} \frac{V}{2l} dt' - \sigma A_z = -\sigma \int_{t_0}^{t} \frac{q(t')}{\epsilon_0\epsilon_r} dt' - \sigma A_z.$$

Here $A_z$ is the z-component of the vector potential evaluated at the end of the cylinder, $z=l$. If we differentiate this expression with respect to time we get the differential equation $$\frac{dq(t)}{dt} + \frac{q}{\tau} = -\sigma\frac{\partial A_z}{\partial t}, \tag{37}$$

where $\tau = \epsilon_o\epsilon_r/\sigma$ is the charging time constant of c.

To simplify matters let us suppose that both $\epsilon_r$ and $\sigma$ are independent of frequency. The solution of Eq. (37) is $$q(t)e^{\frac{t}{\tau}} = \int_{-\infty}^{t} \frac{dq(t)e^{\frac{t}{\tau}}}{dt} dt = -\sigma \int_{-\infty}^{t} \frac{\partial A_z}{\partial t} e^{\frac{t}{\tau}} dt. \tag{38}$$

To get the steady state solution we take $t_o = -\infty$ and take the time dependence of both $A_z(r,t)$ and $q(t)$ to be of the form $e^{-i\omega t}$. Then $$q(t) = i\omega\sigma A_z e^{\frac{-t}{\tau}} \int_{-\infty}^{t} e^{-i\omega t'} e^{\frac{t'}{\tau}} dt' = \frac{i\omega\sigma A_z}{\tau^{-1} - i\omega} e^{-i\omega t}. \tag{39}$$

The corresponding current density in the cylinder is $$j(t) = i\omega\sigma A_z \left(\frac{\omega}{i\tau^{-1} + \omega}\right) e^{-i\omega t} \tag{40}$$
$$= \omega\sigma A_z \frac{\omega}{(\tau^{-2} + \omega^2)^{1/2}} e^{-i\omega t} e^{i\phi}$$
$$= \sigma E;$$

where $\tan\phi = \omega\tau$. The electric field has a maximum magnitude of $$E_{\max} = \omega A_z \left|\frac{\omega}{i\tau^{-1} + \omega}\right|. \tag{41}$$

When $\tau^{-1} = \sigma/\epsilon_o\epsilon_r \gg \omega$ the field is $$E_{\max} \simeq \omega^2\tau A_z = \omega A_z \frac{\omega\epsilon_0\epsilon_r}{\sigma}. \tag{42}$$

For $\omega = 5000$ rad s$^{-1}$ we obtain, using $\epsilon_r\epsilon_o = 9\times10^{-8}$, $\omega\epsilon_r\epsilon_o/\sigma = 2.3\times10^{-3}$. Using $\omega A_o = 26.15$ V m$^{-1}$, the value found for Coil 1, gives a maximum electric field from the $A_o$ term of 0.06 V m$^{-1}$.

6.2 Transient Solution

When $A_z$ is not sinusoidal we solve the equation $$\frac{dq(t)}{dt} + \frac{q}{\tau} = -\sigma\frac{\partial A_z}{\partial t} \tag{43}$$

using the Laplace transform. The Laplace transform of $q(t)$ is $Q(s)$; that of $A_z(t)$ is $A(s)$. Then $$sQ(s) - q(0^+) + \frac{1}{\tau}Q(s) = -\sigma sA(s) + \sigma A_z(0^+). \tag{44}$$

We know the time dependence of the input function $A(r,t)$ which follows the gradient $G_x(t)$. If $G_x(t)$ is applied as a square pulse of duration $t_w$ starting at $t=0$, then we may set the vector potential to $$A_z(r,t) = A_z(r)[H(t) - H(t-t_w)] \tag{45}$$

where $H(t)$ is the Heaviside step function. The Laplace transform of $A_z$ is $$A(s) = \frac{A_z(1 - e^{-st_w})}{s} \tag{46}$$

and $q(0^+) = A_z(0^+) = 0$; thus $$Q(s) = -\frac{\sigma sA(s)}{s + \tau^{-1}} = -\frac{\sigma A_z(1 - e^{-st_w})}{s + \tau^{-1}}. \tag{47}$$

Figure 14B:
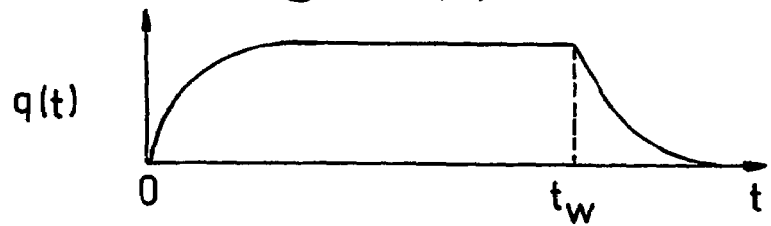
Figure 14C:
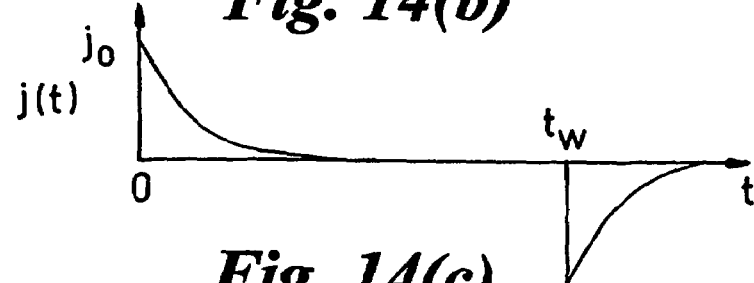

There is a simple pole at $s = -\tau^{-1}$. The inverse transform gives $$q(t) = q_0(e^{-t/\tau} - 1)H(t) - q_0(e^{-(t-t_w)/\tau} - 1)H(t-t_w). \tag{48}$$

with $q_o = -\sigma A_z$. FIG. 14A shows the input function $A_z(t)$ and FIG. 14b shows the induced charge $q(t)$ at the ends of the cylinder. The corresponding current density $$j(t) = -\frac{q_0}{\tau}e^{-t/\tau}H(t) + \frac{q_0}{\tau}e^{-(t-t_w)/\tau}H(t-t_w). \tag{49}$$

is sketched in FIG. 14C.

The maximum magnitude of the current density is $$j = \frac{\sigma A_z}{\tau} = \sigma E_z \qquad (50)$$

corresponding to an electric field $$E_z = \frac{\sigma A_z}{\epsilon_0 \epsilon_r}. \qquad (51)$$

If the term $A_o$ is not removed the magnitude of the electric field when scaled to 20 mT m$^{-1}$ is (if $\epsilon_r = 10^4$).

$$E_z = \frac{0.2 \times .0052308}{8.854 \times 10^{-8}} = 1.182 \times 10^{-4} \text{V } m^{-1}. \qquad (52)$$

This electric field is much larger than the steady state case: the reason is that we are using all frequencies to generate the square wave.

Figure 15:
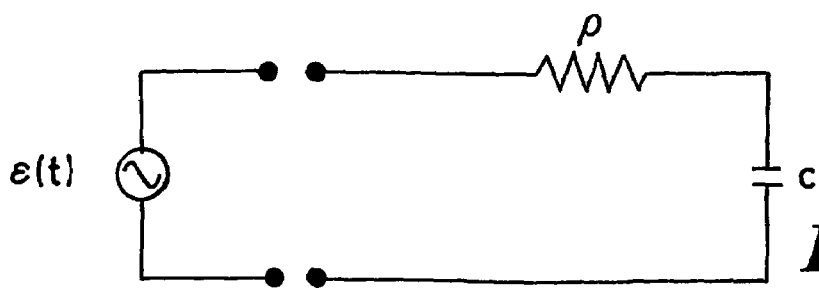

The equivalent electrical circuit can be deduced from the differential equation, and is sketched in FIG. 15. In this arrangement the applied voltage $\mathscr{E}(t)$ represents the quantity $-\sigma A_z$. This establishes the fact that a conductive tissue cylinder (which behaves as a leaky capacitor) is analogous to an R-C circuit driven by a time-dependent voltage generator.

7. REMOVAL OF $A_o$ COMPLETELY

The low values of electric field in the body are only possible if the contribution of the $A_o$ term to the electric field is removed completely. We outline different ways of achieving this goal.

Figure 16:
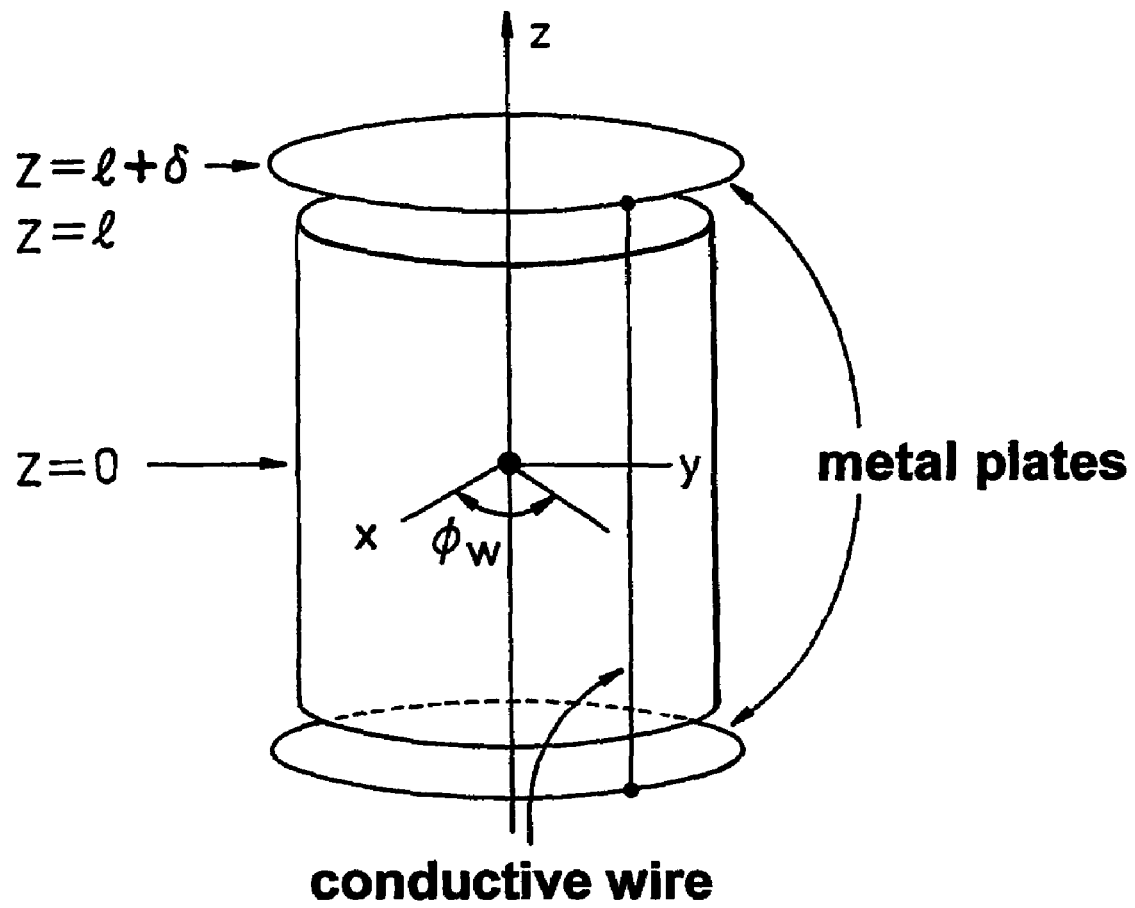

In the first embodiment two highly conductive metal plates of area larger than that of the ends of the patient equivalent cylinder are placed-at positions $z=\pm(l+\delta)$ just outside the cylinder end faces, $\delta$ being the width of a small gap between the metal plate and the end of the patient equivalent cylinder; the two plates are connected by a highly conductive wire placed at an appropriate angle, $\phi_w$, and at a radial distance $s_1$ so that charges can move rapidly along the wire from one plate to the other so that the emf between the plates $$\varepsilon = \int_{-l-\delta}^{l+\delta} E_z dz \qquad (53)$$

is effectively zero. See FIG. 16. For a uniform electric field this occurs if $E_z=0$ along the wire. Assuming that $A_o$ and $A_2$ are independent of z, and writing $E_z^V = -q/\epsilon_r\epsilon_o$ gives $$E_z = E_z^V + E_z^A = -\frac{q}{\epsilon_r\epsilon_0} + i\omega A_0 + i\omega A_2 s_1^2 \cos(2\phi_w) = 0 \qquad (54)$$

When a free surface charge density $$q = i\omega \epsilon_r \epsilon_0 (A_0 + A_2 s_1^2 \cos(2\phi_w)) \qquad (55)$$

is set up on the plates the electric field is zero in the wire. The electric field inside the cylinder is $$E_z = -\frac{\partial V}{\partial z} - \frac{\partial A_z}{\partial t} = -\frac{q}{\epsilon_r\epsilon_0} + i\omega A_0 + i\omega A_2 \rho^2 \cos(2\phi) \qquad (56)$$

$$= i\omega(A_2 \rho^2 \cos(2\phi) - A_2 s_1^2 \cos(2\phi_w)).$$

It is best to place the conducting wire between the plates at an angle $\phi_w$ such that $\cos(2\phi_w)=0$ so that the maximum value of the electric field arising from $A_2$ is as small as possible. If $\cos(2\phi_w) \neq 0$ there is an angle $\phi$ which gives rise to a larger electric field somewhere in the cylinder.

If $A_o(z)$ varies with z we cannot cancel it completely. The emf $$\varepsilon = \int_{-l-\delta}^{l+\delta} E_z dz = \int_{-l-\delta}^{l+\delta} (E_z^V + E_z^A(z)) dz \qquad (57)$$

$$= -\frac{2q}{\epsilon_r\epsilon_0}(l+\delta) + i\omega \int_{-l-\delta}^{l+\delta} (A_0(z) + A_2(z) s_1^2 \cos(2\phi_w)) dz$$

is zero. Thus the charge is related to the line integral of the vector potential $$\frac{q}{\epsilon_r\epsilon_0} = \frac{i\omega}{2(l+\delta)} \int_{-l-\delta}^{l+\delta} (A_0(z) + A_2(z) s^2 \cos(2\phi_w)) dz. \qquad (58)$$

It is advantageous to design the coils so that $A_o$ (and to a lesser extent $A_2$) is independent of z as far as possible.

As an alternative we can place two metal plates at $z=\pm(l+\delta)$ and connect them to an external source of emf of the appropriate phase so that the electric field from the external emf is $$E_z^V = -i\omega A_0. \qquad (59)$$

To do this will require the use of an emf of exactly the correct voltage and correct phase. Again, it is advantageous to design the coils so that $A_o$ is independent of z as far as possible.

Yet another alternative is to add an extra set of solenoidal coils, which produce no B-field outside the coil but do produce a vector potential, in such a way so as to cancel out $A_o$, (see § 11). In an extension of this concept the solenoidal coils may be replaced by a set of suitably placed and sized taroidal coils.

8. EFFECT OF FINITE LENGTH ON UNIFORMITY OF $A_o(z)$ WITH z

We have evaluated the z-component of the vector potential $A_z(z)$ along the central axis $(0, 0, z)$ of our four wire arrangement with all four wires carrying a current of 4000 A set out as for Coil 1. In FIG. 17 we show $A_o(z)$ as a function of z with coil half-length $b_1$ stepped from one to two metres in steps of 0.1 m. For the lowest curve corresponding to $b_1=1$ m we see a large variation of $A_o(z)$ over the range $\pm 0.95$ m, the length of patient. However, as expected, when the coil wire length is increased, corresponding to increased steps of the parameter $b_1$, the variation of $A_o(z)$ with z flattens somewhat to produce a smaller change over the patient.

Figure 19:
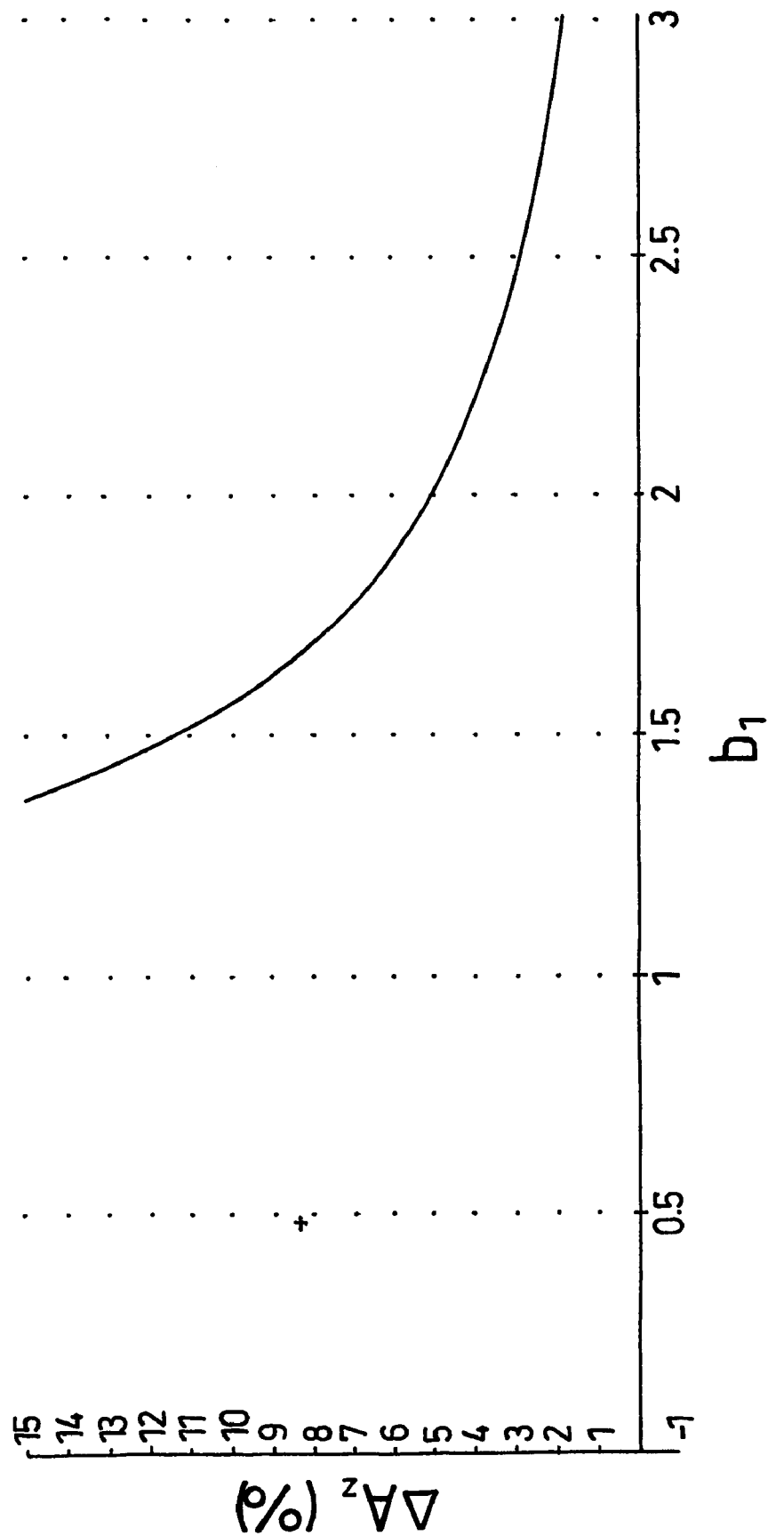

FIG. 18 gives an expanded view of the same data as FIG. 17. From this detail the percentage change in $A_z(z=0.95)$ from its value $A_z(0)$ can be calculated. This quantity is plotted as a function of $b_1$ in FIG. 19. The figure shows clearly that to keep the percentage change less than 10%, $b_1$ must be greater than about 1.6 m if we use straight wires.

9. ALTERNATIVE ARRANGEMENTS FOR UNIFORMITY OF $A_o(z)$

Of course it may not be convenient or practical to increase the wire length $b_1$. At least three options present themselves to circumvent the problem. The first is to bend the wires forming the coil cage so that the cage diameter tapers down at each end. The second is to shim the coils so that the current in the z-direction increases slightly with z. The third is more subtle and relies on electrostatics.

Let us assume that the, 'constant' electric field generated from the vector potential has the form $E_0^A + \Delta E_{0A}(z)$. To reduce the effect of this term we need to generate an electric field $E_0^V + \Delta E_0^V(z)$ from the scalar potential so that the residual field $\delta E = E_0^A + \Delta E_0^A(z) + E_0^V + \Delta E_0^V(z)$ is as small as possible. The solutions already discussed generate the principal constant terms in $\delta E$, namely $E_0^V = -E_0^A$. The term $\Delta E_0^A(z) = i\omega \Delta A_0(z)$ where $\Delta A_0(z)$ is the variation from $A_0$ can be estimated from the graph in FIG. 18. To negate this variation we propose that the term $\Delta E_0^V(z)$ be generated by appropriately driving the tessellae surrounding the coil arrangement with a potential distribution. Further description of this general approach applied to the $E_2$ term is given in §10.

9.1 BENT WIRE

Suppose the wire has a half-length l in the z-direction, but it is curved to be part of a parabola. See FIG. 20A. The current density $j_z$ is $$j_z(\rho, \phi, z) = \frac{I}{\rho} \frac{\delta\left(\rho - R_1 + \frac{1}{2}\alpha z^2\right)}{(1+\alpha^2 z^2)^{1/2}} \delta(\phi - \pi/8) H(b_1 - z) H(z + b_1). \tag{60}$$

Here $R_1$ is the distance of the bent wire from the z-axis at z=0. The return path (not shown) runs parallel to the z-axis and is assumed for this calculation to be at infinity.

$$A_z = A_0 = \frac{\mu_0 I}{4\pi} \int_{-b_1}^{b_1} \frac{1}{(1+\alpha^2 z^2)^{1/2}} \frac{dz'}{\left((z-z')^2 + \left(R_1 - \frac{1}{2}\alpha z'^2\right)^2\right)^{1/2}}. \tag{61}$$

If $\alpha$ is small we can work to first order in $\alpha$ $$A_0 = \frac{\mu_0 I}{4\pi} \int_{-b_1}^{b_1} \frac{1}{[(z-z')^2 + R_1^2]^{1/2}} \left[1 + \frac{\frac{1}{2}\alpha R_1 z'^2}{(z-z')^2 + R_1^2}\right] dz' \tag{62}$$

$$= \frac{\mu_0 I}{4\pi} \int_{-b_1}^{b_1} \frac{dz'}{[(z-z')^2 + R_1^2]^{1/2}} + \frac{\mu_0 I}{4\pi} \int_{-b_1}^{b_1} \frac{\frac{1}{2}\alpha R_1 z'^2 dz'}{[(z-z')^2 + R_1^2]^{3/2}}.$$

To solve this put $$\sinh\theta = \frac{z'-z}{R_1}, \quad \sinh\theta_+ = \frac{b_1}{R_1} - \frac{z}{R_1}, \quad \sinh\theta_- = \frac{b_1}{R_1} + \frac{z}{R_1}, \tag{63}$$

so that $$A_0 = \frac{\mu_0 I}{4\pi} \int_{-\theta_-}^{\theta_+} d\theta + \frac{\mu_0 I \alpha R_1}{8\pi} \int_{-\theta_-}^{\theta_+} \frac{(z/R_1 + \sinh\theta)^2}{\cosh^2\theta} d\theta \tag{64}$$

Now $$\int_{-\theta_-}^{\theta_+} \frac{(z/R_1 + \sinh\theta)^2}{\cosh\theta} d\theta = \tag{65}$$
$$\left(\frac{z}{R_1}\right)^2 \int_{-\theta_-}^{\theta_+} \frac{1}{\cosh^2\theta} d\theta + \frac{2z}{R_1} \int_{-\theta_-}^{\theta_+} \frac{\sinh\theta}{\cosh^2\theta} d\theta + \int_{-\theta_-}^{\theta_+} \frac{\sinh^2\theta}{\cosh^2\theta} d\theta.$$

The integrals are $$I_1 = \int_{-\theta_-}^{\theta_+} \frac{1}{\cosh^2\theta} d\theta = \left[-\frac{2}{e^{2\theta}+1}\right]_{-\theta_-}^{\theta_+} = \frac{2}{e^{-2\theta_-}+1} - \frac{2}{e^{2\theta_+}+1} \tag{66a}$$

$$I_2 = \int_{-\theta_-}^{\theta_+} \frac{\sinh\theta}{\cosh^2\theta} d\theta = \left[-\frac{1}{\cosh\theta}\right]_{-\theta_-}^{\theta_+} = \frac{1}{\cosh\theta_-} - \frac{1}{\cosh\theta_+}, \tag{66b}$$

$$I_3 = \int_{-\theta_-}^{\theta_+} \frac{\sinh^2\theta}{\cosh^2\theta} d\theta = \int_{-\theta_-}^{\theta_+} d\theta - \int_{-\theta_-}^{\theta_+} \frac{1}{\cosh^2\theta} d\theta \tag{66c}$$
$$= [\theta]_{-\theta_-}^{\theta_+} - I_1 = \theta_+ + \theta_- - \frac{2}{e^{-2\theta_-}+1} + \frac{2}{e^{2\theta_+}+1}.$$

The vector potential has the z-component $$A0 = \frac{\mu_0 I}{4\pi}(\theta_+ + \theta_-) + \frac{\mu_0 I \alpha R_1}{8\pi}\left[\left(\frac{z}{R_1}\right)^2 I_1 + \frac{2z}{R_1} I_2 + (\theta_+ + \theta_- - I_1)\right] \tag{67}$$
$$= \frac{\mu_0 I}{4\pi}\left\{(\theta_+ + \theta_-)\left(1 + \frac{\alpha R_1}{2}\right) + \frac{\alpha R_1}{2}\left[\left(\frac{z^2}{R_1^2} - 1\right)I_1 + \frac{2z}{R_1} I_2\right]\right\}$$

By choosing $\alpha$ appropriately we can minimize the variation of $A_z$ with z.

For example, for $b_1 \gg R_1$ and $b_1 > |z|$ we get $\theta_+ \sim \ln(2(b_1-z)/R_1)$, $\theta_- \sim \ln(2(b_1+z)/R_1)$ and so $$I_1 \simeq 2; \quad I_2 = \frac{1}{\cosh\theta_-} - \frac{1}{\cosh\theta_+} \simeq \left(\frac{R_1}{b_1-z} - \frac{R_1}{b_1+z}\right) \simeq \frac{2zR_1}{b_1^2} \text{ and} \tag{68}$$

$$A_z = \frac{\mu_0 I}{4\pi}\left\{\ln\left(\frac{4(b_1^2 - z^2)}{R_1^2}\right)\left(1 + \frac{\alpha R_1}{2}\right) + \frac{\alpha R_1}{2}\left[\left(\frac{2z^2}{R_1^2} - 2\right) + \frac{4z^2}{b_1^2}\right]\right\}. \tag{69}$$

By choosing $\alpha \approx R_1/b_1^2$ we can smooth out substantially the variations in $A_o(z)$ with z. The variation of $A_2(z)$ can be calculated in the same way. With only one parameter, $\alpha$, it is not possible to ensure that both $A_2(z)$ and $A_0(z)$, and hence $E_{2z}^A(z)$ and $E_{20}^A(z)$, are independent of z.

In passing we note that Eq.(69) indicates that when $\alpha=0$, $A_z(z)$ is of the form $$A_z = \frac{\mu_0 I}{2\pi} \ln(2b_1/R_1)\left\{1 - \frac{z^2}{2\ln(2b_1/R_1)b_1^2}\right\}. \tag{70}$$

We can use this expression to estimate the magnitude of the emf experienced once the wire has joined the two plates.

$$\varepsilon = \frac{i\omega A_0}{2\ln(2b_1/R_1)b_1^2}\left(z^2 - \frac{(l+\delta)^2}{3}\right). \tag{71}$$

Using $\omega A_0 = 26.15$ V m$^{-1}$, $b_1 = 2$ m, $R_1 = 0.327$ m, we get for $z=1=(l+\delta)$ a field of $6.96$ V m$^{-1}$. This indicates the importance of removing this term.

9.2 MODIFICATION OF THE CURRENT

To compensate for the z-dependence revealed in Eq.(70) we can as an alternative, create a current which increases as $$I(z) = I(1+\gamma z^2). \tag{72}$$

For example as z increases extra wires are added running in the z-direction which increase $I(z)$ in a step-wise fashion, thereby approximating to a parabolic increase as shown in FIG. 20B. Then the vector potential is given by $$A_z = \frac{\mu_0 I}{4\pi}\int_{-b_1}^{b_1} \frac{(1+\gamma z'^2)dz'}{((z-z')^2+R_1^2)^{1/2}} \tag{73}$$

$$= \frac{\mu_0 I}{4\pi}\int_{-\theta_-}^{\theta_+}(1+\gamma(z^2+2zR_1\sinh\theta+R_1^2\sinh^2\theta))d\theta.$$

The integrals are readily done and using the approximations given above $$A_z \simeq \frac{\mu_0 I}{4\pi}\left(\ln(4b_1^2/R_1^2) - \frac{z^2}{b_1^2} + \gamma z^2(\ln(4b_1^2/R_1^2)-3)\right). \tag{74}$$

By choosing $\gamma$ appropriately the $z^2$ term can be removed.

9.3 ELECTRIC POTENTIAL

To compensate for the term in $A_z$ varying as $z^2$ we can try to generate an electrostatic field $E_0^V$ from an electric potential $V_0$ which is independent of $\phi$, and which satisfies Laplace's equation. The simplest choice is $$V_0(\rho, z) = i\omega A_0 \frac{\sin(kz)}{k} I_0(k\rho) \tag{75}$$

which generates an electric field with the z component $$E_{0z}^V = i\omega A_0 \cos(kz)I_0(k\rho) \simeq i\omega A_0\left(1 - \frac{k^2 z^2}{2}\right) \tag{76}$$

where we have assumed that k is small to make the expansion. To remove the $z^2$ term in $E_{0z} = E_{0z}^V + E_{0z}^A$ we take $$k^2 = \frac{1}{b_1^2 \ln(2b_1/R_1)}. \tag{77}$$

If we take $b_1 = 2$ m, and $R_1 = 0.327$ m then $k = 0.316$ m$^{-1}$. The z-component of electric field at $z=1$ m is now $$E_{0z} = 26.15 \times \left(1 - \frac{k^2 z^2}{2} - \cos(kz)\right) = -0.01 \text{ V} m^{-1}. \tag{78}$$

If we ensure that this potential is generated on the tessellae that surround the cylinder, the z-component of the electric field is reduced substantially, but at the cost of producing a radial component of the electric field, $$E_{0\rho} = -i\omega A_0 \sin(kz)I_1(k\rho) \simeq i\omega A_0 \sin(kz)k\rho/2. \tag{79}$$

For $\rho = 0.2$ m, and for $z=1$ m, this gives a radial field of magnitude $$26.25 \times \sin(0.316) \times 0.0316 = 0.257 \text{ V m}^{-1}. \tag{80}$$

As such this transverse field is not large, but it can add to other radial terms in the electric field which we may want to generate.

10. MINIMISATION OF E FIELD EFFECTS IN $A_2$

We have so far concentrated on eliminating the effect of $A_o$ on the electric field E by creating a scalar potential such that $$E_0^A + E_0^V = 0. \tag{81}$$

Here $E_o^A = i\omega A_o$ and so $$V_0 = i\omega A_0 z. \tag{82}$$

where $V_0$ is a solution of Laplace's equation which is independent of $\phi$. We now turn our attention to the effect of $A_2$. Let us write $$E_2 = E_2^A + E_2^V \tag{83}$$

where $E_2^A = i\omega A_2 \rho^2 \cos(2\phi)$ and $E_2^V$ is $-\nabla V_2$ where $V_2$ is a solution of Laplace's equation $\nabla^2 V_2 = 0$ which is proportional to $\cos(2\phi)$. It is the $A_2$ term which is responsible for generating the transverse field gradient and therefore as a general caveat we point out that $A_2$ cannot be removed without affecting the gradient which of course we want to retain. Nevertheless we will consider in detail those terms which contribute to $V_2$ which may be used to influence the electric field $E_2$.

By postulating an appropriate form of $V_2$ we specify boundary conditions on $V_2$ on the inside of the cylinder. A way of satisfying these boundary conditions is the following: we imagine the outside surface of the cylinder as a mosaic of conductive tessellae; on each we place electrodes which are insulated from each other; each one has the electric potential we require, created either passively or actively. The two ends of the cylinder are tessellated this way as well as the curved surface. In this way we generate the boundary conditions that determine the potential $V_2$ and hence $E_2{}^V$.

The simplest possible function for $V_2$ is $$V_2 = K_2 z \rho^2 \cos(2\phi). \tag{84}$$

where $K_2 = i\omega A_2$ is a constant related to the induced charge on the plates. The gradient of the potential function in cylindrical coordinates produces components of $E_2{}^V$ along all three unit vector axes, $\hat{\rho}, \hat{\phi}, \hat{k}$, but we note that from this particular form of $V_2$ that the z-component of $E_2{}^V$ exactly cancels the $E_2{}^A$ term everywhere but it leaves terms along the remaining transverse cylindrical axes $\hat{\rho}$ and $\hat{\phi}$. These results, therefore, demonstrate that it is perfectly possible to remove the whole of the z-component of $E_2{}^A$ using the above potential function, but then the transverse $E_2$-fields will appear. The presence of these transverse $E_2$-fields is in effect a two-dimensional solution of Laplace's equation, $\nabla^2 V = 0$, and this has a standard set of hyperbolic solutions given by $a^2 = x^2 - y^2$ and $b^2 = 2xy$, where a and b are constants. Both solutions can be equipotential surfaces or electric fields. In cylindrical polar coordinates these solutions correspond to $a^2 = \rho^2 \cos 2\phi$ and $b^2 = \rho^2 \sin 2\phi$ for a given value of z. In fact these solutions vary linearly with z. Graphs of both functions are shown in FIG. 21A in parametric form. These solutions suggest that by using hyperbolically shaped electrodes suitably placed outside the cylindrical region defining the patient, electric fields could be created either to fix boundary conditions on the patient cylinder or to annul the induced electric fields within the subject. In order not to violate Faraday's law, the $E_2{}^A$ term previously cancelled will now reappear when the $E_2$-fields generated externally exactly balance the induced $E_2$-fields. The charge on the end plates will, by reciprocity, also be cancelled. This latter effect suggests an alternative approach in which the hyperbolic electrodes may be dispensed with provided the original charge distribution is shorted between corresponding tessellae.

There is, therefore, an interplay between the electric field terms $E_2{}^A$ and $E_2{}^V$ which may possibly have a minimum magnitude of the electric field $|E_2|$. If we assume that a fraction $\alpha_2$ of the transverse induced electric fields is balanced by external electrodes then the residual $E_2$-field as a function of the fraction $\alpha_2$ where $0 \leq \alpha_2 \leq 1$ is given by $$|E_2| = a^2 K_2 \sqrt{\alpha_2^2 4R^2 \left(\frac{\rho^2}{a^2}\right)\left(\frac{z^2}{l^2}\right) + (1-\alpha_2)^2 \left(\frac{\rho}{a}\right)^4 \cos^2(2\phi)} \tag{85}$$

Figure 21B:
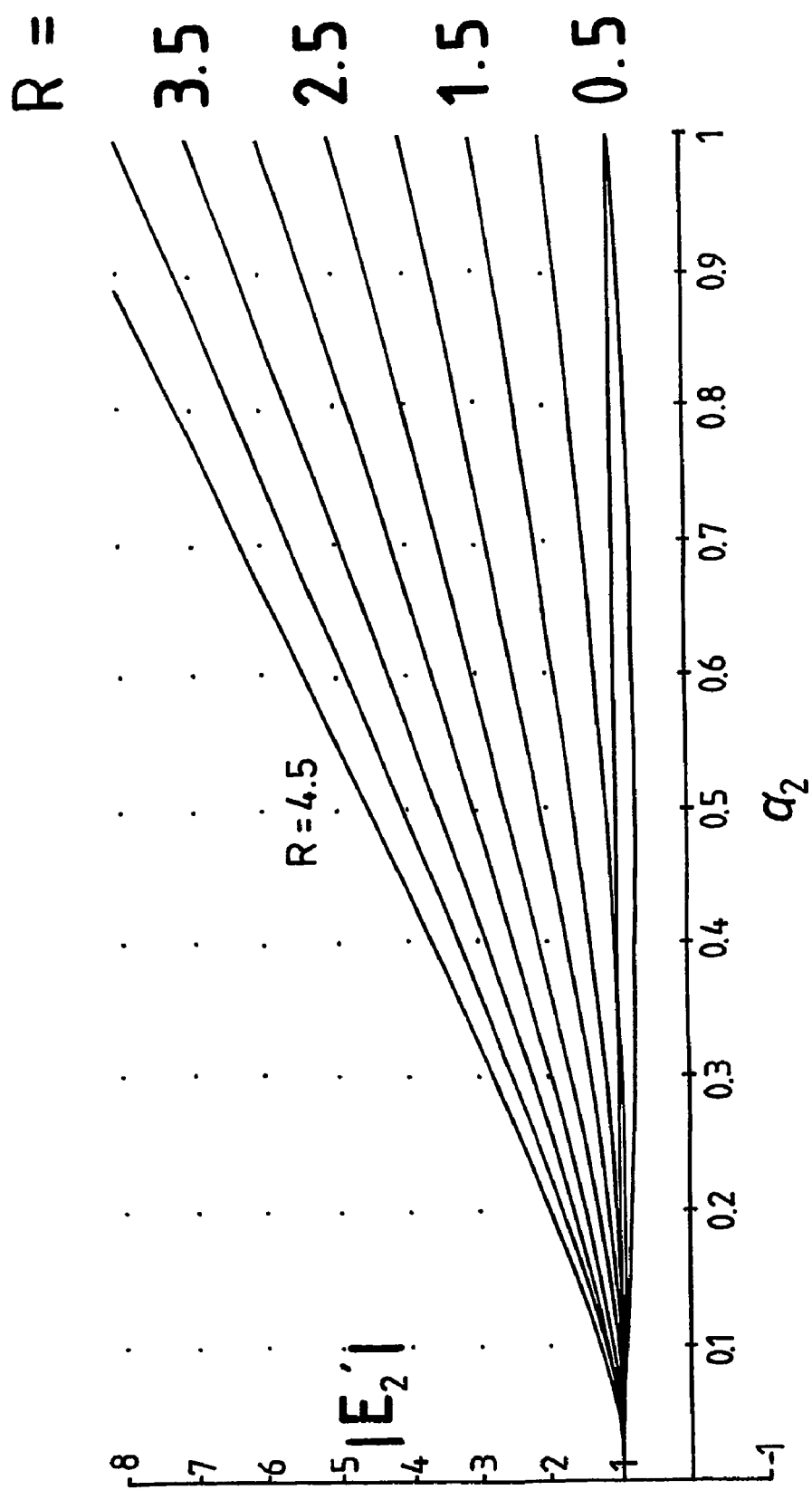

This result is plotted in FIG. 21B for $\rho/a=1$, $z/l=1$ and $\phi=0$ and shows that the best result producing a minimum electric field depends on the ratio $R=l/a$. For a typical subject the representative cylinder would have dimensions $l=1$ m and $a=0.2$ m giving $R=5$. In this case the optimum value of $|E_2|$ is given when $\alpha_2=0$. This case corresponds to no transverse $E_2$-fields with all contributions coming from the axial term. For a very squat cylinder in which $R=0.5$ the optimum is given by $\alpha_2 \approx 0.5$. The graph shows the price paid when $\alpha_2=1$ and $R=5$. In this case the electric field is approximately 7 times the value with $\alpha_2=0$, a situation we would wish to avoid.

To achieve the case $\alpha_2=0$ would require either the use of external electrodes around the body, together with tessellated plates top and bottom of the subject, or shorting of individual tessellae. This would lead to an overall improvement in terms of induced electric fields within the subject. Additionally it is pointed out that the cos $2\phi$ term in Eq. (85) means that there are planes within the subject cylinder where the electric fields are identically zero. We also see from Eq. (85) above that in the plane $z=0$ and with $\alpha_2=1$, ie no external electrodes, there is complete elimination of both the transverse and the longitudinal electric fields. Indeed for a thin disc of radius a with a thickness of $2\Delta z$ about $z=0$, the residual value of $|E_2|$ can be reduced to an arbitrarily small value $\Delta E_2$ given by $\Delta E_2 = 2R(\Delta z/l)$. A disc with thickness less than 0.2 m central to a larger cylinder with $R=5$ and $\alpha_2=1$ would represent an advantage over the case when $\alpha_2=0$.

To get close to the case $\alpha_2=0$ we can use the solution to Laplace's equation for the scalar potential inside the cylinder of the form $$V_2 = \sum_m a_m \frac{\sinh(k_m z)}{\cosh(k_m l)} J_2(k_m \rho) \cos(2\phi). \tag{86}$$

One way of selecting $V_2$ is to suppose that the normal component of the electric field on the curved surface of the cylinder is zero. We can select the values of $k_m$ so that the $\partial V_2/\partial \rho = 0$ at $\rho = a$ which means that the radial component of $E_2{}^V$ vanishes on the curved surface of the cylinder. Thus the condition $J_2'(k_m a) = 0$ defines $k_m$.

The potential $V_2$ contributes to the z-component of the electric field $$E_{2z}^V = -\sum_m k_m a_m \frac{\cosh(k_m z)}{\cosh(k_m l)} J_2(k_m \rho) \cos 2\phi \tag{87}$$

which is largest near the ends of the cylinder. If we also require there to be no z-component of the electric field on the flat surfaces of the cylinder $$E_{2z}(z=l) = i\omega A_2 \rho^2 \cos 2\phi - \sum_m k_m a_m J_2(k_m \rho) \cos 2\phi = 0. \tag{88}$$

Now the functions $J_2(k_m \rho)$ are mutually orthogonal in the sense that $$\int_0^a \rho J_2(k_m \rho) J_2(k_{m'} \rho) d\rho = 0 \tag{89}$$

if $k_m \neq k_{m'}$ that is $m \neq m'$. The coefficient $a_m$ is calculated as $$a_m = \frac{i\omega A_2 \int_0^a \rho^3 J_2(k_m \rho) d\rho}{k_m \int_0^a \rho J_2^2(k_m \rho) d\rho} \tag{90}$$

so that $E_z=0$ at the ends of the cylinder.

Inside the cylinder the radial component is $$E_{2\rho}^V = -\sum_m a_m \frac{\sinh(k_m z)}{\cosh(k_m l)} \frac{\partial J_2(k_m \rho)}{\partial \rho} \cos 2\phi. \quad (91)$$

This vanishes at the curved surface of the cylinder, but it does not vanish at the ends. $V_2$ contributes to the $\phi$-component of the electric field inside the cylinder $$E_{2\rho}^V = -\sum_m a_m \frac{\sinh(k_m z)}{\cosh(k_m l)} J_2(k_m \rho) \sin 2\phi. \quad (92)$$

The electric field in the z-direction is $$E_{2z}^V(z) = \sum_m k_m a_m \left(1 - \frac{\cosh(k_m z)}{\cosh(k_m l)}\right) J_2(k_m \rho) \cos 2\phi = 0. \quad (93)$$

The transverse $E_2^V$-field components give contributions to the electric field which are largest near the ends of the cylinder. Well away from the ends the contribution is very small because $k_m l$ is much larger than one, so that terms such as $\sinh(k_m z)/\cos h(k_m l)$ are very small. The electric field away from the ends of the cylinder is to an excellent approximation $$E_2 \approx \text{ki}\omega A_2 \rho^2 \cos(2\phi) \quad (94)$$

which corresponds to the case when $\alpha_2 = 0$.

The coefficients $a_m$ can also be left as free parameters to be varied. For example, if $A_{2z}(z)$ varies significantly with z the parameters $a_m$ can be adjusted to reduce the variation of $E_2(z) = E_2^V(z) + E_2^A(z)$ with z.

To reiterate, then, by suitable choice of $a_m$ the $E_{2z}^V(z)$ component of field can be made to vanish at the patient cylinder ends. By suitable choiced of $k_m$ the radial component $E_{2\rho}^V(\rho)$ can be made to vanish at the patient cylinder surface.

Figure 22A:
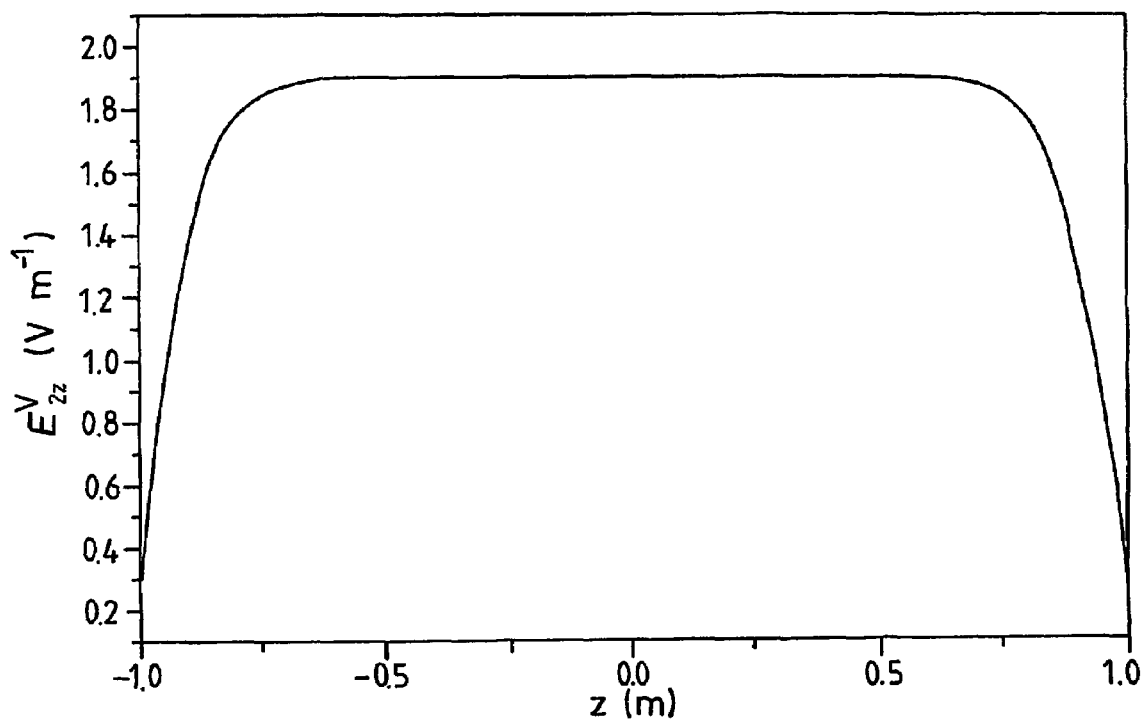
Figure 22B:
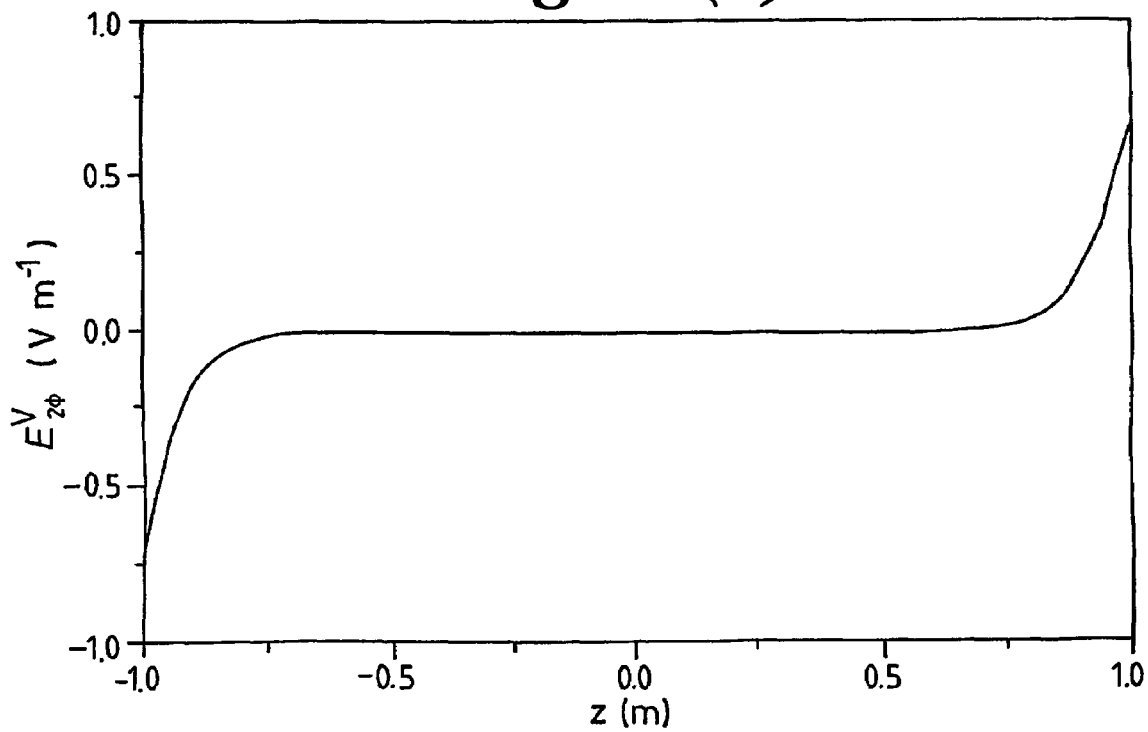

With these conditions the $E_2^V$-field components of Eq.(86) namely $E_{2z}^V(z)$, Eq.(93) and $E_{2\phi}^V(z)$, Eq.(92) are plotted in FIGS. 22A and B respectively for a gradient switching rate of 100 T m$^{-1}$ s$^{-1}$.

In curve (A) we choose $\phi=0$ to maximise the electric field. In curve (B) $\phi=\pi/4$ maximises the electric field which is apparent at each end of the patient cylinder only. All results are plotted for $\rho=a$ and for the first 2 modes only. Because of the rapidly convergent nature of the series, higher modes are ignored.

Harmonic solutions of Laplace's equation exist, for example the scalar potential $$V_2 = \sum_n b_n I_2(k_n \rho) \cos(2\phi) \sin(k_n z) \quad (95)$$

satisfies $\nabla^2 V=0$ if $I_2(k_n \rho)$ is a modified Bessel function and $b_n$ are adjustable coefficients. The quantities $k_n$ could be determined for example by the condition that the derivative $\partial V_2/\partial z = 0$ at the ends of the cylinder. Using these potential functions, exotic arrangements can be found in which V varies in some complex manner along z.

It is worthwhile considering in some detail the application of Eq. (95) to two specific cases of interest. In case (i) we take one term in the expansion, namely $$V_2 = bI_2(k\rho) \cos(2\phi) \sin(kz) \quad (96)$$

where $b=K'_2/k$ and $k=\pi/2l$. Using the approximation $I_2(k\rho) \approx k^2\rho^2/8$ we obtain $$V_2 = \frac{K_2 k^2 \rho^2}{8k} \cos(2\phi) \sin(kz) \quad (97)$$

In the limit that kz is also small the potential $V_2$ should reduce to the simple form of Eq. (84) in order to properly compare $E_2$-fields generated from different forms of $V_2$. Taking the gradient of $V_2$ and with $K_2=K'_2 k^2/8$ we obtain the modulus of the total $E_2$-field $$|E_2| = \frac{2}{k} \rho \omega A_2 \sqrt{\alpha_2^2 \sin^2 kz + \frac{k^2 \rho^2}{4} \cos^2(2\phi)[\cos(kz) - \alpha_2]^2}. \quad (98)$$

The graph of $|E_2|$ versus z is plotted in FIG. 23 curve B for $\phi=0, \rho=0.2, k=\pi/2$ and $\alpha_2=1$ and shows a central region where $|E_2| \leq 5.25$ V m$^{-1}$ for $-0.3 \leq z \leq 0.3$. This compares well with the simpler case where $V_2$ is given by Eq. (84), curve A of FIG. 23, but is a slight improvement for the region $0.3 < |z| \leq 1$.

In case (ii) we take $V_2$ given by Eq. (95) when n=1,3 and 5 only. In this case we take $b_n = K'_2 k^2 a_n/k_n^3$ where the terms $a_n$ are Fourier series coefficients given by $$a_n = \frac{4p}{n^2 \pi^2} \sin(n\pi/2) \cos\left(\frac{n\pi(p-2)}{2p}\right) \quad (99)$$

chosen in a cosine series to produce a trapezoidal wave modulation along the z-axis and in which l/p defines the edge rise of the trapezoid and p is an integer. In our case we choose p=7 which means that the first three odd coefficient terms give a good representation of the waveform. The term $a_7=0$. With these provisions and approximating $I_2$ we have $$V_2 = K_2 \sum_{n=1,3,5} a_n \frac{k_n^2 \rho^2 k^2}{8k_n^3} \cos(2\phi) \sin(k_n z) \quad (100)$$

$$= K_2 \frac{k^2 \rho^2}{8} \cos(2\phi) f_1(z)$$

where $$f_1(z) = \sum_{n=1,3,5} a_n \frac{\sin(k_n z + n\gamma')}{k_n} = \frac{f_1^0(z)}{k}. \quad (101)$$

and where $$f_2(z) = \sum_{n=1,3,5} a_n \cos(k_n z + n\gamma'). \quad (102)$$

in which we have introduced phase shifts $n\gamma'$ in order to satisfy the boundary conditions at the cylinder ends. Here $\gamma'=\pi/2$. Using these expressions together with $K_2=K'_2 k^2/8$ we obtain for $|E_2|$, $$|E_2| = \omega A_2 \rho^2 \frac{2}{k\rho} \sqrt{(\alpha_2 f_1^0)^2 + \frac{k^2 \rho^2}{4} \cos^2(2\phi)[f_2 - \alpha_2]^2}. \quad (103)$$

The graphs $|E_2|$ versus z are plotted with $k=3\pi/2$ and $k=5\pi/2$ as curves C and E respectively in the composite graph of FIG. 23. Also plotted are curves B and D which are our previous results, Eq. (98) with $k=\pi/2$ and $k=5\pi/2$, while curve A corresponds to our simplest solution of Laplace's equation, Eq. (85). In all five cases we have chosen $\alpha_2=1$. On our composite graph we also draw the line $|E_2|=5.25$ V m$^{-1}$ which corresponds to the maximum $E_2$-field for the BB gradient coil. Except for the central region it is noticed that both curves B and C exceed 5.25 V m$^{-1}$. In curve C we have arranged matters so that there are two regions along the z-axis corresponding to $z=\pm 0.666$ m where discs of thickness$\approx$40 cm exist in which the field is nowhere greater than 3.5 V m$^{-1}$. It will be obvious to the reader that these regions can be moved by choosing the boundary conditions so that they correspond to the mediastinum in a patient lying along the z-axis. The relatively small price paid for this is that the electric field increases in the region $z=\pm 0.3$ m. However, for curves D and E nowhere within the patient cylinder does the $E_2$-field reach the maximum value of $|E_2|=5.25$ V m$^{-1}$. Indeed the maximum $E_2$-field is 3.5 V m$^{-1}$ and the minima (dropping to zero) occur at two or three places along the z-axis. By choosing the value of k, these discs of low $E_2$-field can be shifted to coincide with sensitive regions within the body.

We note in passing that for both Eqs. (98) and (103) as k increases the $|E_2|$ fields become independent of k at around $k=5\pi/2$. At this point the approximation used for $I_2(k\rho)$ has an error of 18%. Further increases in $k\rho$ necessitate a different approximation. The $\cos 2\phi$ term becomes dominant in both equations. Furthermore, the peak amplitude of these terms in this limit becomes $2|E_2^A|$. The implication of this result is that while $|E_2^A| \approx \frac{1}{3}$ of the BB result, when tessellae are included, the best result achievable is $\frac{2}{3}$ of the BB result. That is to say with the new coils we can either operate at 1.5 times the gradient strength or 1.5 faster in this approximation.

Figure 24A:
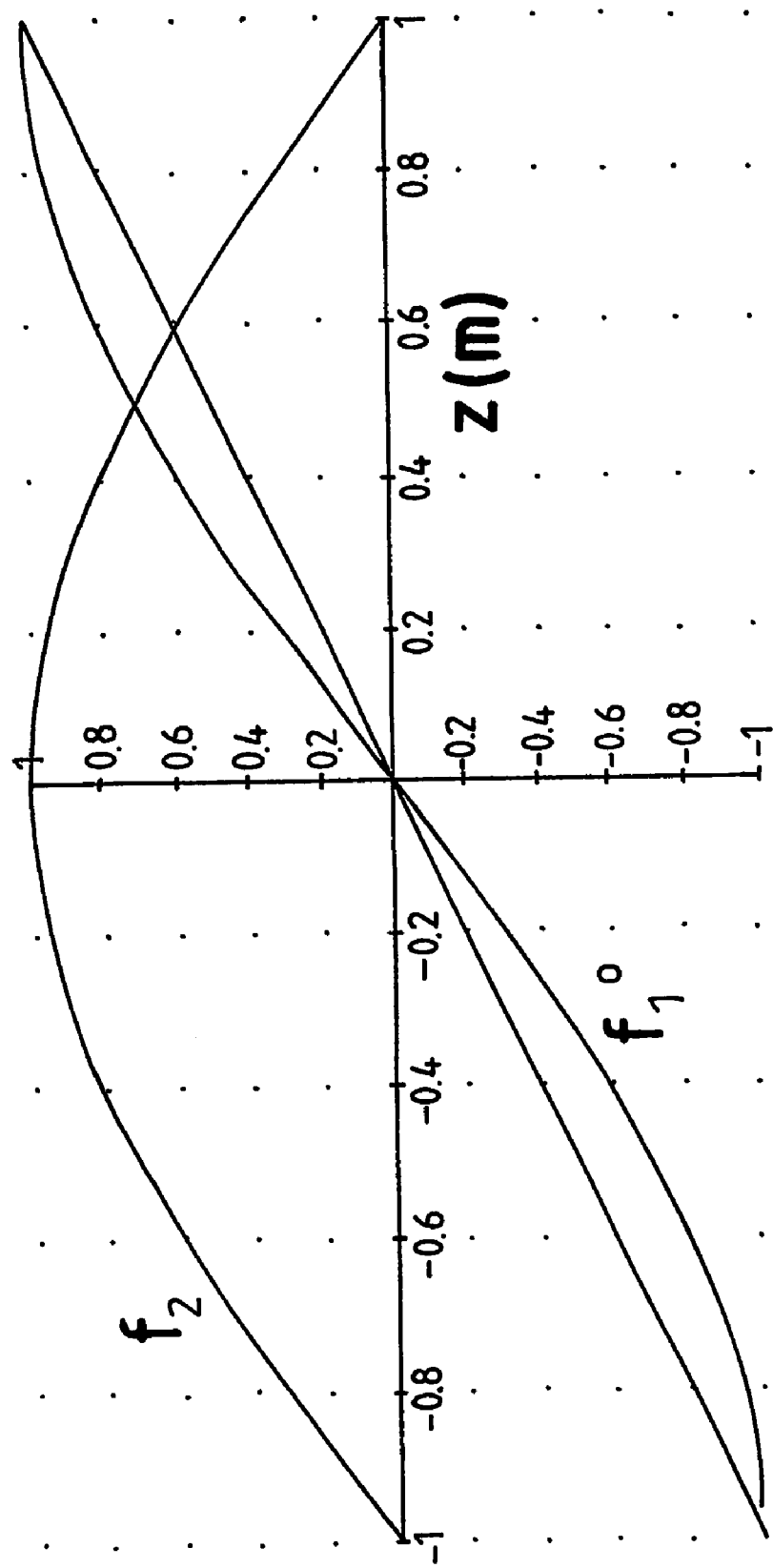
Figure 24B:
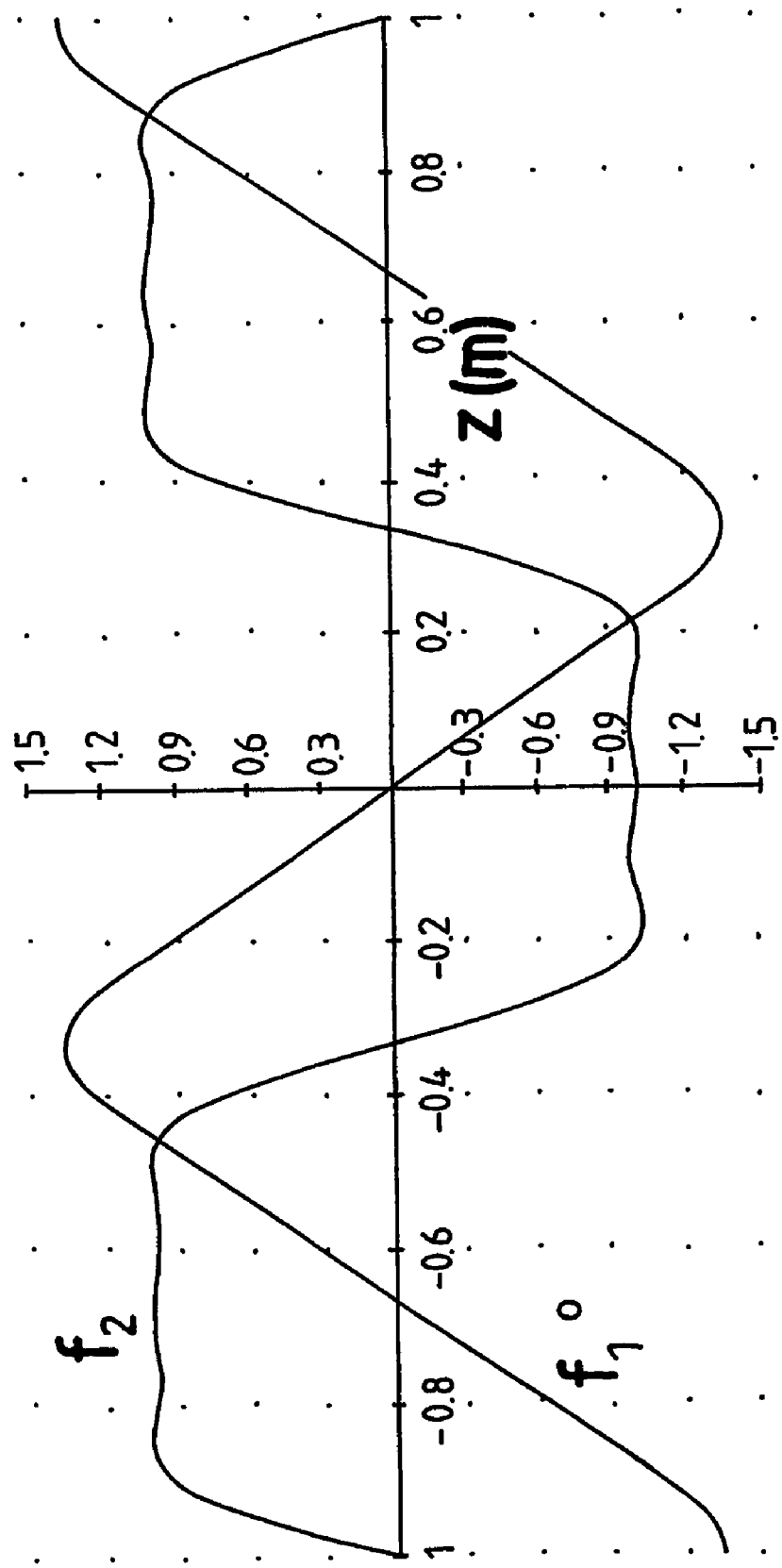

We also show the $E_2$-field modulation functions required to produce the results of the composite graph, FIG. 23. These are plotted in FIGS. 24A and B. In both cases $f_2(z)$ corresponds to the $E_{2z}$ variation along the z-axis and $f_1^0(z)$ is the amplitude modulation required to be applied to the transverse $E_2$-field solutions of Laplace's equation. FIG. 24A corresponds to curve B in FIG. 23 while FIG. 24B corresponds to curve C in FIG. 23. It is emphasised that these solutions require the use of tessellae and/or the hyperbolic electrodes described above forcing the required transverse modulations.

Another way of achieving the required variation of V(z) is to treat the gradient assembly of patient cylinder and end plates as a cavity resonator provided the resonance frequency is low enough. This implies that the only practical solutions to Laplace's equation for human whole body gradients are either the ones already considered which are, in effect, d.c. solutions or those using Eq. (82) but with a much increased cavity or gradient coil length, typically by a factor 10. This would bring down the frequency of the fundamental sin kz mode to around 7.5 kHz, a frequency much more acceptable for gradient modulation.

11. MODIFIED DISTRIBUTED CURRENT FINGERPRINT COILS

The analysis so far has stressed the use of straight wires in order to achieve ideally uniform straight regions of the vector potential $A_z$ which are substantially independent of z. This approach necessitates a design of transverse gradient coil which is completely different to the standard magnetically screened fingerprint coil which has been pretty well universally adopted by the MRI industry. The question arises, therefore, whether the fingerprint design can be adapted in such a way as to allow the approach of reducing the E-field developed in this Patent to be applied. It would seem that the standard fingerprint design comprising a primary coil wound on a cylinder of radius a and an active magnetic screen wound on a second cylinder of radius b, whilst satisfying the constraints that the magnetic field inside the primary coil produces the desired gradient performance and the magnetic field outside the screen is zero, the vector potential along the coil axis is non-zero. In the coordinate system that we have used previously we define the coil axis as lying along the y-direction, the external magnetic field $B_{yo}$ also lies along the y-axis.

However, it does seem possible to design a set of distributed current fingerprint coils comprising at least three concentric cylinders of radii a, the primary coil, b, an intermediate coil and c, the outer screening coil with the constraints that the magnetic field, $b_y$, from the coil is zero for $\rho>c$, such that for $\rho \leq a$ the magnetic field is the desired gradient and also $A_y$ is zero. The residual electric field inside the patient can then be reduced by placing tessellae around the patient with appropriate voltages applied.

An alternative arrangement of screened arcuate coils may be used instead of the above distributed coil arrangement. The coils can be made from an inner arcuate coil set of radii a and b screened by an outer arcuate set of radii c and d. In this arrangement $b_y=0$ for $\rho>d$ while for $\rho<a$ the magnetic field is the desired gradient together with the constraint that $A_y=0$.

Figure 32A:
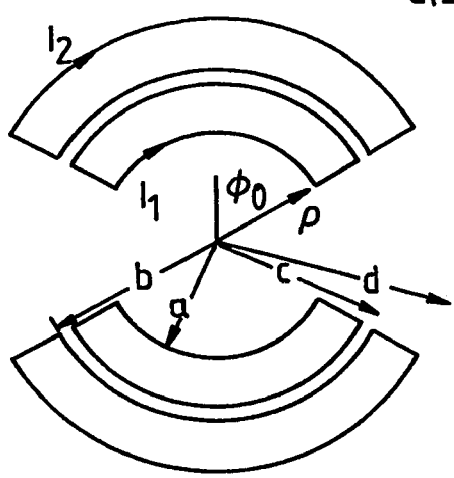
Figure 32B:
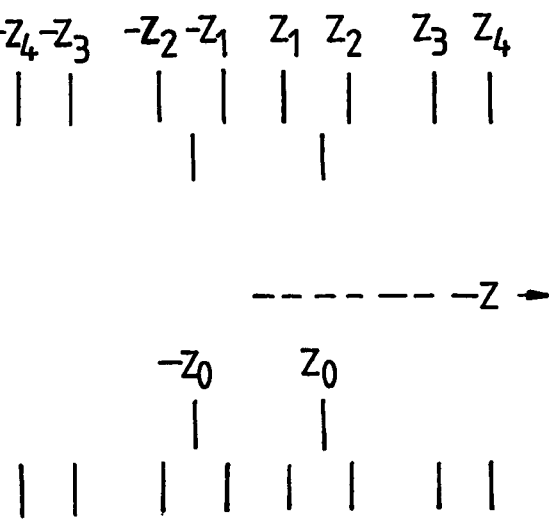

11.1 Magnetically Screened Closed Loop Arcuate Transverse Gradient Coil using a Distribution of Closed Loop Arcuate Coils Consider a simple 4-sector closed loop arcuate primary gradient coil of inner and outer radii a, b respectively and angle $\phi_0=\pm\pi/3$, each sector pair being placed along the z-axis at $\pm z_0$, see FIG. 32. NB In this section we revert the the more common coordinate system where the z-axis corresponds to the coil cylindrical axis and also coincides with the external static magnetic field direction, $B_{z0}$. The primary coil is magnetically screened with a discrete spatial distribution along the z-axis, c(z), of closed loop arcuate coils all of inner and outer radii c and d respectively such that for $\rho>d$, $b_z=0$, we must ensure that the expression $$2G_m^{(1)}(k)\cos(kz_1) + C_m(k)G_m^{(2)}(k) = 0 \quad (104)$$

holds for all m, where m refers to the mth order azimuthal angle harmonic and where the superscripts 1 and 2 refer to the inner and outer arcuate coils respectively and where $C_m(k)$ is the Fourier transform of the distribution c(z). The terms $G_m^{(1)}(k)$ and $G_m^{(2)}(k)$ are given by $$G_m^{(1)}(k) = \frac{I_1 k}{m\pi}\sin(\pi m/3)(1-\cos(m\pi))\int_a^b \rho' I_m(k\rho')d\rho'; \quad (105)$$

$$G_m^{(2)}(k) = \frac{I_2 k}{m\pi}\sin(\pi m/3)(1-\cos(m\pi))\int_c^d \rho' I_m(k\rho')d\rho'. \quad (106)$$

in which $I_1$ is the current in the inner coils and $I_2$ that in the outer coils and $I_m(k\rho)$ is the modified Bessel function of the first kind. The screening is optimised if the arcuate coils are designed so that only the $m=\pm 1$ terms are important. It is pointed out that the vector potential A has a z-component which is automatically zero, and that the remaining components generate the gradient field, $b_z$.

It is emphasised out that while we have used as an example the case where $I_2$ is constant for all screening coils and the spacing between the coils is varied, one can equally well take a situation where $I_2$ varies from coil to coil and the spacing between the coils is kept constant.

It is also emphasised that, while we have used as an example the case of two arcuate coils placed at $\pm z_0$, for the primary or inner gradient coil, a distribution of closed loop arcuate coils could equally well be arranged with suitable spacing at positions along the z-axis.

11.2 Magnetically Screened Transverse Gradient "Fingerprint" Coils

Figure 33A:
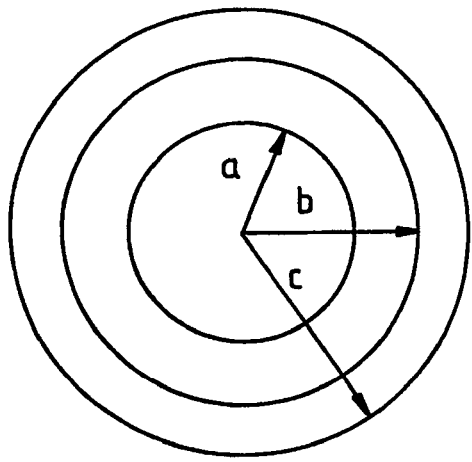
Figure 33B:
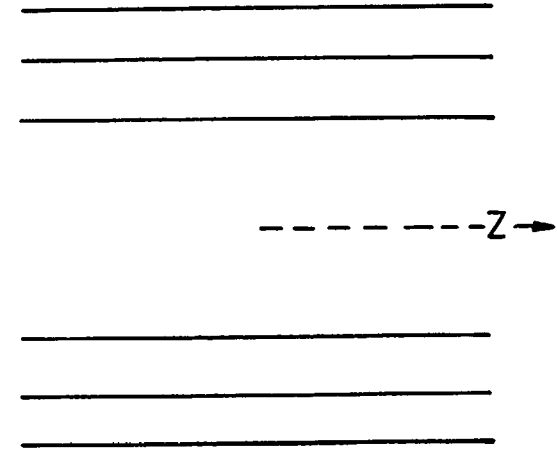

For a transverse gradient coil comprising three distributed current or "fingerprint" coils of radii a, b and c with c>b>a, see FIG. 33, we require that $b_z=0$ for $\rho>c$ and for $\rho<a$, $A_z=0$ together with a non-zero gradient field. All three conditions can be met if two expressions can be satisfied simultaneously, namely:

$$f_\phi^m(k)kaI'_m(ka)+F_\phi^m(k)kbI'_m(kb)+F_\phi^m(k)kcI'_m(kc)=0, \quad (107)$$

$$af_z^m(k)K_m(ka)+bF_z^m(k)K_m(kb)+cF_z^m(k)K_m(kc)=0. \quad (108)$$

where $f_\phi^m(k)$, $F_\phi^m(k)$ are Fourier transforms of the $\phi$-component of current in the inner and intermediate coils respectively derived from the continuity expression and $\mathfrak{S}_\phi^m(k)$ is the Fourier transform of the $\phi$-component of the current in the outer coil. $I_m(k\rho)$ and $K_m(k\rho)$ are the modified Bessel functions of the first kind and the prime denotes a derivative with respect to $k_\rho$. Similarly, $f_z^m(k)$, $F_z^m(k)$ are the corresponding Fourier transforms of the z-component of current in the inner and intermediate coils respectively derived from the continuity expression and $\mathfrak{S}_z^m(k)$ is the Fourier transform of the z-component of the current in the outer coil.

11.3 Magnetically Screened Hybrid Transverse Gradient Coil

Figure 34A:
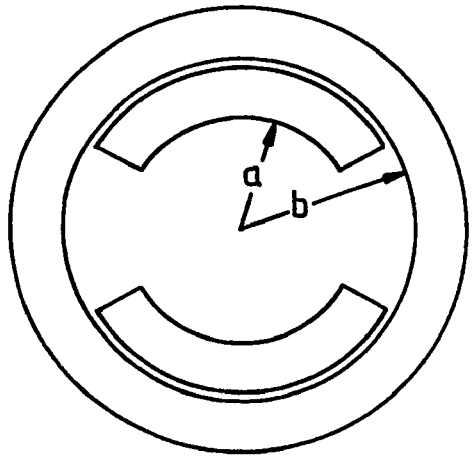
Figure 34B:
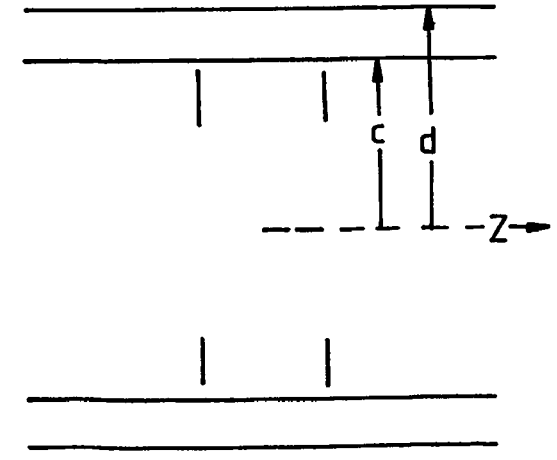

Finally, for a hybrid transverse gradient coil comprising an inner closed loop arcuate coil with radii a and b where a<b screened by two "fingerprint" coils of radii c and d such that b<c<d, see FIG. 34, then the magnetic field $b_z^m$ can be made to vanish for $\rho>d$ if $$[2G_m^{(1)}(k)\cos(kz_1)=-F_\phi^m(k)kbI'_m(kb)-F_\phi^m(k)kcI'_m(kc)]. \quad (109)$$

For $\rho<a$ we require $A_z=0$. Only the "fingerprint" coils contribute to $A_z$ so that the condition to be satisfied is $$\mathcal{F}_z^m(k) = -F_z^m(k)\frac{bK_m(kb)}{cK_m(kc)}. \quad (110)$$

Equations (109) and (110) can be combined to produce a perfect magnetically screened transverse gradient coil with $A_z=0$.

12. THE INVENTION

Figure 25A:
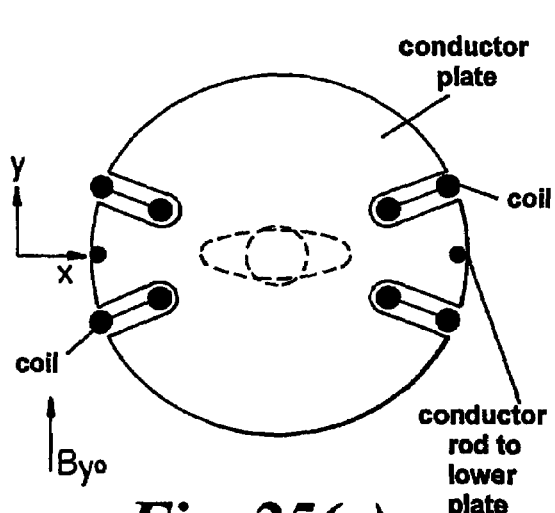
Figure 25B:
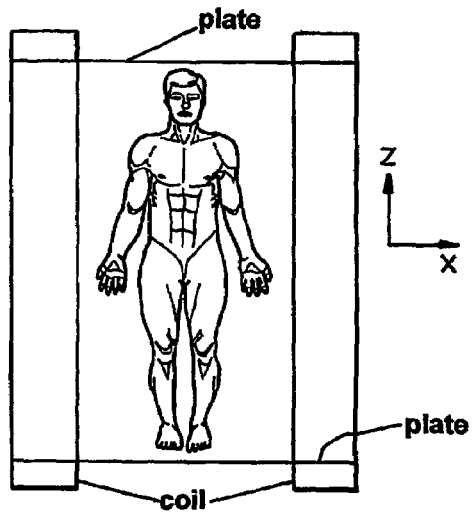
Figure 25C:
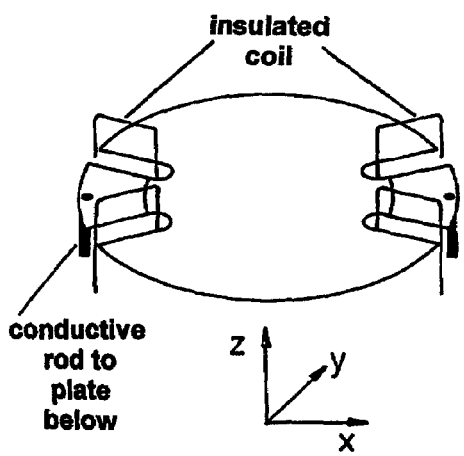
Figure 25D:
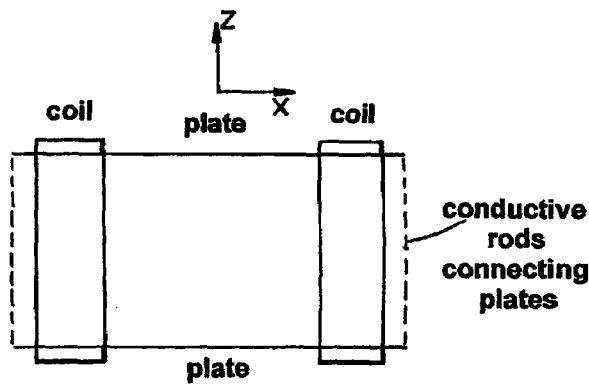
Figure 25E:
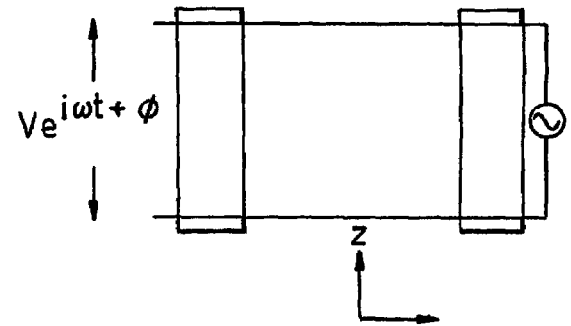

The basic idea in this invention is to remove the constant term $A_0$ from the vector potential in a coil arrangement comprising four straight wires. A plan view of the conductor arrangement is shown in FIG. 25A. In this figure return paths are also shown, each one lying in a plane to the centre of the coil, making an angle of $\pm\pi/8$ with the x-axis. An alternative return path for the wires is one where the forward and return paths for each coil quadrant lie in a plane parallel to the x-axis. This would be useful in reducing acoustic noise as well. In addition to the coil wires there is also a pair of conductor plates with slots suitably placed to insulate the plate from the coil structure. FIG. 25B shows the front elevation with a person standing between the coil plates. The two plates top and bottom are connected via a highly conductive rod. FIG. 25A shows two such rods symmetrically placed about the central position, each lying on the x-axis. FIG. 25C shows the top section of the coil arrangement with one plate and indicates how the wires in the coil would pass through the plate allowing the conductor plate/s to be adjusted above and below the patient. FIG. 25D is a sketch of the coil assembly with plates top and bottom in position and conductive rods connecting the two plates.

In a second embodiment the parallel plates of FIGS. 25A to D are now connected by an active voltage generator producing a voltage $Ve^i(\omega t+\phi)$ where the phase $\phi$ is adjustable. In both the above embodiments an electric potential is created across the pair of plates producing an electric field which is equal and opposite to that generated in the first instance by the gradient coil arrangement. In a transient waveform such as the step function described previously the applied voltage in the second embodiment would be adjusted so as to prevent charge build-up on the patient and, therefore, prevent very large initial transient current densities, $j_z$.

Figure 26B:
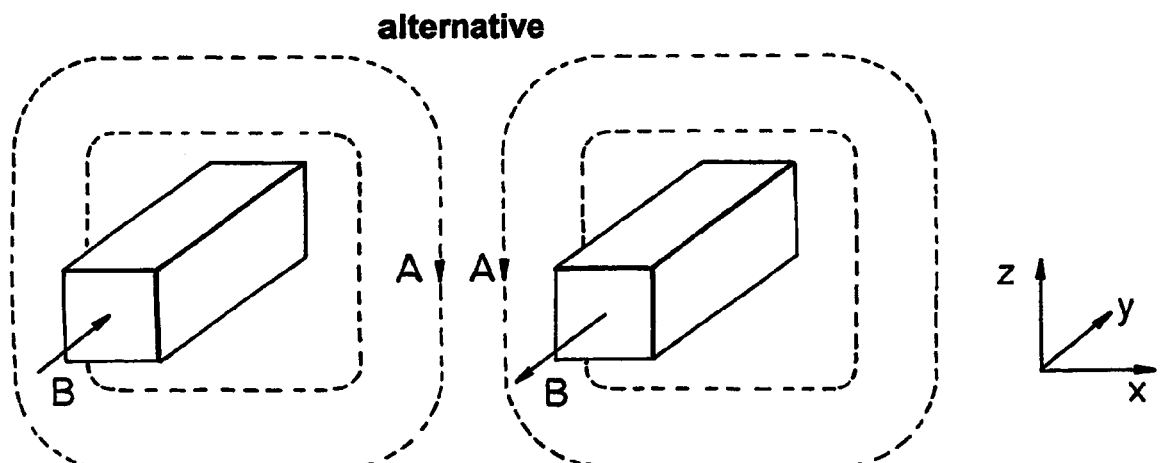

In a third embodiment the object of the invention is to produce directly an equal and opposite vector potential cancelling out $A_o$ produced by the gradient coil assembly. In this embodiment the vector potential is generated using the principle that long solenoids will create a vector potential external to the solenoid even though the magnetic field external to that solenoid, B=0. Such a simple arrangement is sketched in FIG. 26A and shows that two solenoids running parallel to each other but with opposite magnetic fields, will produce a vector potential at the centre with a slight parabolic dependence. However, this effect could be made arbitrarily small by placing the solenoids sufficiently far apart. An alternative solenoidal arrangement is to use rectangular section solenoids as sketched in FIG. 26B. A problem with either solenoidal arrangement is that the solenoid should ideally be infinitely long. This is clearly impractical and an alternative arrangement is to use toroidal coils. One possibility is to use a rectangular toroid with a rectangular coil cross-section. Another possibility is to use a circular toroid with a circular coil cross-section. However, toroidal coil arrangements could be made in the form of a rectangular toroid with a circular coil cross-section etc. mutatis mutandis.

In a further embodiment which relates to our first embodiment, FIG. 25, the parallel plate arrangement described in FIG. 25 is made in the form of a mosaic array of insulated conducting tiles, or tessellae. This is sketched in FIG. 27A. In FIG. 27B we show that corresponding tiles in the upper plate connect via good conductors to the corresponding tiles in the array below, that is to say i connects to i', k connects to k' etc. These connections are passive arrangements and the purpose of them is similar to the continuous plate arrangement of FIG. 25A in that large constant terms in the vector potential, $A_o$, may be removed in the patient region, but in addition regions where A varies may also be affected since charge redistribution on the mosaic array is forbidden.

In an alternative arrangement to FIG. 27B we now describe an active version of this in which each element p,q, in the array in the top plate is coupled to each corresponding element p',q', of the lower plate via active voltage generators producing voltages $V_p \exp i(\omega t + \phi_p)$, $V_q \exp i(\omega t + \phi_q)$, etc. In this arrangement of individual voltage generators it is envisaged that the phases $\phi_p$, $\phi_q$ may be appropriately adjusted to produce the desired modification of the vector potential extant over the patient.

While most of the invention concerns gradient coils produced from an array of long straight wires, there seems to be a useful application of the invention in connection with the generation of transverse gradients $G_x$ or $G_y$ as produced by either a standard saddle or Golay transverse gradient coil, or by a distributed wire "fingerprint" coil. A simple saddle coil arrangement is sketched in FIG. 28A which would produce a transverse gradient $G_x$. If a patient were placed in the coil system with the head in the ROI, between the four inner wires as sketched in FIG. 28B, rapid switching of the transverse gradient would result in charge build-up on the patient's head, giving rise to potentially large transient currents within the brain. In FIG. 28C, however, plates are introduced above and below the head and may be connected or driven by any one of the above described embodiments to reduce both $A_o$ and transient currents, $j_z$, within the head only. FIG. 28C shows an axial view of the coil arrangement where both $G_x$ and $G_y$ transverse gradients are used together with the $A^o{}_y$ and $A^o{}_x$ plates. In this arrangement the additional plates which could be striated are parallel to the magnetic fields $B^o{}_y$ and $b_y(x)$ and $b_y(y)$, thereby producing no significant interaction with the magnetic fields.

Returning now to the long straight parallel wires; our calculations show that the parallel wire arrangement produces a vector potential A(z) which varies along the z-axis dropping to about 60% of the value at the coil centre at each end of the coil. This means that in order to maintain $A_o$ constant and therefore cancel over the length of a patient, the coil itself must be between 1½ and 2 times the length of the patient. However, if the diameter of the wire cage arrangement is reduced progressively at each end of the coil arrangement, as shown in FIG. 29A, the vector potential can be affected and the region where A is constant extended as shown in FIG. 29B. FIG. 29A shows two inner wires of a 4-wire coil. No return paths are shown. However, if return wires are introduced as in FIG. 29C they too may follow the contours of the inner wires. Two versions of the end correction arrangement are shown: (1) where the wire cage diameter is stepped from the original diameter through 2 or 3 steps to the final diameter, and (2) where the wire cage diameter follows a continuous mean curve or equivalent wire path. Stepping the wires in rectangular steps has the advantage that the wires are always parallel and, therefore, amenable to noise reduction using active acoustic control (P. Mansfield and B. Haywood, Principles of Active Acoustic Control in Gradient Coil Design, MAGMA, 147-151 (2000)). Other shapes of equivalent wire path are possible but might be harder to compensate acoustically.

It would clearly be preferable to make the coil wires longer in order to make $A_0(z)$ constant and independent of z. However, when this is impractical we propose that variations in $A_0(z)$ be compensated electrostatically as outlined in §8. This has the added advantage that no additional z variation is introduced into $E_2{}^A$. Alternatively end shims may be used to increase the current in the gradient coil at each end.

In our calculations and theoretical description of the invention so far we have assumed implicitly that the A(r) field produced by the gradient coil is straight and parallel to the z-axis. We have also assumed that the E-field generated by the plate arrangements to compensate for A(r) is everywhere straight and parallel to the z-axis. If the plate spacing is ~2 m and the diameter of the plate is ~1 m, bowing of the E-field will occur, thereby vitiating to some extent the compensation process. In a further embodiment we introduce a series of rings or bands of conductive material which circumscribe the subject and which are placed strategically as guard rings to prevent E-field bowing. The rings may be split or cut so as to prevent induced circulating currents from flowing in cases where stray magnetic flux may couple. It may also be advantageous to earth the rings with a single earth wire running parallel to the z-axis, or to join them to the wire connecting the plates.

Figure 30A:
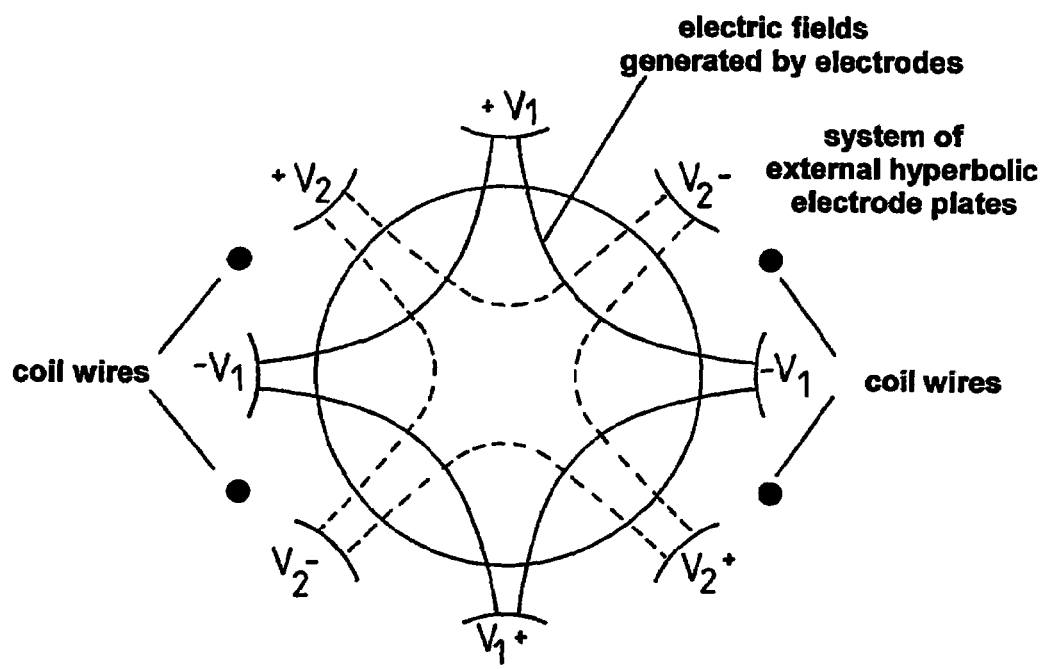
Figure 30B:
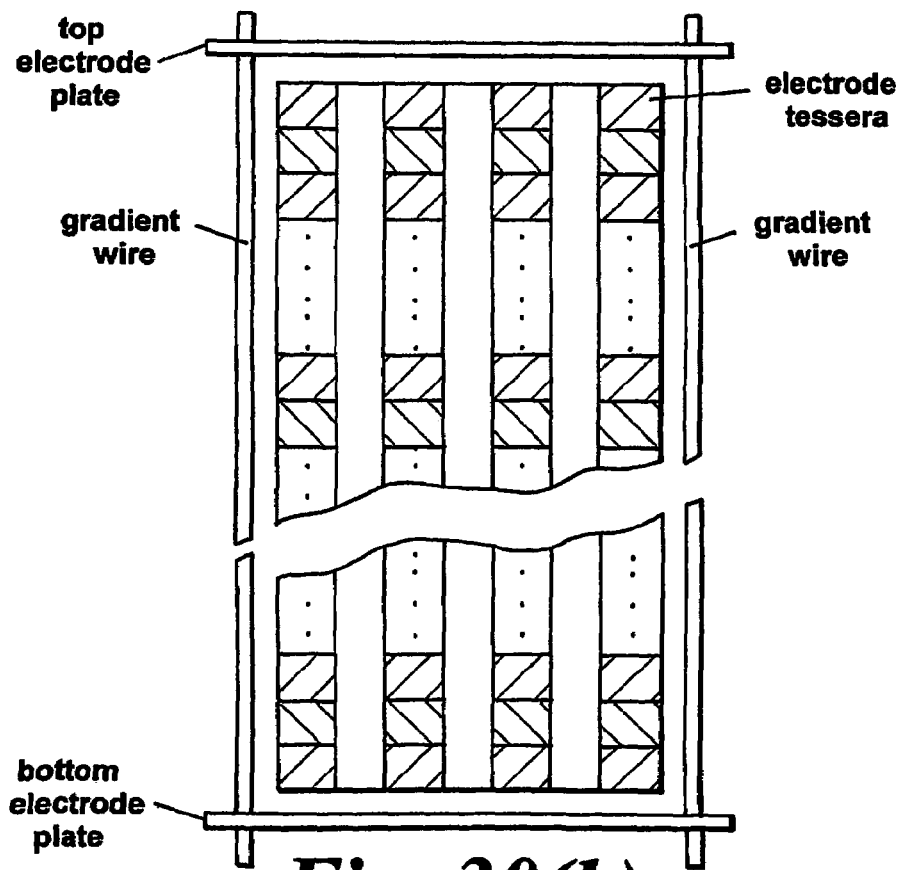

In a further embodiment introduced to reduce the induced transverse E-fields we envisage at least 2 sets of hyperbolic electrodes each set corresponding to one of the two transverse E-field solutions of Laplace's equation, see FIG. 21(a), placed circumferentially about the equivalent patient cylinder, see FIG. 30. These electrodes may each be formed from an array of tessellae stacked contiguously (but insulated from each other) along the z-axis. The object of the arrays is to allow a z-variation of the transverse electric fields generated in order to properly annul or control the transverse E-fields at all positions around and along the patient equivalent cylinder. A properly driven set of electrodes could render the guard ring arrangement described above redundant.

We stress that the hyperbolic electrodes described above are by way of an example. The plates may be flat tesserae or tessellae, or cylindrically shaped to have a convex or concave surface, or be mixtures of variously shaped tessellae depending on the boundary conditions.

In all arrangements of tessellae or electrodes we stress that the tile-like plates are themselves made in striated form from a series of thin parallel strips of copper stuck to a supporting non-conductive surface, the strips being connected to a common conductor along one edge of the support plate. Alternatively the striations may be formed by a flat sheet of insulated parallel wires connected along one edge. The purpose of this arrangement is to ensure that (a) all parts of a given tile are at the required electrostatic potential and (b) that transient magnetic fields can pass freely through the tile striations without distortion.

In an alternative embodiment all tessellae and electrodes may be made from very thin conductor sheet such that the sheet thickness is very much less than the magnetic field penetration depth.

In further embodiments we visualise that the gap between the patient equivalent cylinder and an actual patient be filled with a suitable fluid having the correct values of permittivity and conductivity to match the average body characteristics. The actual fluid would not, of course, come into contact with the patient but be isolated from the patient using a pre-formed rubber or other thin membrane in such a way that there were no sizeable air gaps between the outer tessellae and the patient. The fluid referred to above could be contained in a cylindrical annular bag which slipped over the patient before entry into the coil system, or alternatively could be contained in long strip-like bags running the full length of the coil system and packed around the patient when in position. Circular fluid-filled pillows placed above the head and below the feet would fill air gaps top and bottom and could form a permanent part of the upper and lower plates.

In an alternative version we envisage an elliptical cross-section cylinder surrounding the patient in which the gaps between the tessellae array on the surface of the elliptical cylinder were on average closer to the patient than in the circular equivalent patient cylinder described above. Again any substantial air gaps could be taken out by a suitable fluid, as described, contained in a soft rubber-lined bag which could deform to remove substantial air gaps between the outer elliptic cylinder and the patient surface. The circular pillows described above could now be elliptic and also form part of this alternative embodiment.

A further alternative arrangement would be to have the patient wear a non-conductive suit on the surface of which are attached the tessellae array. Wires connecting the individual tessellae could be taken away in a cableform connected to a matrix array of voltages to drive the suit to satisfy the required boundary conditions. If the suit were reasonably tight-fitting this arrangement would obviate the need for additional fluid as described above. In all cases previously described the tessellae could be in the form of circular discs or triangular plates, or other shapes best suited for the particular application and for the particular boundary conditions necessary.

In yet a further embodiment we envision how our novel method of electric field control can be applied in combination with a relatively short gradient coil set. The coil set comprising a plurality of rectangular closed current loops or arcuate shaped current loops as in FIGS. 31A, B and 31D would be designed specifically to produce a uniform gradient field along all three axes, x,y,z, over a restricted region. In the first instance the restricted region could be a head in which an arrangement of tessellated plates is introduced within the coil spanning the head region, FIGS. 31B and 31D, but in which there are added tessellated electrode arrays outside the coil system. These are designed in such a way as to protect those parts of the body which are sensitive to induced currents produced by external time-dependent magnetic fields which, depending on the design details of the coil arrangement, can produce electric fields which are one half or more of the electric field produced within the head plate arrangement.

Although we have described what is essentially a head coil system the same principle could be applied to restricted regions of the body within the torso, but here it would be necessary to have body tessellae as indicated in FIG. 31C symmetrically placed either side of the gradient coil rather than as indicated on one side only of the gradient coil assembly. Such a balanced electric field control arrangement would then allow all parts of the body to be examined but with very much reduced electric fields produced in any part of the body and, therefore, with much reduced induced current with concomitant lessening of the risk of inducing undesirable physiological interactions.

As discussed previously, with a fixed tessellae array covering body and head, it would be necessary to 'match' the electric field produced by the tessellae electrodes by filling the gaps between the body and the tessellae array with a suitable fluid or material with electrical characteristics chosen to match the average characteristics of the body with regard to resistivity and permittivity. As stated elsewhere, such material could be contained in deformable pillows or bags filled with the chosen fluid or indeed filled with beads of suitable material in the manner of a beanbag.

The arcuate form of the gradient coil arrangement would be magnetically more efficient at producing the required gradient and would allow greater access to accept the subject for whole-body examination. However, it would be important to maintain the vector potential over the subject volume as parallel straight lines. This might require the simple arcs described to be corrected with shimming coils in the manner of FIG. 20 to ensure that the vector potential, although deriving from a curved wire, was straight and parallel throughout the volume of the subject under examination. This would then provide the maximum protection against large induced currents using our tessellated electrode arrangement.

Even if the vector potential is straight and parallel, variation of the magnitude along the z-axis will give rise to an electric field component along z. To counter this effect the region of uniform gradient could be extended by making the coil set longer, thereby relegating the coil 'end effects' to less sensitive regions of the anatomy. An alternative approach would be to add extra coil windings outside the main gradient coil so as to maintain the external vector potential constant.

Further embodiments are concerned with cylindrical geometry coils of the distributed arc or of the distributed current fingerprint design. The common feature in both types of coil is that as well as producing the desired gradient within the primary section of the coil and zero magnetic field outside the outer screen, the component of the vector potential along the cylindrical axis is also made to be substantially zero. In the distributed arc version the primary coil is made of closed arc loops around which are a further set of closed arc loops concentric with the first set of closed arc loops. In the distributed current or fingerprint design the vector potential along the coil axis is made substantially zero by the introduction of a third coil wound on a concentric cylinder placed between the primary coil cylinder and the outer magnetic screen cylinder. The constraint that the component of the vector potential along the primary cylinder is substantially zero inhibits circulatory or closed loop currents from flowing within the patient.

A hybrid screen coil arrangement is also described in which the primary coil comprises a distribution of closed loop arcuate coils surrounded by two concentric cylindrical "fingerprint" coils, designed simultaneously to make both the external magnetic field outside the gradient coil assembly and the component of the vector potential along the cylindrical axis substantially zero.

PART 2

1.1 Passive Electric Field Screening

We represent the patient by a conductive cylinder of saline. A magnetic field gradient is generated by a coil that creates only a y-component of the vector potential. The electric field has two components: the part due to the rate of change of the vector potential A which we write as $E^A$ and a part due to the scalar potential V which is written as $E^V$.

$$\frac{\partial A}{\partial t} = E^V + E^A \tag{1}$$

The magnetic induction field is given by $B = \nabla \times A$. When a transverse magnetic induction field gradient is switched, $E^A$ is finite, an electric current flows across the cylinder and the surface of the conductive cylinder charges up. Eventually, the surface charge produces exactly the amount of $E^V$-field to back off most of the $E^A$ term produced by the A-field.

In our passive screen arrangement, additional highly conductive electrode plates are introduced, effectively sandwiching but not touching the conductive cylinder. By joining the pair of plates with a good conductor, we mimic the natural process described above that occurs in a bare cylinder. For a constant vector potential along the y-direction, this passive arrangement ensures that the average y-component of the electric field between the plates falls to zero.

For a vector potential needed to produce a transverse field gradient there is a residual electric field within the cylinder and much reduced currents and charges appear in and on it. To further reduce the currents additional conductive plates can be placed around the curved surface of the cylinder with the electric potential on the plates chosen so as to minimize the electric field in the cylinder. The wires connecting the extra plates are placed in such a way as not to affect the component of the electric field $E^A$.

The action described is similar to but not equal to a Faraday screen. In a Faraday screen the total electric field $E=E^V+E^A$ exists outside but not inside the screen. In our case the electric field is not screened completely for to do so would completely remove $E^A$, thereby removing the vector potential and therefore the transverse field gradient. The only part of the electric field which is modified is the part $E^V$.

1.2 Effect of E-field Reductions on Imaging Strategies

At the moment the safety agencies such as the FDA and NRPB, Revised Guidelines, Br. J.Radiol. 56, 974 (1983); see also NRPB Board Statement on Clinical MR Diagnostic Procedures, Vol.2, No.1 (1991), have laid down clinical operational guidelines concerning the rate of change of the gradient fields applied to patients undergoing MRI scans. These rates are derived from experimental observations that neural stimulation for both peripheral nerves and cardiac muscle occur at a threshold electric field of 6.2 V m$^{-1}$, corresponding to an induced current density of 1.2 A m$^{-2}$ assuming a tissue conductivity of 0.2 S m$^{-1}$. These values in turn correspond to magnetic field changes of between 40 and 60 T s$^{-1}$ for conventionally designed MRI coils, depending on the orientation of the magnetic field vector with respect to the patient axis, the lower threshold corresponding to magnetic field application transverse to the long axis of the subject. NRPB, for example, propose a safety factor of 2 or 3 suggesting that for switching times, t, >3 ms, magnetic field changes of up to 20 T s$^{-1}$ should avoid peripheral nerve and cardiac muscle stimulation. This corresponds to a maximum induced current density of 400 mA m$^{-2}$. For rapid gradient switching in times t in the range 45 μs<t<3 ms the formula (dB/dt)t<60×10$^{-3}$ T should be observed.

The above invoked relationship between dB/dt and induced electric field E depends on the gradient coil design. Standard coil designs by and large follow the expression above and correspond to all current commercial gradient sets. However, if the relationship between dB/dt and induced E-field can be modified, the above safety guidelines can be radically changed. This is exactly what is proposed in this Patent. We believe we can modify the relationship such that dB/dt produces an induced E-field which is at least 3 times lower than standard coils. Said another way, the effect of the new coil design will be to allow an increase of dB/dt to 60 T s$^{-1}$ for switching times >3 ms, and still avoid both peripheral nerve and cardiac muscle stimulation. For faster gradient switching in times ranging from 45 μs<t<3 ms the safety formula would be changed to (dB/dt)t<180×10$^{-3}$ T at a minimum.

The immediate result of these changes will be to allow either a threefold image resolution improvement in high-speed snap-shot imaging, or a three times faster imaging strategy. Of course, intermediate cases would allow both an increase in speed and resolution. These improvements will have a profound effect on the course of real-time movie imaging and fluoroscopic imaging.

2. THEORY

In magnetic resonance imaging (MRI) magnetic field gradients in the x-, y- and the z-directions are switched rapidly thereby inducing electric fields in the patient which can lead to neural stimulation. Here, several coil designs are considered which comprise four wires lying on the surface of a cylinder, radius $R_1$, the wires running parallel to the cylindrical or y-axis. The current at the ends of the wires is carried out in a radial direction, and then returns along wires parallel to the cylindrical axis at a radial distance $R_2$. Gradient coils for MRI based on straight wires have been described elsewhere, V. Bangert, P. Mansfield, J.Phys.E. 15, 235 (1982). Views of the general arrangement are shown in FIGS. 1A and 1B. The wires may carry all positive currents or a maximum of two positive and two negative currents. The object of the calculation is to determine the induced electric field, E, over the head or region of a person lying within the coil along the cylindrical z-axis.

To simplify matters, we consider the patient to be a cylinder with axis along the z direction, radius α of uniform non-magnetic material (relative permeability $μ_r$=1 of high relative permittivity and with a uniform conductivity of 0.2 Ω$^{-1}$m$^{-1}$. The object of this work is to design a set of coils to generate the uniform field gradient over the cylinder in such a way as to minimize the electric field experienced inside the cylinder.

2.1 Formulation

Maxwell's equations, when described in terms of the vector potential A and scalar potential V in the Lorentz gauge condition $$\nabla \cdot A + \epsilon_0 \mu_0 \frac{\partial V}{\partial t} = 0, \quad (2)$$

can be written as the pair $$\nabla^2 V - \epsilon_0 \mu_0 \frac{\partial^2 V}{\partial t^2} = -\frac{\rho_c}{\epsilon_0}, \quad (3)$$

$$\nabla^2 A - \epsilon_0 \mu_0 \frac{\partial^2 A}{\partial t^2} = -\mu_0 j. \quad (4)$$

Here $\rho_c$ is the total charge density (including polarization, free charges and surface charges) and j is the total current density (including free currents and polarization currents). The source of V is the charge density, $\rho_c$; the source of the vector potential is the current density j due to current in the coils and currents induced in the cylinder.

The electric field in the cylinder is given by $$E = -\nabla V - \frac{\partial A}{\partial t} = E^V + E^A \quad (1)$$

where $E^V = -\nabla V$ and $E^A = -\partial A/\partial t$. In the limit of low frequency the terms in $\epsilon_0 \mu_0 \partial^2 A/\partial t^2$ in the equation for V and the term in $\epsilon_0 \mu_0 \partial^2 A/\partial t^2$ in the equation for A are negligibly small and we can write $$\nabla^2 V = -\frac{\rho_c}{\epsilon_0}, \quad (5)$$

and $$\nabla^2 A = -\mu_0 j. \quad (6)$$

These equations have solutions $$V(r) = \frac{1}{4\pi\epsilon_0} \int\int\int_\tau \frac{\rho_c(r')}{|r-r'|} d^3 r'; \quad (7)$$

$$A(r) = \frac{\mu_0}{4\pi} \int\int\int_\tau \frac{j(r')}{|r-r'|} d^3 r'. \quad (8)$$

Knowing the current density in the coils, $j_{coil}$, we can calculate the contribution to the vector potential, $A_{coil}$ from $j_{coil}$; $A_{coil}$ gives rise to an electric field in the cylinder and induces small electrical currents therein, which in turn create an additional contribution to the vector potential. For a poorly conducting medium, such as human tissue, the induced current in the cylinder gives a contribution to the vector potential which is negligible in comparison to $A_{coil}$.

The main effect of the current in the body is to distribute charge on the surface of the body which acts as a source of the scalar potential V. At low frequencies we solve Eq.(5) in which $\rho_c$ becomes a surface charge density. For example, for a short cylinder of length 2l lying with cylindrical axis along the y-direction wholly within a uniform transverse gradient the charge on the end of the cylinder at y=l is given by $$\rho_c = q(x, y)\delta(z-l) \quad (9)$$

3. SIMPLE MODEL

In the coordinate system we are using for these calculations the large, static, external magnetic field points along the z-axis so that there is a large $B_{z0}$.

The magnetic induction $B=\nabla \times A$ in the low frequency limit satisfies Ampère's law $$\nabla \times B = \mu_0 j_{coil} \quad (10)$$

in the approximation where we neglect the induced current in the cylinder. It follows that inside the coil $\nabla \times B=0$ which means $$\nabla \times (\nabla \times A) = \nabla(\nabla \cdot A) - \nabla^2 A = 0. \quad (11)$$

In the low frequency limit the Lorentz condition becomes $$\nabla \cdot A = 0 \quad (12)$$

which is known as the Coulomb gauge. In the Coulomb gauge $\nabla^2 A=0$ which means that each Cartesian component of A satisfies Laplace's equation. One such solution is the vector potential (0

$$A_y = A_2(x^2-z^2). \quad (13)$$

For such a vector potential $\nabla \cdot A = 0$ and $$B = \nabla \times A = 2A_2(\hat{i}z + \hat{k}x) \quad (14)$$

where $\hat{k}$ is a unit vector in the z-direction. Since the main magnetic induction field is in the y-direction, there is a transverse gradient $G_x = \partial B_y/\partial x = +2A_2$.

If this field gradient oscillates at a single angular frequency, $\omega$, the electric field has a maximum magnitude $|E^A| = \frac{1}{2}\omega G_x \rho^2$. To make a useful comparison with the conventional coil arrangement we use the same values as those taken by R. Bowtell and R. M. Bowley, Analytic Calculations of the E-Fields Induced by Time-Varying Magnetic Fields Generated by cylindrical Gradient Coils, Mag. Res. Med. 44: 782-790 (2000): they used for the radius of the cylinder $\alpha=0.195$ m; their transverse coil design produces a field gradient of 20 mT m$^{-1}$, and oscillates in such a way as to produce a maximum rate of change of gradient field of 100 T m$^{-1}$ s$^{-1}$, equivalent to $\omega=5000$ rad s$^{-1}$.

With these values the maximum induced E-field found for the coil which produces $A_y$ is 1.9 V m$^{-1}$; for a conventional saddle-coil arrangement the corresponding value found by Bowtell and Bowley is 5.25 V m$^{-1}$ which is nearly three times larger.

If the term $A_y$ in the vector potential were the only term there would be a uniform field gradient across the cylinder and an electric field which is about three times smaller than for other designs of gradient coils. But the coil comprising four parallel wires also creates a constant vector potential in the ROI which requires screening.

4. PRACTICAL HEAD COIL ARRANGEMENT

Figure 35A:
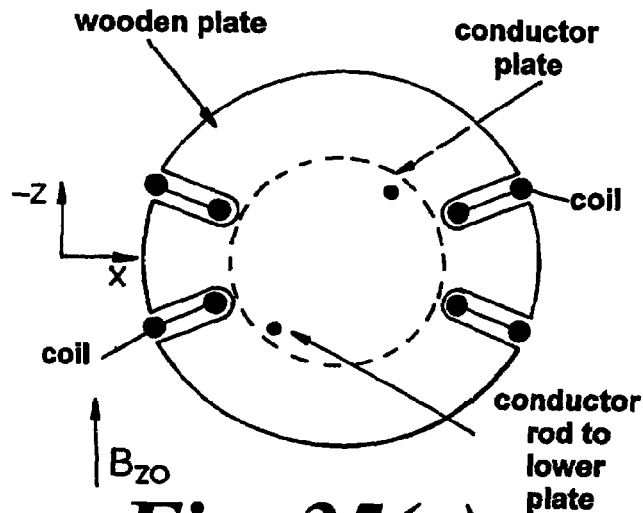

The simplest arrangement for producing a head gradient coil utilises 4 sectors, each sector consisting of a rectangular coil as shown in FIGS. 35A and B. The coils may be angled as indicated to produce the most uniform gradient field within the ROI. The integrity of the coils is maintained by two slotted wooden plates and attached to these plates are two brass electrode plates as indicated in FIGS. 35A and 35B. The slots in the plate allow the rectangular coil sections to be moved in and out. In addition the wooden plates can be lowered up or down, thereby decreasing the volume within the ROI. The brass electrodes are coupled by one or more removable conductive rods placed to optimise the screening.

Figure 35C:
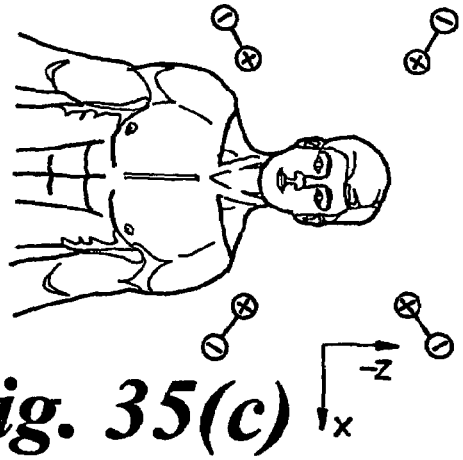
Figure 35B:
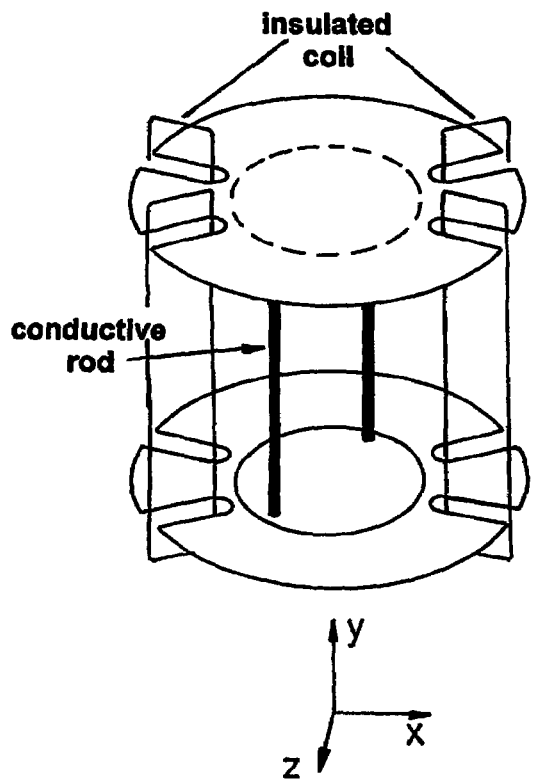
Figure 35D:
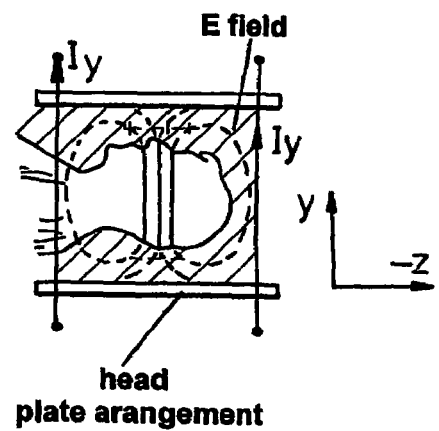

FIG. 35C shows the disposition of the patient's head within the gradient set. FIG. 35D shows the E-field induced within the patient's head when the conductive shorting rod is disconnected.

5. IMPROVEMENTS IN THE SIMPLE 4-SECTOR GRADIENT UNIT

It will be noticed from FIG. 35C that for a simple 4-sector gradient unit the magnetic field and hence the vector potential field can extend into the thoracic region of the patient. If the vector potential varies along the z-axis then undesirable currents will be induced within the thoracic region and also around the shoulders. To overcome this effect we propose in a further embodiment that several 4-sector gradient units can be spaced along the z-axis to extend the region of current uniformity.

Figure 36:
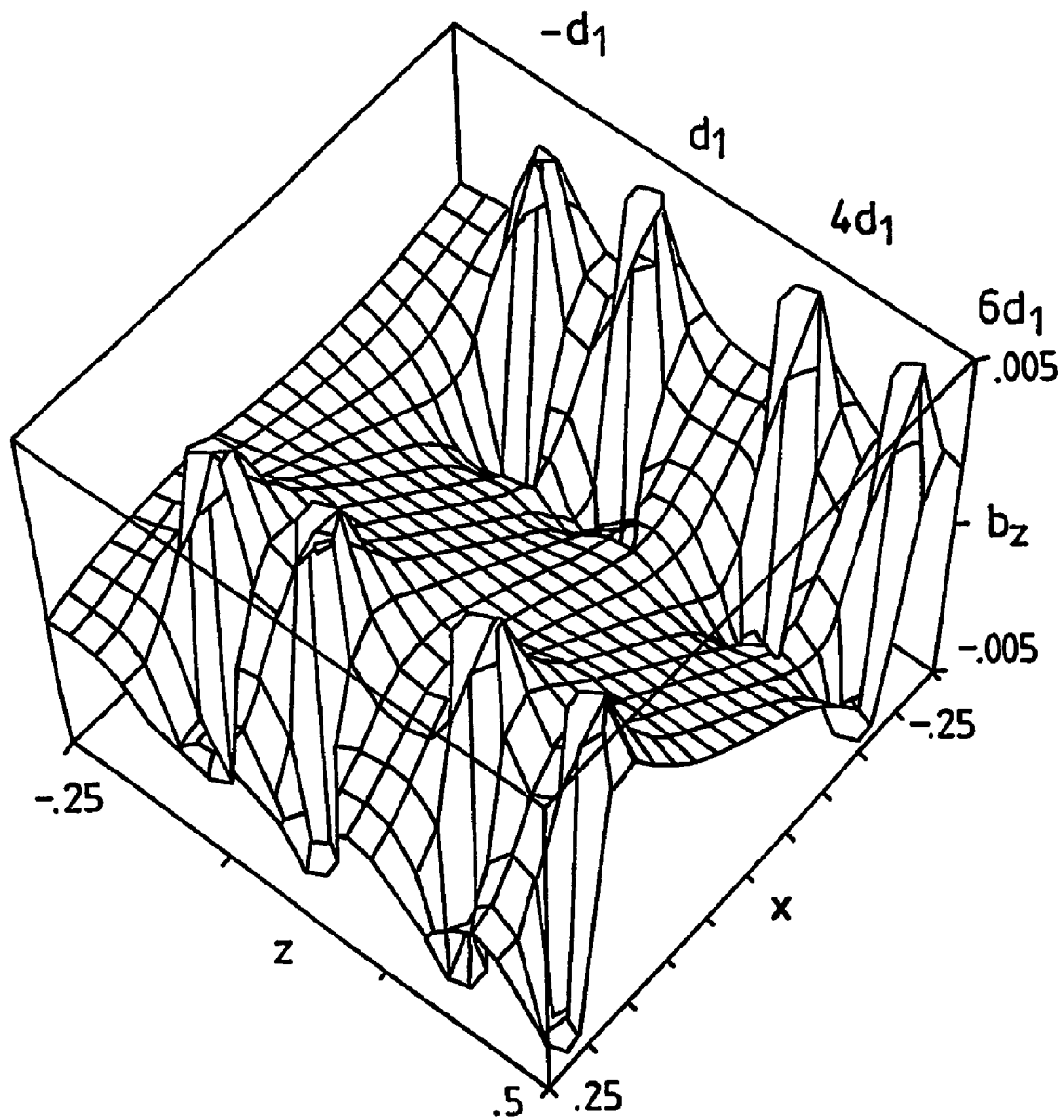

FIG. 36 shows a three-dimensional graph of magnetic field $b_z$ versus x,z for a simple arrangement of two 4-sector gradient units, the first being centred at y=0 with the sector pairs displaced at $\pm d_1$, the second 4-sector gradient unit is centred at y=5$d_1$ with the sector pairs displaced at 4$d_1$ and 6$d_1$. It is observed that the uniform region of the gradient extends now over a total displacement along the y-axis of approximately 7$d_1$. In the example given $d_1=0.079$ m and the inner spacing of the conductor wires is 0.38 m The current returns are co-planar with the inner wires but 0.16 m further out along the x-axis. The wire lengths are all 0.58 m and the current passing is 4000 A.

Figure 37:
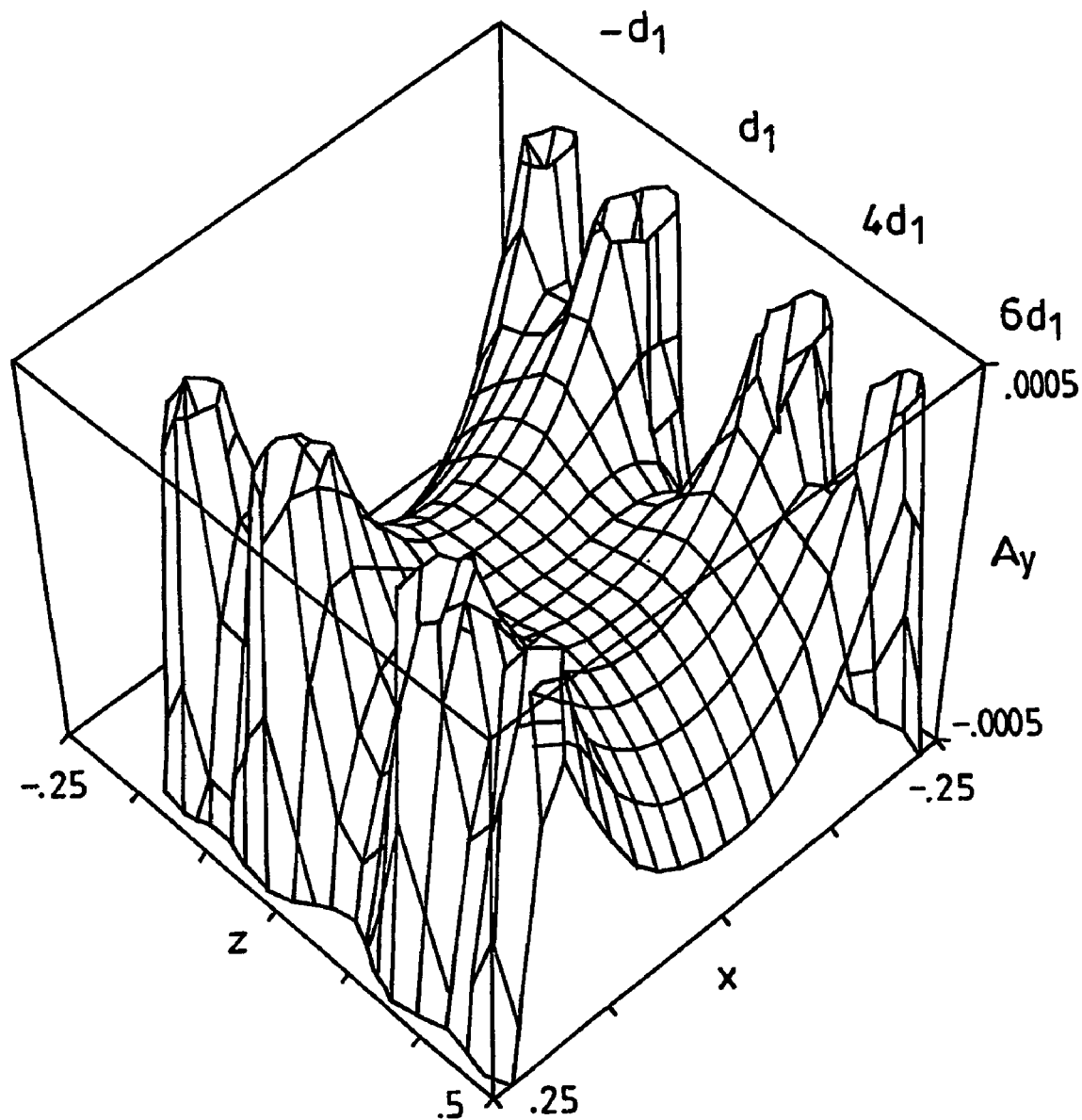

FIG. 37 shows the vector potential $A_y$ versus x,z corresponding to the gradient plot of FIG. 36.

Figure 38:
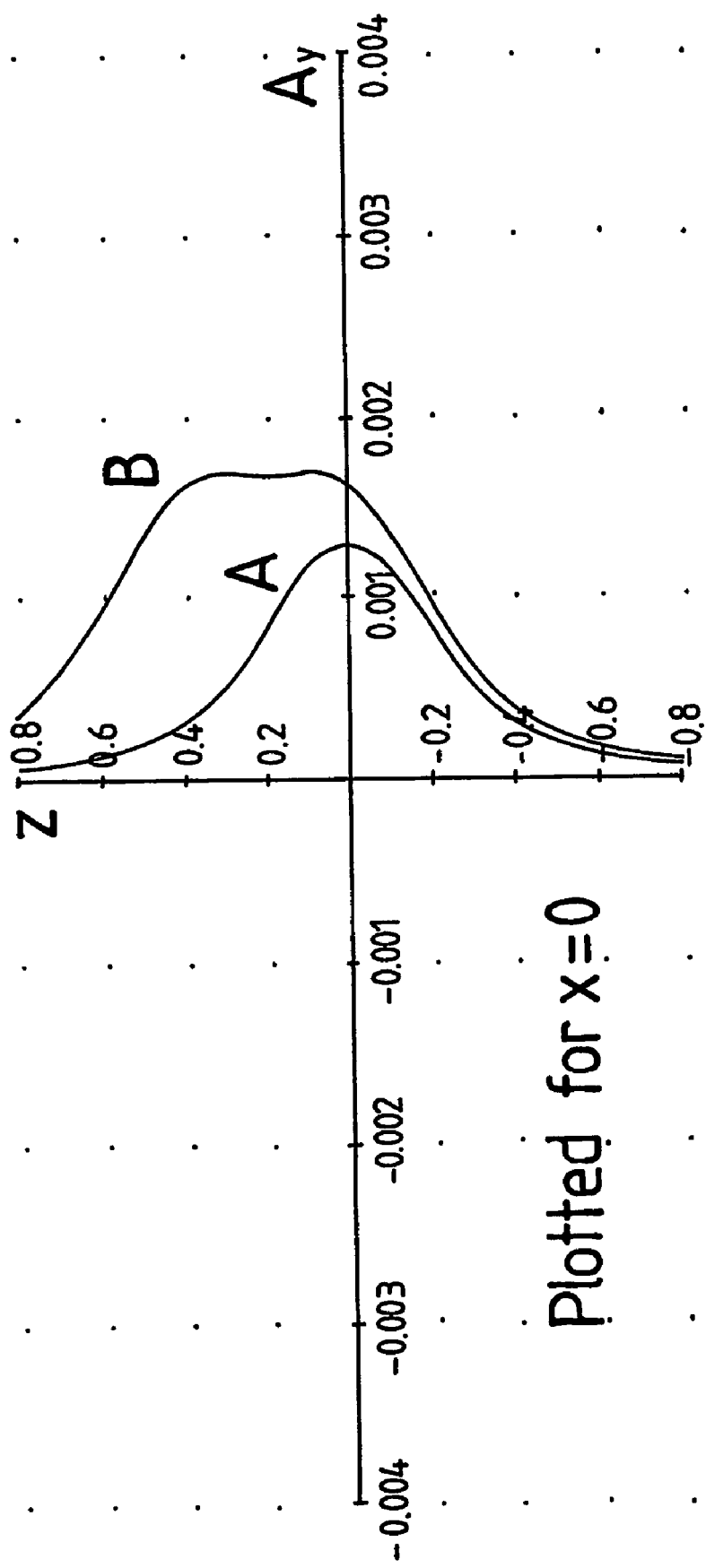

FIG. 38 shows the graph of vector potential $A_y$ versus z at x=0 taken from the three-dimensional plot of FIG. 37. Curve A shows the vector potential $A_y$ for a single 4-sector gradient unit and is effectively the transfer function for a single gradient coil centered at y=0. Curve B shows the central section at x=0 and indicates the extended range of uniformity of $A_y$. An alternative way to extend the uniform region of $A_y$ is to consider the convolution of the transfer function for a single coil unit with current weighting of the units along the z-axis. We have not performed this procedure here but have simply taken two optimised 4-sector gradient coils, all with the same currents, and found a spacing which gives the most extended uniform $A_y$. It follows from this that further 4-sector gradient units may be added along the z-axis, the extent of the uniform region of $A_y$ being determined by the length of the patient. So long as the patient lies within a uniform $A_y$ no induced currents will flow along the patient in the z-axis direction. There will, of course be transverse currents produced, but these can be electrically screened using the electrode plate arrangement referred to previously.

6. ELECTRIC FIELD SCREENING—RESULTS 6.1 Experimental Results

Much of the work going on in MR centres throughout the world is related to brain scanning and the evaluation of a technique called functional magnetic resonance imaging (fMRI).

Transient and steady state currents induced within the brain by the rapidly changing magnetic gradient field can be substantial. Their effect on neural activity and in particular fMRI signals could be substantial and at the very least could muddy the interpretation of genuine signals.

To reduce the effects of induced currents within the subject we have designed and constructed a 4segment single axis gradient coil to test the prediction that the electric field within the patient volume or region of interest (ROI) of the coil can be reduced significantly by attaching suitably placed electrodes to the coil assembly in the form of a pair of parallel conducting (brass/copper) plates. A relatively simple coil design was employed that would, nevertheless, have some potential use as a head only coil.

In parallel with this work an electronic circuit was built with the intention of attaching a high impedance probe to measure the electric field changes within the ROI of the coil. The probe amplifier was screened since it was being used in close proximity to the gradient coil which can interact with the circuit electrically or magnetically.

The coil arrangement was assembled and powered. Since the electronic probe impedance is only 10 MΩ, the actual voltage picked up from the E-field probe is not a true measure of the electric field but related to it by a factor $1/\alpha$ where $0<\alpha<1$. The coil assembly was designed to be flexible so that the gap between the electrode plates can be varied. We have made preliminary measurements at 3.0 kHz with a coil current of 25 A and with the gap at its widest (~40 cm) where we measured a probe voltage at the centre of the coil system of 25 mV equating to an E-field of $250/\alpha$ mV/m. When the electric plates are shorted the probe voltage reduces to 10 mV giving an electric field of $100/\alpha$ mV/m. From calculating the expected electric field we estimate that $\alpha \approx 0.033$.

The gap between the electric plates was reduced to its minimum value (~20 cm) and with a coil current of 12.5 A the probe voltage was measured at a number of places within the ROI and gave an average value of 42.5 mV equating to an E-field of $425/\alpha$ mV/m. When the plates were shorted the average value dropped to 10.5 mV indicating approximately 75% reduction within the ROI. From calculation we estimate that $\alpha \approx 0.1$.

There are a number of questions and anomalies with these results, for example why does α vary, and why is there a significant variation in the E-field within the ROI. Nevertheless, it is gratifying to observe that when the plates are shorted the average reduction in E-field quoted above is significant. However, it is emphasised that these first results are preliminary and may reflect environmental effects.

The next stage in development and measurement is to increase the input impedance of the amplifier so that we are able to measure the E-field directly corresponding to $\alpha=1$. Spatial variations in the E-field may be caused by adjacent cables or equipment producing extraneous effects and/or distortions of the electric field. To combat this we propose an electrically screened environment be constructed so that we can be sure that measurements made within the screened environment are those produced by the gradient and not by external factors.

6.2 Gradient Coil Details

The gradient coil has four sectors, each having sixteen turns of 2.5 mm diameter enamelled copper wire wound onto a plate of Tufnol. The wires were potted in epoxy resin, each sector or plate had a height of 600 mm and a width of 180 mm with two post terminals placed at the top left-hand side. Once the sectors had been made the inductance of each one was measured and found to be approximately 205 μH. The four sectors were held in position to form a coil by two slotted wooden plates perpendicular to the windings as shown in FIG. 35B. These were used to support the coil sectors holding them together in a way that allowed the distance between the plates and also the distance between the windings to be varied. Brass discs of diameter 38 cm and 1 mm thick were fixed to each wooden plate. A removable brass rod could be electrically connected to the two brass plates forming a short circuit. A photograph of the coil assembly is shown in FIG. 39.

6.3 Resonant Circuit

Figure 40A:
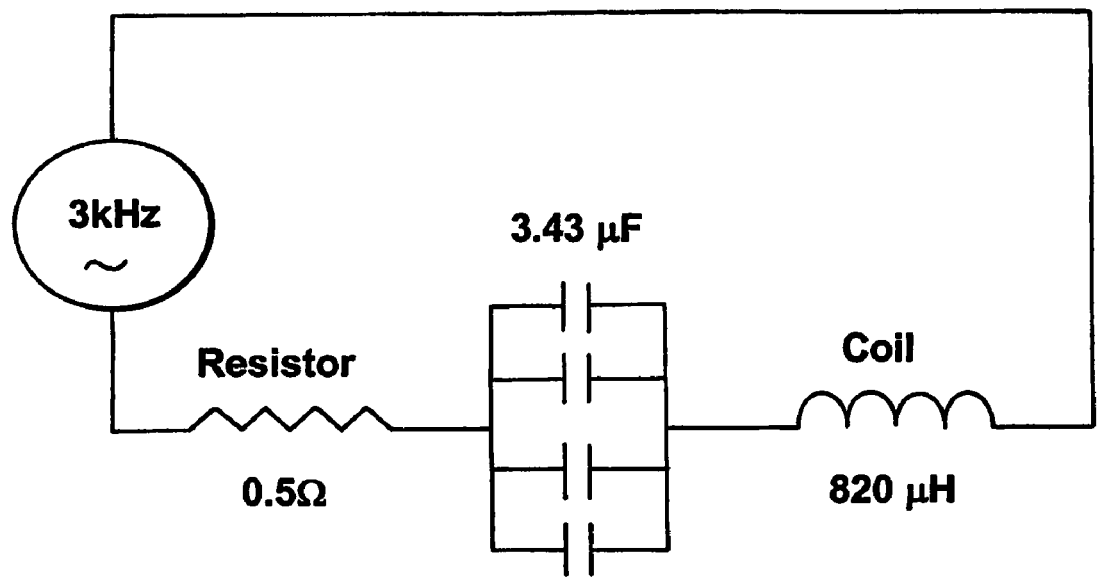
Figure 40B:
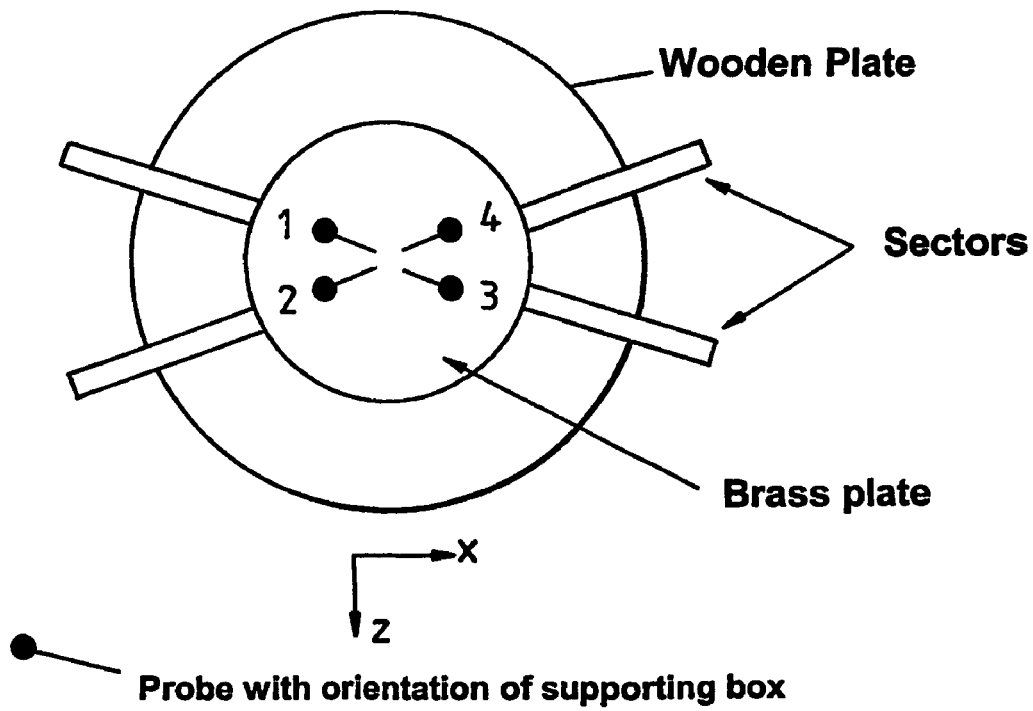

In order to maximise the current drawn from the amplifiers the coil formed part of a resonant circuit tuned to approximately 3 kHz. A capacitor of 3.43 μF was used to tune the coil as shown in FIG. 40A. With all sectors connected in series the total inductance is 820 μH (neglecting mutual coupling). A load of 0.5 Ω was included to stabilise the amplifier.

6.4 Results

The results were obtained using a home-built electric field meter comprising a probe made with two brass spheres, each having a diameter of 15 mm and a separation between the centres of 100 mm. The signal from each sphere was fed into a high impedance oscilloscope probe and the difference in signals between both spheres fed to the balanced input of the oscilloscope. With the E-field probe placed vertically and with the brass plate electrodes at their maximum spacing, the open circuit voltage measured was 45 mV and the short circuit 30 mV. In further experiments the probe was placed vertically within the gap now at its minimum spacing and off centre at the positions 1-4 shown in FIG. 41B. The E-field probe was typically 90-100 mm from the edge of the brass plate which also corresponded to the inner edges of all four sectors. In position 1 the open circuit voltage was 45 mV; the short circuit voltage 20 mV. In position 2 the open circuit voltage was 50 mV; the short circuit voltage was 20 mV. In position 3 the open circuit voltage was 120 mV; the short circuit voltage was 25 mV and in position 4 the open circuit voltage was 120 mV; the short circuit voltage was 20 mV. In these latter experiments the energising current from the coil was 12.5 A. The voltage measurements at the plate centre were: open circuit 50 mV; short circuit 25 mV.

In all cases considered above there is a substantial lowering of the E-field within the ROI when the plates are shorted ranging from 40%-83% reduction.

6.5 Further Results

In further results we have calculated the two-dimensional vector potential distribution $A_y(x,y)$ for the coil arrangement of FIG. 35B and FIG. 39 when activated with a current of 24 A. Only the vertical wires in FIG. 35B and FIG. 39 are included in the calculation. These results are shown in FIG. 41. In further experiments we have used a high input impedance E-field probe to explore the vector potential field $E^{Ay}$ along the z-axis at a frequency of 2.859 kHz. Only the region between the brass plates (spaced 27 cm apart) has been explored from the centre of the coil arrangement out to z=0.2 m. At each measurement point the results were recorded with the plates open circuit (square points) and with the plates short circuit (circular points). These results are shown in FIG. 42.

Figure 42:
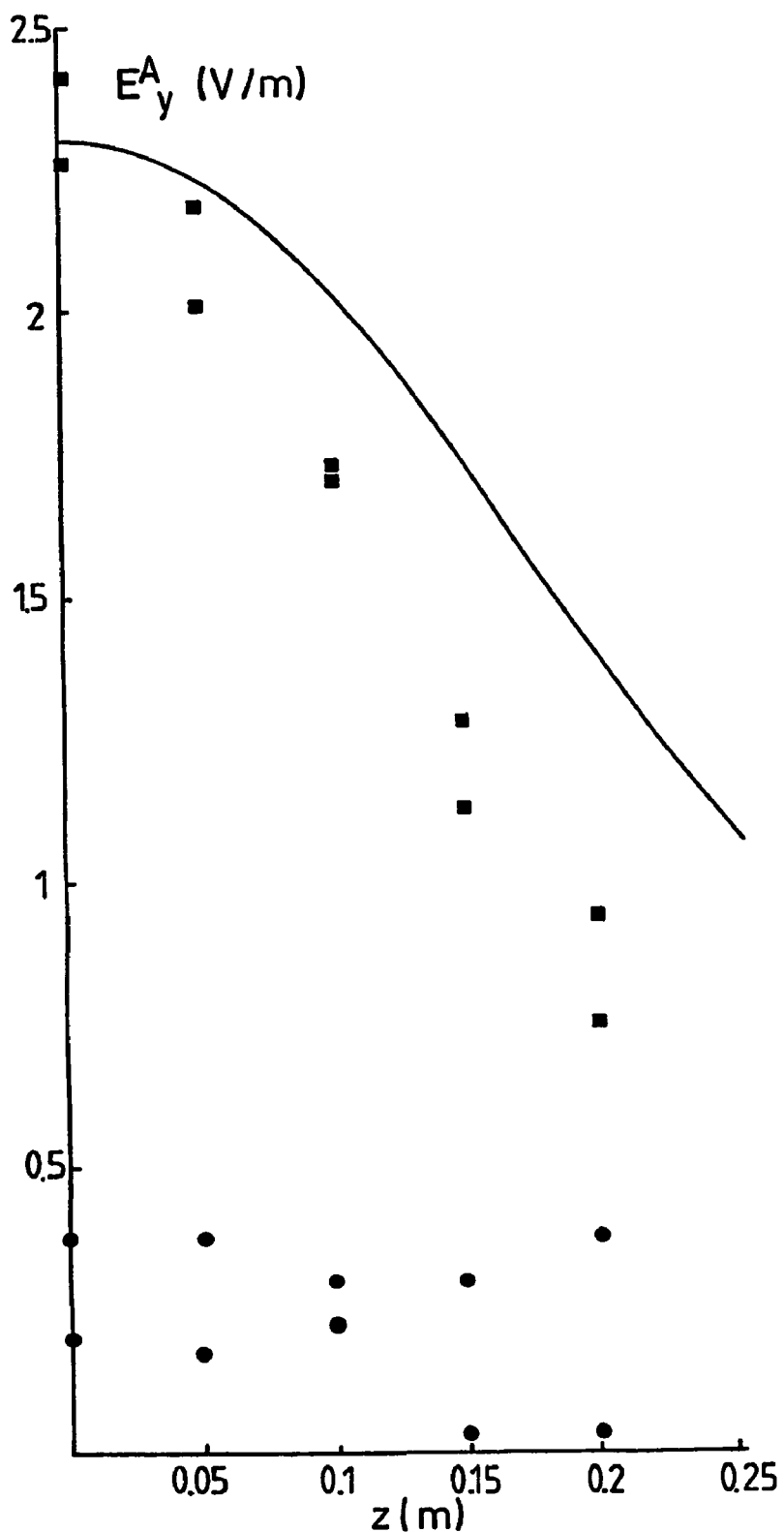

In FIG. 42 the continuous curve is the electric field $E^A_y$ (V/m) versus z (m) and corresponds to the mid-line of FIG. 41 at x=0. The open circuit results have been multiplied by a factor $\alpha=25.1$ in order to normalise the data at the plate origin. The shorted plate data have similarly been multiplied by $\alpha$. The open circuit data falls more rapidly than predicted by calculation and we suspect from the probe arrangement that this may be related to additional signal arising from the probe leads which were, in this case, unscreened. The transverse coupling wires are thought to give a negligible contribution to $E^A_y$. The short circuit results show a considerable drop in the measured E-field within the plate region and indicate clearly that the basic concept, as embodied in this patent, behaves as expected. The typical average reduction in $E^A_y$ at the centre is from 2.3 V/m to 0.3 V/m, indicating an 87% drop in field.

7. ARCUATE COILS

In previous sections we have considered simple gradient coils made from rectangular wire segments. In this section we extend the theory to include arcuate coil segments. In addition we include the possibility of magnetic screening of the arcuate primary coil segments. We limit the analysis to a 4 or more arcuate sector gradient coils but we emphasise that the gradient unit created could be used in exactly the same way as described in the previous section. That is to say repeat gradient units can be stacked along the z-axis to create a uniform vector potential field along z, thereby making sure that there are no currents induced within the patient along the z-axis. Currents along the y and x-axes can be substantially reduced by using electrode arrays similar to the plates used in the rectangular sector gradient coil of Section 5.

7.1 Screening

In this section we show in detail how to screen coils as well as satisfying the condition that $A_z=0$ inside the inner coil. As a primary example, we create a field gradient using two arcuate coils, and to screen them with a distribution of arcuate coils. We also show in detail how to screen them using fingerprint coils, and also how to make a coil set with three fingerprint coils.

7.1.1 Arcuate Coil

An arcuate coil has no current in the z-direction. The current density in cylindrical coordinates is $$j(r) = (\hat{\rho} j_\rho(\rho, \phi, z) + \hat{\phi} j_\phi(\rho, \phi, z)).$$

Since $j_z=0$ it follows that so that $A_z=0$.

Arcuate coils can have any shape consistent with the requirement that $j_z=0$, but we restrict the analysis to a coil made up of arc segments of radius $R_1$ and $R_2$ with radial wires connecting the ends of the arc segments. The simplest example has a current density $$j_\rho(\rho, \phi, z) = \frac{I}{\rho} \ominus (\rho - R_1) \ominus (R_2 - \rho) \delta(z - z_1) \times$$
$$(\delta(\phi - \phi_0) - \delta(\phi + \phi_0) - \delta(\phi + \pi - \phi_0) + \delta(\phi - \pi + \phi_0)).$$

with $\ominus(x)$ the Heaviside step function. Here the current is confined to the plane $z=z_1$; we can generalize this to a set of arcuate coils placed at positions $z_1$ such that the distribution of such coils is $c(z_1)$.

Let us concentrate on a single coil set in the plane z=0. Since $$\nabla \cdot j(r) = 0$$

we have $$\frac{1}{\rho}\frac{\partial(\rho j_\rho)}{\partial \rho} + \frac{1}{\rho}\frac{\partial j_\phi}{\partial \phi} = 0.$$

Given an expression for $j_\rho$, the quantity $j_\phi$ is defined by the solution to the equation above, subject to the boundary condition that $j_\phi$ vanishes as $\rho$ tends to infinity.

For the simple-arcuate-coil the $\rho$ component of the current has the Fourier transform $$\tilde{j}_\rho^m(k, \rho) = \frac{1}{2\pi}\int_{-\pi}^{\pi} e^{-im\phi} d\phi \int_{-\infty}^{\infty} e^{-ikz} j_\rho(\rho, \phi, z) dz$$
$$= -\frac{iI}{\pi\rho} e^{-ikz_1} \ominus (\rho - R_1) \ominus (R_2 - \rho) \sin(m\phi_0)(1 - \cos(m\pi)).$$

$\tilde{j}_\rho^m(k, \rho)$ is imaginary and obeys the relation $$\tilde{j}_\rho^m(k, \rho) = -\tilde{j}_\rho^{-m}(k, \rho).$$

The factor $(1-\cos(m\pi))$ ensures that $\tilde{j}_\rho^m(k, \rho)=0$ if m is an even integer. If we choose $\phi_0=\pi/3$ the m=3 term is zero as well.

By adding coils with different $\phi_i$ we can arrange matters so that only the $m=\pm 1$ component remains. This is called the m=1-coil. For example, to remove the term with m=5 we design an arcuate coil with Fourier transform $$\tilde{j}_\rho^m(k, \rho) = -\frac{iI}{\pi\rho}\ominus(\rho - R_1)\ominus(R_2 - \rho)e^{-ikz_1}(1-\cos(m\pi))$$
$$\sin(m\pi/3)\cos(m\pi/10)$$
$$= -\frac{iI}{2\pi\rho}\ominus(\rho - R_1)\ominus(R_2 - \rho)e^{-ikz_1}(1-\cos(m\pi)) \times$$
$$[\sin(m\pi(1/3 + 1/10)) + \sin(m\pi(1/3 - 1/10))].$$

We can generate such a coil with two arcuate coils with angles $\phi_{01}=\pi(1/3-1/10)$; $\phi_{02}=\pi(1/3+1/10)$. By making the arcuate coil have an increasing number subtended angles $\phi_{0j}$ we can successively remove the terms of higher and higher m. (See Bowtell and Peters—Magnetic Resonance in Medicine 41 page 600-8 1999—for their choice of angles (84.3°, 72.5°, 60°, 45.6°, 25.8°) they define the current going the other way.)

The optimal m=1-coil has $$\tilde{j}_\rho^m(k,\rho) = -\frac{iI}{\pi\rho}\ominus(\rho-R_1)\ominus(R_2-\rho)e^{-ikz_1}(1-\cos(m\pi))\sin(m\pi/3)$$
$$\cos(m\pi/10)\times\cos(m\pi/14)\cos(m\pi/22)\cos(m\pi/26)\times\ldots$$

In this way only the m=1 and m=−1 terms remain and we can write $$\tilde{j}_\rho^1(k,\rho) = -\frac{iI}{\pi\rho}\ominus(\rho-R_1)\ominus(R_2-\rho)e^{-ikz_1}B = -\tilde{j}_\rho^{-1}(k,\rho);$$
$$B = (1-\cos(\pi))\sin(\pi/3)\cos(\pi/10)\cos(\pi/14)$$
$$\cos(\pi/22)\cos(\pi/26)\times\ldots$$

In practice we truncate after a few terms. We write $B(1)=(1-\cos(\pi))\sin(\pi/3)$, $B(2)=(1-\cos(\pi))\sin(\pi/3)\cos(\pi/10)$, $B(3)=(1-\cos(\pi))\sin(\pi/3)\cos(\pi/10)\cos(\pi/14)$, $B(4)=(1-\cos(\pi))\sin(\pi/3)\cos(\pi/10)\cos(\pi/14)\cos(\pi/22)$, and so on to indicate the order of approximation to the ideal coil.

7.1.2 Relation of Current in Coil to Vector Potential

In the Coulomb gauge, the relation between the vector potential A and the current density is $\nabla^2 A(r) = -\mu_0 j(r)$.

This equation can be solved using a Fourier-Hankel transform pair of equations defined as $$\tilde{F}^m(k;\rho) = \frac{1}{2\pi}\int_{-\pi}^{\pi}e^{-im\phi}d\phi\int_{-\infty}^{\infty}e^{-ikz}F(\rho,\phi,z)dz,$$
$$F(\rho,\phi,z) = \frac{1}{2\pi}\sum_{m=-\infty}^{\infty}e^{im\phi}\int_{-\infty}^{\infty}e^{ikz}\tilde{F}^m(k,\rho)dk.$$

The Fourier transform has the tilde over the symbol. Thus the z-component of the current has the Fourier transform $$\tilde{j}_z^m(k,\rho) = \frac{1}{2\pi}\int_{-\pi}^{\pi}e^{-im\phi}d\phi\int_{-\infty}^{\infty}e^{-ikz}j_z(\rho,\phi,z)dz.$$

The Hankel transform is defined by the pair of equations $$g(s) = \int_0^{\infty}\rho J_m(s\rho)G(\rho)d\rho, \qquad G(\rho) = \int_0^{\infty}sJ_m(s\rho)g(s)ds.$$

The Hankel transform has a variable s and is written in lower case. The Fourier-Hankel transform of $F(\rho,\phi,z)$ is $$\tilde{f}^m(k,s) = \frac{1}{2\pi}\int_{-\pi}^{\pi}e^{-im\phi}d\phi\int_{-\infty}^{\infty}e^{-ikz}dz\int_0^{\infty}\rho J_m(s\rho)F(\rho,\phi,z)d\rho,$$
$$F(\rho,\phi,z) = \frac{1}{2\pi}\sum_{m=-\infty}^{\infty}e^{im\phi}\int_{-\infty}^{\infty}e^{ikz}dk\int_0^{\infty}sJ_m(s\rho)\tilde{f}^m(k,s)ds.$$

The Fourier-Hankel transform of the quantity $\nabla^2 F(\rho,\phi,z)$ is just $-(s^2+k^2)\tilde{f}^m(k,s)$. Thus the equation $\nabla^2 A(r)=-\mu_0 j(r)$ becomes $(-s^2-k^2)\bar{A}^m(k,s) = -\mu_0\bar{j}^m(k,s).$ This equation can be rewritten as $$\bar{A}^m(k,s) = \mu_0\frac{\bar{j}^m(k,s)}{s^2+k^2}.$$

and then inverted to give the vector potential in real space. If the vector potential is expressed in Cartesian coordinates we have $$\bar{A}_i^m(k,s) = \frac{\mu_0\bar{j}_i^m(k,s)}{s^2+k^2}$$

with i=1 for the x-component, i=2 for the y-component and i=3 for the z-component. In real space $$A_i(\rho,\phi,z) = \frac{\mu_0}{4\pi^2}\int j_i(r')d^3r'\sum_{m=-\infty}^{\infty}e^{im(\phi-\phi')}\times$$
$$\int_{-\infty}^{\infty}e^{ik(z-z')}dk\int_0^{\infty}s\frac{J_m(s\rho)J_m(s\rho')}{s^2+k^2}ds.$$

The integral over s is given by (I. S. Gradshteyn and I. M. Ryzhik *Tables of Integrals, Series, and Products* Academic Press (1980) Equation 6.541#1 page 679)

$$\int_0^{\infty}\frac{J_m(s\rho)J_m(s\rho_2)}{s^2+k^2}sds = I_m(k\rho^<)K_m(k\rho^>)$$

where $\rho<$ is the lesser of $\rho$ and $\rho'$. Here, and hereafter we write $I_m(k\rho<)K_m(k\rho>)$ instead of the more precise expression $I_m(|k|\rho<)K_m(|k|\rho>)$ for we are only interested in positive values of $k\rho<$ and $k\rho>$. With this understanding we take $I_m(-k\rho)=I_m(k\rho); K_m(-k\rho)=K_m(k\rho)$ Then $$A_i(\rho, \phi, z) = \frac{\mu_0}{4\pi^2} \int j_i(r') d^3r' \sum_{m=-\infty}^{\infty} e^{im(\phi-\phi')}$$

$$\int_{-\infty}^{\infty} e^{ik(z-z')} I_m(k\rho^<) K_m(k\rho^>) dk$$

$$= \frac{1}{2\pi} \sum_{m=-\infty}^{\infty} e^{im\phi} \int_{-\infty}^{\infty} e^{ikz} \tilde{A}_z^m(k, \rho) dk$$

in Cartesian coordinates. Thus the z-component is $$\tilde{A}_z^m(k, \rho) = \mu_0 \int_0^{\infty} \rho' I_m(k\rho^<) K_m(k\rho^>) \tilde{j}_z^m(k, \rho') d\rho'.$$

This is the same as found by Turner and Bowley who used the Green's function expansion of $|r-r'|^{-1}$ in cylindrical coordinates.

7.1.3 Vector Potential in Cylindrical Coordinates

For coils inside a cylinder it makes sense to express the vector potential in terms of cylindrical polar coordinates, that is $A_\rho$, $A_\phi$, and $A_z$. The $A_z$-component is the same as in Cartesian coordinates; the others are $$A_\rho(r) = \cos\phi A_x(r) + \sin\phi A_y(r)$$

$$A_\phi(r) = -\sin\phi A_x(r) + \cos\phi A_y(r).$$

We can write $$A_\rho - iA_\phi = (A_x - iA_y)e^{i\phi}; \quad A_\rho + iA_\phi = (A_x + iA_y)e^{-i\phi}.$$

From this we get $(A_x - iA_y) = (A_\rho - iA_\phi)e^{-i\phi}$; $(A_x + iA_y) = (A_\rho + iA_\phi)e^{i\phi}$, and $$A_x = \frac{1}{2}[(A_\rho + iA_\phi)e^{i\phi} + (A_\rho - iA_\phi)e^{-i\phi}];$$

$$A_y = \frac{1}{2i}[(A_\rho + iA_\phi)e^{i\phi} - (A_\rho - iA_\phi)e^{-i\phi}].$$

Similarly $$j_x = \frac{1}{2}[(j_\rho + ij_\phi)e^{i\phi} + (j_\rho - ij_\phi)e^{-i\phi}];$$

$$j_y = \frac{1}{2i}[(j_\rho + ij_\phi)e^{i\phi} - (j_\rho - ij_\phi)e^{-i\phi}];$$

so that $$j_x + ij_y = (j_\rho + ij_\phi)e^{i\phi}; \quad j_x - ij_y = (j_\rho - ij_\phi)e^{-i\phi}.$$

Thus $$A_\rho - iA_\phi = \frac{\mu_0}{4\pi^2} \int (j_\rho(r') - ij_\phi(r')) d^3r' \sum_{m=-\infty}^{\infty} e^{i(m+1)(\phi-\phi')}$$

$$\int_{-\infty}^{\infty} e^{ik(z-z')} I_m(k\rho^<) K_m(k\rho^>) dk$$

and $$A_\rho + iA_\phi = \frac{\mu_0}{4\pi^2} \int (j_\rho(r') + ij_\phi(r')) d^3r' \sum_{m=-\infty}^{\infty} e^{i(m-1)(\phi-\phi')}$$

$$\int_{-\infty}^{\infty} e^{ik(z-z')} I_m(k\rho^<) K_m(k\rho^>) dk$$

The radial part is $$A_\rho(\rho, \phi, z) = \frac{1}{2\pi} \sum_{m=-\infty}^{\infty} e^{im\phi} \int_{-\infty}^{\infty} e^{ikz} \tilde{A}_\rho^m(k, \rho) dk.$$

where $$\tilde{A}_\rho^m(k, \rho) = \frac{\mu_0}{4\pi} \int_0^{\infty} \rho' \tilde{j}_\rho^m(k, \rho') (I_{m-1}(k\rho^<) K_{m-1}(k\rho^>) +$$

$$I_{m+1}(k\rho^<) K_{m+1}(k\rho^>)) d\rho' -$$

$$i\frac{\mu_0}{4\pi} \int_0^{\infty} \rho' \tilde{j}_\phi^m(k, \rho') (I_{m-1}(k\rho^<) K_{m-1}(k\rho^>) -$$

$$I_{m+1}(k\rho^<) K_{m+1}(k\rho^>)) d\rho'$$

In the same way we get $$A_\phi(\rho, \phi, z) = \frac{\mu_0}{8\pi^2} \int d^3r' \sum_{m=-\infty}^{\infty} \int_{-\infty}^{\infty} e^{ik(z-z')} I_m(k\rho^<) K_m(k\rho^>) dk$$

$$\{ij_\rho(r')(e^{i(m+1)(\phi-\phi')} - e^{i(m-1)(\phi-\phi')}) +$$

$$j_\phi(r')(e^{i(m+1)(\phi-\phi')} + e^{i(m-1)(\phi-\phi')})\}$$

$$= \frac{1}{2\pi} \sum_{m=-\infty}^{\infty} e^{im\phi} \int_{-\infty}^{\infty} e^{ikz} dk \, \tilde{A}_\phi^m(k, \rho).$$

7.1.4 Inside the Coil

The vector potential for $\rho < R_1$ has the coefficient $$\tilde{A}_\rho^m(k, \rho) = \frac{\mu_0}{4\pi} I_{m-1}(k\rho) \int_0^{\infty} \rho' K_{m-1}(k\rho') [\tilde{j}_\rho^m(k, \rho') - i\tilde{j}_\phi^m(k, \rho')] d\rho'$$

$$\frac{\mu_0 I_{m+1}(k\rho)}{4\pi} \int_0^{\infty} \rho' K_{m+1}(k\rho') [\tilde{j}_\rho^m(k, \rho') + i\tilde{j}_\phi^m(k, \rho')] d\rho'.$$

Now using $$\frac{1}{\rho}\frac{\partial(\rho j_\rho)}{\partial \rho} + \frac{1}{\rho}\frac{\partial j_\phi}{\partial \phi} = 0$$

we find $$im\tilde{j}_\phi^m(k, \rho) = -\frac{\partial(\rho \tilde{j}_\rho^m)}{\partial \rho}.$$

Thus $$\tilde{A}_\rho^m(k, \rho) = \frac{\mu_0}{2} I_{m-1}(k\rho) \int_0^{\infty} \rho' K_{m-1}(k\rho') \left( \tilde{j}_\rho^m(\rho', k) + \right.$$

$$\left. \frac{1}{m}\frac{\partial(\rho' \tilde{j}_\rho^m(k, \rho'))}{\partial \rho'} \right) d\rho' + \frac{\mu_0}{2} I_{m+1}(k\rho) \int_0^{\infty} \rho' K_{m+1}(k\rho')$$

$$\left( \tilde{j}_\rho^m(\rho', k) - \frac{1}{m}\frac{\partial(\rho' \tilde{j}_\rho^m(k, \rho'))}{\partial \rho'} \right) d\rho'$$

We can evaluate this by using integration by parts with the help of the recurrence relations for Bessel functions $$xK'_{m-1}(x) = (m-1)K_{m-1}(x) + xK_m(x);$$

$$xK'_{m+1}(x) = xK_m(x) - (m+1)K_{m+1}(x).$$

This gives $$\tilde{A}_\rho^m(k,\rho) = \frac{\mu_0 k}{2m} \int_{R_1}^{R_2} \rho'^2 K_m(k\rho') \tilde{j}_\rho^m(\rho',k) d\rho' (I_{m+1}(k\rho) - I_{m-1}(k\rho))$$

$$= -\frac{\mu_0}{\rho} I_m(k\rho) \int_{R_1}^{R_2} \rho'^2 K_m(k\rho') \tilde{j}_\rho^m(\rho',k) d\rho'$$

$$= \frac{\mu_0 m}{k\rho} i F_m^{(1)}(k) I_m(k\rho)$$

is odd in m and where $$F_m^{(1)}(k) = -\frac{k}{m} \int_{R_1}^{R_2} \rho'^2 K_m(k\rho') \tilde{j}_\rho^m(\rho',k) d\rho'$$

is even in m since $\tilde{j}_\rho^m$ is odd in m. For a simple coil at $z=z_1$ $$F_m^{(1)}(k) = \frac{iIk}{\pi m} e^{-ikz_1} \sin(m\phi_0)(1-\cos(m\pi)) \int_{R_1}^{R_2} \rho' K_m(k\rho') d\rho'.$$

Since $K_m(k\rho')=K_{-m}(k\rho')$ it follows that $F_m^{(1)}(k)=F_{-m}^{(1)}(k)$; also $I_m(k\rho)=I_{-m}(k\rho)$ so that $$\tilde{A}_\rho^m(k,\rho) = -\tilde{A}_\rho^{-m}(k,\rho)$$

Similarly it can be shown that $$\tilde{A}_\phi^m(k,\rho) = -\mu_0 F_m^{(1)}(k) I'_m(k\rho)$$

from which it follows that $$\tilde{A}_\phi^m(k,\rho) = \tilde{A}_\phi^{-m}(k,\rho).$$

Outside the coil, $\rho > R_2$, the calculation is the same giving $$\tilde{A}_\rho^m(k,\rho) = \frac{\mu_0 k}{2m} \int_{R_1}^{R_2} \rho'^2 I_m(k\rho') \tilde{j}_\rho^m(\rho',k) d\rho' (K_{m+1}(k\rho) - K_{m-1}(k\rho))$$

$$= -\frac{\mu_0}{\rho} K_m(k\rho) \int_{R_1}^{R_2} \rho'^2 I_m(k\rho') \tilde{j}_\rho^m(\rho',k) d\rho'$$

$$= \frac{\mu_0 m}{k\rho} i G_m^{(1)}(k) K_m(k\rho)$$

where $$G_1^{(1)}(k) = \frac{IkB(n)}{\pi} \int_{R_1}^{R_2} \rho' I_1(k\rho') d\rho'$$

7.1.5 Magnetic Induction

We want the z-component of the magnetic induction $$B_z = \frac{1}{\rho} \frac{\partial(\rho A_\phi)}{\partial \rho} - \frac{1}{\rho} \frac{\partial A_\rho}{\partial \phi}$$

which is written as $$B_z = \frac{1}{2\pi} \sum_{m=-\infty}^{\infty} e^{im\phi} \int_{-\infty}^{\infty} e^{ikz} \tilde{B}_z^m(k,\rho) dk$$

-continued $$= \frac{1}{2\pi} \sum_{m=-\infty}^{\infty} e^{im\phi} \int_{-\infty}^{\infty} e^{ikz} \left( \frac{1}{\rho} \frac{\partial(\rho \tilde{A}_\phi^m)}{\partial \rho} - \frac{im\tilde{A}_\rho}{\rho} \right) dk.$$

Using the results obtained so far $$\frac{\partial(\rho \tilde{A}_\phi^m)}{\partial \rho} - im\tilde{A}_\rho = -\mu_0 F_m(k) \frac{\partial(\rho I'_m(k\rho))}{\partial \rho} + \frac{\mu_0 m^2}{k\rho} F_m(k) I_m(k\rho)$$

$$= -\mu_0 F_m(k) \left[ k\rho I''_m(k\rho) + I'_m(k\rho) - \frac{m^2}{k\rho} I_m(k\rho) \right].$$

The equation which $I_m(k\rho)$ satisfies is $$(k\rho)^2 I''_m(k\rho) + k\rho I'_m(k\rho) - m^2 I_m(k\rho) = (k\rho)^2 I_m(k\rho) \text{ so that}$$

$$\frac{1}{\rho}\left( \frac{\partial(\rho \tilde{A}_\phi^m)}{\partial \rho} - im\tilde{A}_\rho \right) = -\mu_0 k F_m^{(1)}(k) I_m(k\rho). \text{ Thus}$$

$$B_z = -\frac{\mu_0}{2\pi} \sum_{m=-\infty}^{\infty} e^{im\phi} \int_{-\infty}^{\infty} e^{ikz} k F_m^{(1)}(k) I_m(k\rho) dk.$$

7.1.6 Arcuate Pair

If we design arcuate coils so that only the $m=\pm 1$ terms are important and place two of them at $z=\pm z_1$ $$F_1^{(1)}(k) = 2\cos(kz_1) \frac{kIB(n)}{\pi} \int_{R_1}^{R_2} \rho' K_1(k\rho') d\rho' = F_{-1}^{(1)}(k);$$

and then $$B_z = -\frac{\mu_0 IB(n)}{2\pi^2} \rho \cos\phi$$

$$\int_{-\infty}^{\infty} dk (2\cos(kz_1)) e^{ikz} k^3 \left( \frac{2I_1(k\rho)}{k\rho} \right)$$

$$\int_{R_1}^{R_2} \rho' K_1(k\rho') d\rho'.$$

Since $x = \rho \cos\phi$ this coil has a gradient of $B_z$ in the x-direction, as expected. Put $x = \rho \cos\phi$ and $y = kR$ and define $$d_1(y) = \int_{yR_1/R}^{yR_2/R} x K_1(x) dx$$

Then $$\frac{B_z}{x} = -\frac{\mu_0 IB(n)}{\pi^2 R^2}$$

$$\int_0^\infty (2\cos(yz_1/R)) d_1(y) y \cos(yz/R) \left( \frac{2I_1(y\rho/R)}{y\rho/R} \right) dy.$$

The gradient at the origin is $$\frac{B_z}{x} = -\frac{\mu_0 IB(n)}{\pi^2 R^2} \int_0^\infty (2\cos(yz_1/R)) d_1(y) y dy.$$

The gradient switching rate is $$\frac{\omega B_z}{x} = -\frac{\omega \mu_0 IB(n)}{\pi^2 R^2} \int_0^\infty (2\cos(yz_1/R))d_1(y)y\,dy.$$

7.1.7 Screening

One can screen this coil set by creating a distribution ($c^{(2)}(z_0)$ with Fourier transform $C^{(2)}(k)$) of m=1-arcuate coils (with arcuate radii $R_3$, $R_4$) along the z-direction. Suppose that outside the outer screen ($\rho > R_4$) the contributions from the outer arcuate set gives a z-component of field $$\tilde{B}_z^{(2)} = -\mu_0 k K_1(k\rho) G_1^{(2)}(k) C^{(2)}(k) \text{ with}$$

$$G_1^{(2)}(k) = \frac{IkB(n)}{\pi} \int_{R_3}^{R_4} \rho' I_1(k\rho')d\rho'$$

If we can ensure that $$2\cos(kz_1)G_1^{(1)}(k) + C^{(2)}(k)G_1^{(2)}(k) = 0$$

then $B_z = 0$ outside the outer screen, and hence the other components are zero. (More generally we may want to screen coils with many m components; we then need $$2\cos(kz_1)G_m^{(1)}(k) + C_m^{(2)}(k)G_1^{(2)}(k) = 0$$

as cited earlier.) The distribution of m=1-arcuate coils is $$C^{(2)}(k) = -2\cos(kz_1)\frac{G_1^{(1)}(k)}{G_1^{(2)}(k)} = -2\cos(kz_1)\frac{\int_{kR_1}^{kR_2} xI_1(x)dx}{\int_{Rk_3}^{kR_4} xI_1(x)dx}$$

This distribution can be mimicked by a set of discrete coils.
We define $$F_1^{(1)}(k) = \frac{Ik}{\pi}B(n)\int_{R_1}^{R_2} \rho' K_1(k\rho')d\rho';$$

$$F_1^{(2)}(k) = \frac{Ik}{\pi}B(n)\int_{R_3}^{R_4} \rho' K_1(k\rho')d\rho'$$

Inside the inner coil ($\rho < R_1$)

$$B_z = -\frac{\mu_0}{\pi}\cos\phi$$
$$\int_{-\infty}^\infty k e^{ikz}[F_1^{(1)}(k)2\cos(kz_1) + F_1^{(2)}(k)C^{(2)}(k)]I_1(k\rho)dk.$$

Let us define $$\mathcal{F}_1^{(1)} = 2\cos(kz_1)F_1^{(1)}(k) + F_1^{(2)}(k)C(k) \text{ with}$$

$$= 2\cos(kz_1)\frac{IB(n)}{k\pi}\left[d_1 - \frac{d_2 e_1}{e_2}\right]$$

$$d_1 = \int_{kR_1}^{kR_2} xK_1(x)dx;$$

$$d_2 = \int_{kR_3}^{kR_4} xK_1(x)dx;$$

$$e_1 = \int_{kR_1}^{kR_2} xI_1(x)dx;$$

$$e_2 = \int_{kR_3}^{kR_4} xI_1(x)dx.$$

The field at the centre of the coil set is $$B_z = -\mu_0/\pi \cos\phi \int_{-\infty}^\infty k e^{ikz} \mathcal{F}_1^{(1)}(k) I_1(k\rho)dk.$$

We can now select $z_1$ so as to give the best gradient in the region of interest. To analyse this we put $x = \rho\cos\phi$ so that we can write $B_z$ as $$B_z(\rho, \phi, z) = -\frac{\mu_0}{2\pi} x \int_{-\infty}^\infty \left[\frac{2I_1(k\rho)}{\rho} e^{ikz}\right] k \mathcal{F}_1(k)dk,$$

$$= -\frac{\mu_0}{\pi} x \int_{-\infty}^\infty \left[\frac{2I_1(k\rho)}{k\rho}\cos(kz)\right] k^2 \mathcal{F}_1(k)dk$$

and then use $$\frac{2I_2(k\rho)}{k\rho}\cos(kz) = 1 + k^2\left(\frac{\rho^2}{4} - \frac{z^2}{2}\right) + k^4\left(\frac{\rho^4}{64} - \frac{\rho^2 z^2}{8} + \frac{z^4}{24}\right).$$

We can optimize the design by choosing the condition that the term in $\rho^2/4 - z^2/2$ vanishes, that is we select $z_1$ so that $$G_3 = \int_0^\infty k^4 \mathcal{F}_1(k)dk = 0.$$

The gradient near the origin is $$\frac{B_z}{x} = -\frac{\mu_0 IB(n)}{\pi^2 R^2} s(\rho, z)$$

$$s(\rho, z) = \int_0^\infty (2\cos(yz_1/R))\left[d_1 - \frac{d_2 e_1}{e_2}\right] y$$
$$\left[1 + \frac{y^4}{R^4}\left(\frac{\rho^4}{64} - \frac{\rho^2 z^2}{8} + \frac{z^4}{24}\right)\right]dy.$$

The gradient switching rate at the origin is $$\frac{\omega B_z}{x} = -\left(\frac{\omega \mu_0 IB(n)}{\pi^2 R^2}\right)s(0, 0).$$

Figure 43:
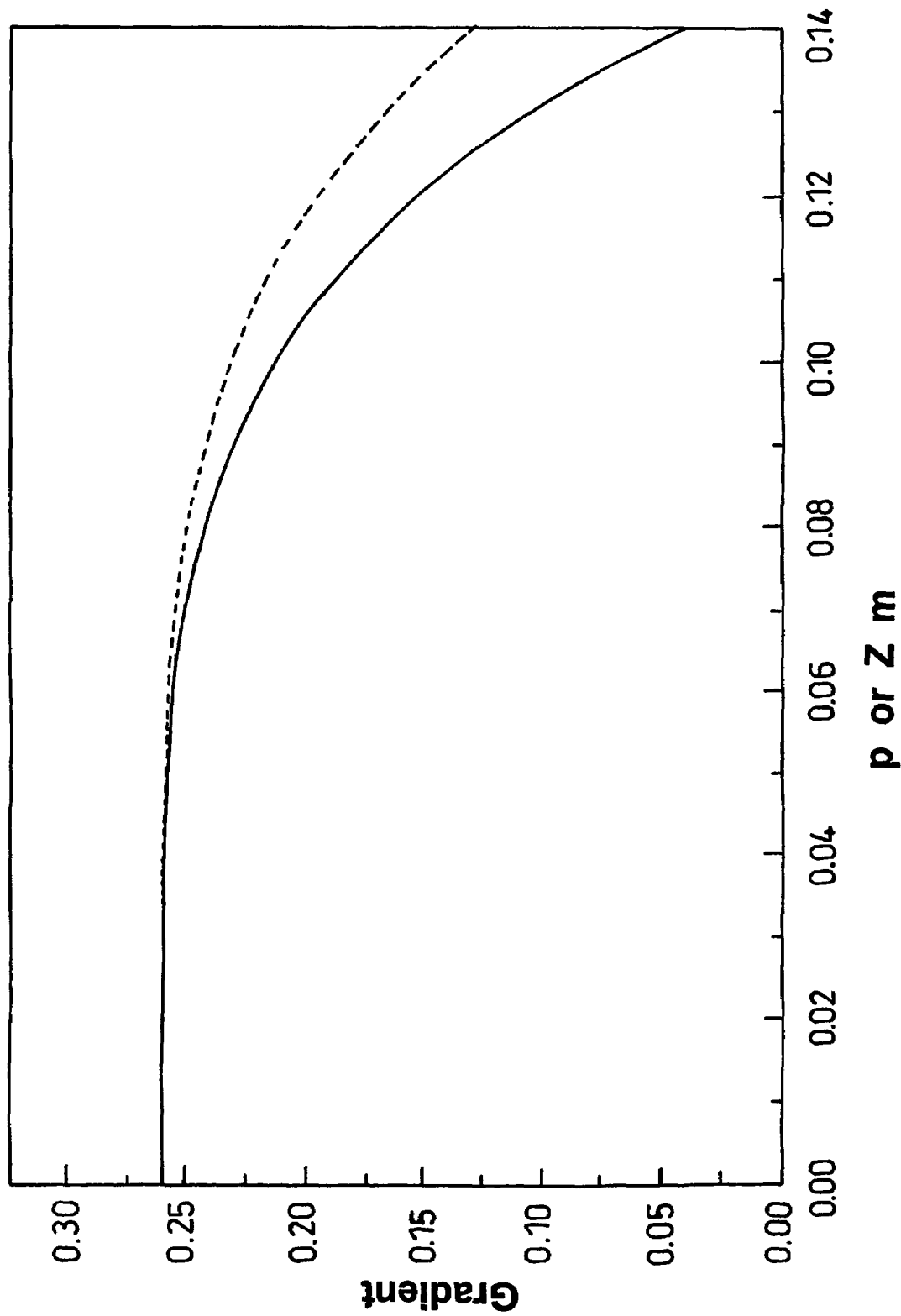

For example, a simple coil which could fit around the human body treated as a cylinder of radius R=0.2 m) has values: $R_1=0.32$ m, $R_2=0.42$ m, $R_3=0.42$ m, $R_4=0.49$ m; $L_z=1.5$ m. The gradient has $G_3=0$ if we take $z_1=0.10175$ m. The gradient for $\rho=0$ as a function of z is shown in FIG. 43 as a solid line—in fact we plot there $s(0, z)$. It is uniform over a range of about $\pm 0.07$ m. The dashed line is $s(\rho, 0)$.

As an improvement we can enlarge the region of interest by using a distribution of inner coils, not just the two at $\pm z_1$, thereby getting rid of higher order terms such as $$\int_0^\infty k^6 F_1(k) dk = 0.$$

7.1.8 Screening of a Pair of Arcuate Coils by Two Fingerprint Coils

Suppose the fingerprint coils have radii b and c ($<$b) and the arcuate have radii $R_1$ and $R_2$ with $R_1<R_2<b$. To provide a perfect screen outside the outer coil it is sufficient to ensure that the z-component of B is zero. Consider a single fingerprint coil which has no current in the radial direction.

$$j_b^{coil}(r) = (\hat{i}_\phi F_\phi(\phi,z) + \hat{k} F_z(\phi,z)) \delta(\rho-b).$$

It is well known that the B-field has a z-component given by $$\tilde{B}_z^m(k,\rho) = -\mu_0 F_\phi^m(k) kb I_m(k\rho) K'_m(kb).$$

If we consider a second fingerprint coil of radius c $$j_c^{coil}(r) = (\hat{i}_\phi F_\phi(\phi,z) + \hat{k} F_z(\phi,z)) \delta(\rho-c).$$

Then outside the outer screen $\rho>c$ $$B_z^m = -\mu_0 K_m(k\rho)[2G_m^{(1)}(k)\cos(kz_1) + F_\phi^m(k) kb I'_m(kb) + F_\phi^m(k) kc I'_m(kc)].$$

This can be made to be zero if we take $$[2G_m^{(1)}(k)\cos(kz_1) = -F_\phi^m(k) kb I'_m(kb) - F_\phi^m(k) kc I'_m(kc)]$$

Inside the inner coil ($\rho<R_1$) we want $A_z$ to be zero. Only the fingerprint coils contribute so that for $\rho<R_1$ $$\tilde{A}_z^m(k,\rho) = \mu_0 I_m(k\rho)[0 + b F_z^m(k) K_m(kb) + c F_z^m(k) K_m(kc)].$$

Thus $$\mathcal{F}_z^m(k) = -F_z^m(k) \frac{b K_m(kb)}{c K_m(kc)}.$$

Since $$F_\phi^m(k) = -\frac{kb}{m} F_z^m(k); \quad \mathcal{F}_\phi^m(k) = -\frac{kc}{m} \mathcal{F}_z^m(k)$$

the condition that there is a perfect screen is $$2G_m^{(1)}(k)\cos(kz_1) = \frac{kb}{m} F_z^m(k) kb I'_m(kb) + \frac{kc}{m} \mathcal{F}_z^m(k) kc I'_m(kc)$$
$$= \frac{kb}{m} F_z^m(k) kb I'_m(kb) - \frac{k^2 cb}{m}$$
$$= \frac{kb}{m} F_z^m(k) \left[ kb I'_m(kb) - kc \frac{K_m(kb)}{K_m(kc)} I'_m(kc) \right].$$

Hence we can calculate the currents in the two fingerprint coils given $G_m^{(1)}(k)$ and create a perfect screen for the arcuate coil.

7.1.9 Three Fingerprint Coils

Imagine now an inner fingerprint coil, surrounded by two screening fingerprint coil. Let the coils have radii a, b, and c with $c>b>a$. For $\rho>c$ the $B_z$ component has Fourier-Hankel transform $$\tilde{B}_z^m(k,\rho) = -\mu_0 K_m(k\rho)[f_\phi^m(k) ka I'_m(ka) + F_\phi^m(k) kb I'_m(kb) + F_\phi^m(k) kc I'_m(kc)]$$

Here $F_\phi^m(k)$ is the Fourier-Hankel transform of the $\phi$-component of the current in the outermost coil. This can be made to be zero if $$f_\phi^m(k) ka I'_m(ka) + F_\phi^m(k) kb I'_m(kb) + F_\phi^m(k) kc I'_m(kc) = 0$$

Now the term $A_z$ for small $\rho$ gives $$\tilde{A}_z^m(k,\rho) = \mu_0 I_m(k\rho)[a f_z^m(k) K_m(ka) + b F_z^m(k) K_m(kb) + c F_z^m(k) K_m(kc)].$$

We can make this zero if $$a f_z^m(k) K_m(ka) + b F_z^m(k) K_m(kb) + c F_z^m(k) K_m(kc) = 0.$$

But $$\frac{m}{a} f_\phi^m(k) = -k f_z^m(k); \quad \frac{m}{b} F_\phi^m(k) = -k F_z^m(k); \quad \frac{m}{c} \mathcal{F}_\phi^m(k) = -k \mathcal{F}_z^m(k).$$

The condition on the $B_z$ can be written as $$f_z^m(k) k^2 a^2 I'_m(ka) + F_z^m(k) k^2 b^2 I'_m(kb) + F_z^m(k) k^2 c^2 I'_m(kc) = 0.$$

Thus we need to solve the two equations $$F_z^m(k) k^2 b^2 I'_m(kb) + F_z^m(k) k^2 c^2 I'_m(kc) = -f_z^m(k) k^2 a^2 I'_m(ka),$$

$$F_z^m(k) kb K_m(kb) + F_z^m(k) kc K_m(kc) = -f_z^m(k) ka K_m(ka).$$

These can be written as a single matrix equation $$\begin{pmatrix} k^2 b^2 I'_m(kb) & k^2 c^2 I'_m(kc) \\ kb K_m(kb) & kc K_m(kc) \end{pmatrix} \begin{pmatrix} F_z^m(k) \\ \mathcal{F}_z^m(k) \end{pmatrix} = -f_z^m(k) \begin{pmatrix} k^2 a^2 I'_m(ka) \\ ka K_m(ka) \end{pmatrix}.$$

We can invert this to get $$\begin{pmatrix} F_z^m(k) \\ \mathcal{F}_z^m(k) \end{pmatrix} = -f_z^m(k) \begin{pmatrix} k^2 b^2 I'_m(kb) & k^2 c^2 I'_m(kc) \\ kb K_m(kb) & kc K_m(kc) \end{pmatrix}^{-1} \begin{pmatrix} k^2 a^2 I'_m(ka) \\ ka K_m(ka) \end{pmatrix}.$$

In other words we can satisfy both conditions for any given choice of $f_z^m(k)$.

$$\begin{pmatrix} k^2 b^2 I'_m(kb) & k^2 c^2 I'_m(kc) \\ kb K_m(kb) & kc K_m(kc) \end{pmatrix}^{-1} = \frac{1}{k^2 b^2 I'_m(kb) kc K_m(kc) - k^2 c^2 I'_m(kc) kb K_m(kb)} \times \begin{pmatrix} kc K_m(kc) & -k^2 c^2 I'_m(kc) \\ -kb K_m(kb) & k^2 b^2 I'_m(kb) \end{pmatrix}$$

Thus $$F_z^m(k) = -f_z^m(k) \frac{(kc K_m(kc) k^2 a^2 I'_m(ka) - k^2 c^2 I'_m(kc) ka K_m(ka))}{(k^2 b^2 I'_m(kb) kc K_m(kc) - k^2 c^2 I'_m(kc) kb K_m(kb))}$$

-continued $$\mathcal{F}_z^m(k) = -f_z^m(k) \frac{(-kbK_m(kb)k^2a^2I'_m(ka) + k^2b^2I'_m(kb)kaK_m(ka))}{(k^2b^2I'_m(kb)kcK_m(kc) - k^2c^2I'_m(kc)kbK_m(kb))}$$

Then using $$\frac{m}{a}f_\phi^m(k) = -k f_z^m(k); \quad \frac{m}{b}F_\phi^m(k) = -k F_z^m(k); \quad \frac{m}{c}\mathcal{F}_\phi^m(k) = -k\mathcal{F}_z^m(k).$$

$$F_\phi^m(k) = -\frac{b}{a}f_\phi^m(k)\frac{(kcK_m(kc)k^2a^2I'_m(ka) - k^2c^2I'_m(kc)kaK_m(ka))}{(k^2b^2I'_m(kb)kcK_m(kc) - k^2c^2I'_m(kc)kbK_m(kb))}$$

$$\mathcal{F}_\phi^m(k) = -\frac{c}{a}f_\phi^m(k)\frac{(-kbK_m(kb)k^2a^2I'_m(ka) + k^2b^2I'_m(kb)kaK_m(ka))}{(k^2b^2I'_m(kb)kcK_m(kc) - k^2c^2I'_m(kc)kbK_m(kb))}$$

The field inside the inner coil can now be worked out using $$\tilde{B}_z^m(k,\rho) = -\mu_0 I_m(k\rho)[f_\phi^m(k)kaK'_m(ka) + F_\phi^m(k)kbK'_m(kb) + \mathcal{F}_\phi^m(k)kcK'_m(kc)]$$

$$= -\mu_0 I_m(k\rho)f_\phi^m(k)kaK'_m(ka) + \mu_0 I_m(k\rho)f_\phi^m(k)kbK'_m(kb)$$

$$\frac{b}{a}\frac{(kcK_m(kc)k^2a^2I'_m(ka) - k^2c^2I'_m(kc)kaK_m(ka))}{(k^2b^2I'_m(kb)kcK_m(kc) - k^2c^2I'_m(kc)kbK_m(kb))} +$$

$$\mu_0 I_m(k\rho)f_\phi^m(k)kcK'_m(kc)$$

$$\frac{c}{a}\frac{(-kbK_m(kb)k^2a^2I'_m(ka) + k^2b^2I'_m(kb)kaK_m(ka))}{(k^2b^2I'_m(kb)kcK_m(kc) - k^2c^2I'_m(kc)kbK_m(kb))}.$$

This gives the answer in terms of $f_\phi^m(k)$.

7.2 Electric Field

7.2.1 Electric Field Due to Vector Potential.

In this section we calculate the electric field for the pair of arcuate coils screened by arcuate coils, as described in 7.1.7, in which $R_1=0.32$ m, $R_2=0.42$ m, $R_3=0.42$ m, $R_4=0.49$ m; $L_z=1.5$ m and $z_1=0.10175$ m. We shift the coils so that their centre lies at position $z_0$. The vector potential is $$A_\rho(\rho, \phi, z) = \frac{i}{\pi}\sin\phi \int_{-\infty}^{\infty} e^{ikz}\tilde{A}_\rho^1(k,\rho)dk$$

$$= -\frac{\mu_0 IB(n)}{2\pi^2}\sin\phi \int_{-\infty}^{\infty} \frac{2I_1(k\rho)}{k\rho}e^{ik(z-z_0)}\left(\frac{2\cos(kz_1)}{k}\right)$$

$$(d_2 - d_2e_1/e_2)dk.$$

Similarly $$A_\phi(\rho, \phi, z) = \frac{1}{\pi}\cos\phi \int_{-\infty}^{\infty} e^{ikz}\tilde{A}_\phi^1(k,\rho)dk$$

$$= -\frac{\mu_0 IB(n)\cos\phi}{2\pi^2} \int_{-\infty}^{\infty} 2I'_1(k\rho)e^{ik(z-z_0)}\left(\frac{2\cos(kz_1)}{k}\right)$$

$$(d_1 - d_2e_1/e_2)dk$$

The electric field due to A has components with magnitude $$E_\rho^A = \left|\frac{\omega\mu_0 IB(n)}{2\pi^2}\right|\sin\phi$$

$$\int_{-\infty}^{\infty} \frac{2I_1(k\rho)}{k\rho}e^{ik(z-z_0)}\left(\frac{2\cos(kz_1)}{k}\right)(d_1 - d_2e_1/e_2)dk,$$

-continued $$E_\phi^A = \left|\frac{\omega\mu_0 IB(n)}{2\pi^2}\right|\cos\phi$$

$$\int_{-\infty}^{\infty} 2I'_1(k\rho)e^{ik(z-z_0)}\left(\frac{2\cos(kz_1)}{k}\right)(d_1 - d_2e_1/e_2)dk.$$

The magnitude of the gradient switching rate is $$G\omega = (B_z/x)\omega = \left(\frac{\omega\mu_0 IB(n)}{\pi^2 R^2}\right)J;$$

$$J = \int_0^\infty (2\cos(yz_1/R))d_1(y)y\,dy$$

so that $$E_\rho^A = \frac{G\omega R^2}{2J}\sin\phi \int_{-\infty}^{\infty} \frac{2I_1(k\rho)}{k\rho}e^{ik(z-z_0)}$$

$$\left(\frac{2\cos(kz_1)}{k}\right)(d_1 - d_2e_1/e_2)dk,$$

$$E_\phi^A = \frac{G\omega R^2}{2J}\cos\phi \int_{-\infty}^{\infty} 2I'_1(k\rho)e^{ik(z-z_0)}$$

$$\left(\frac{2\cos(kz_1)}{k}\right)(d_1 - d_2e_1/e_2)dk.$$

Figure 44:
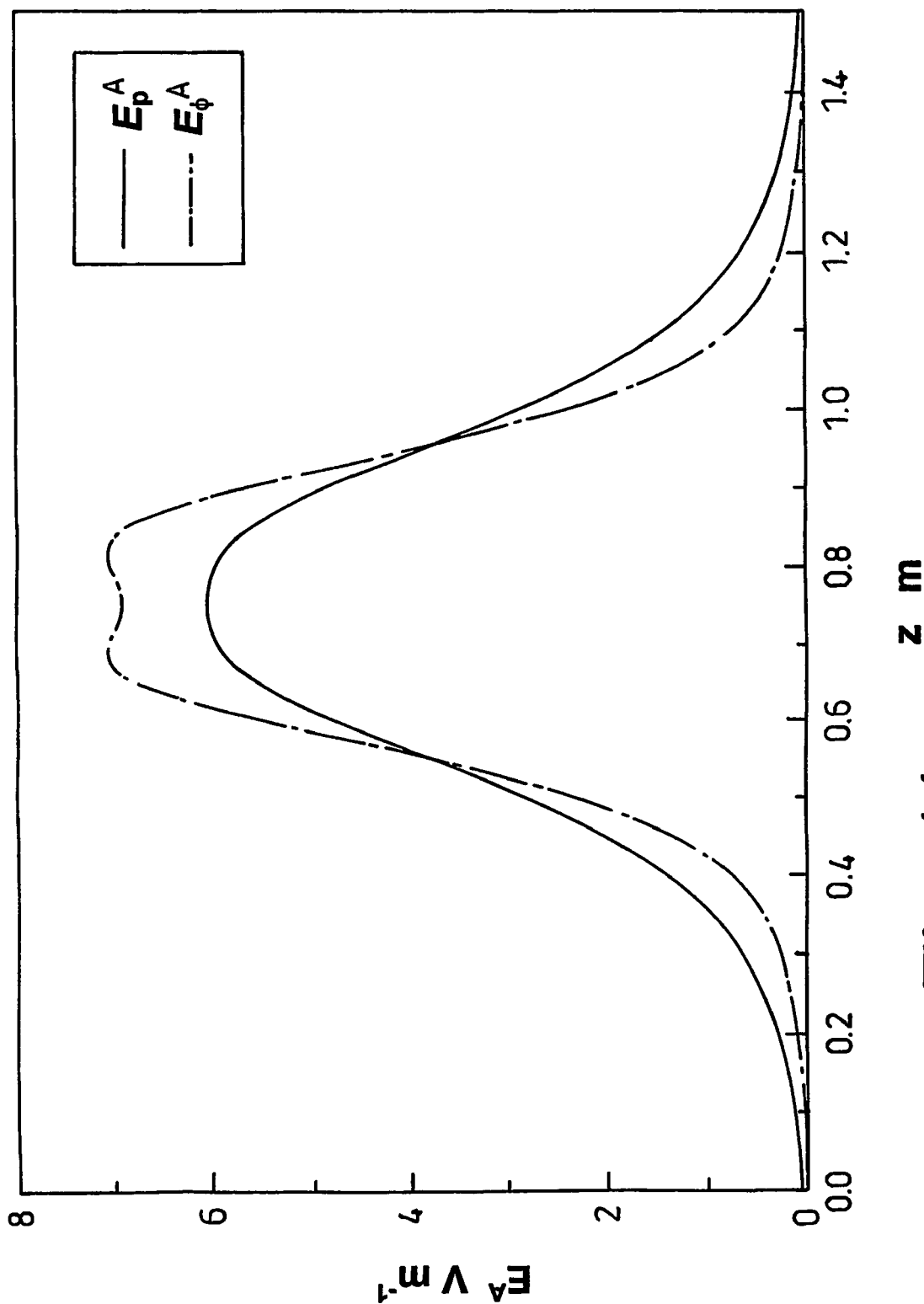

We can readily evaluate these expressions for R=0.2 m (the surface of a cylinder) and a gradient switching rate of $G\omega=100$ T m$^{-1}$s$^{-1}$. They are shown in FIG. 44. The maximum field is about 7 V m$^{-1}$ and occurs in the centre of the coil in the $\phi$ direction.

7.2.2 Choice of Scalar Potential

There is also the contribution of the scalar potential to the electric field. The scalar potential, V(r), is uniquely specified by the values it has on the boundary of the cylinder. All we have to do is specify the form of V(r) we want and then work out the values of the potential on the boundary. Notionally, we can choose the scalar potential to be any desired function. One choice is the form $$V_1 = \frac{1}{2}v_0\rho\sin\phi + \sin\phi\sum_{n=1}^{\infty}\frac{v_n}{k_n}\cos(k_n z)I_1(k_n\rho)$$

with $k_n=n\pi/L_z$ and n a positive integer. With this choice the z-component of electric field is zero at the ends of the cylinder. The centre of the cylinder is at $z_0=0.75$ m; z ranges from 0 to 1.5 m. Then $$E_\rho^V = -\sin\phi\sum_{n=1}^{\infty}v_n\cos(k_n z)I'_1(k_n\rho),$$

$$E_\phi^V = -\cos\phi\sum_{n=1}^{\infty}v_n\cos(k_n z)\frac{I_1(k_n\rho)}{k_n\rho}$$

$$E_z^V = \sin\phi\sum_{n=1}^{\infty}v_n\sin(k_n z)I_1(k_n\rho).$$

With this choice we ensure that $E_z^V=0$ at $z=0$ and at $z=L_z$. The total electric field is $$E_\rho = E_\rho^A - \sin\phi \sum_{n=1}^{\infty} v_n \cos(k_n z) I_1'(k_n \rho),$$

$$E_\phi = E_\phi^A - \cos\phi \sum_{n=1}^{\infty} v_n \cos(k_n z) \frac{I_1(k_n \rho)}{k_n \rho},$$

$$E_z = \sin\phi \sum_{n=1}^{\infty} v_n \sin(k_n z) I_1(k_n \rho)$$

with $$E_\rho^A = \frac{G\omega R^2}{2J} \sin\phi \int_{-\infty}^{\infty} \frac{2I_1(k\rho)}{k\rho} e^{ik(z-z_0)} \left(\frac{2\cos(kz_1)}{k}\right)(d_1 - d_2 e_1/e_2)dk,$$

$$E_\phi^A = \frac{G\omega R^2}{2J} \cos\phi \int_{-\infty}^{\infty} 2I_1'(k\rho) e^{ik(z-z_0)} \left(\frac{2\cos(kz_1)}{k}\right)(d_1 - d_2 e_1/e_2)dk.$$

The solution that suggests itself is the one in which the normal component of electric field at all surfaces is zero. If this condition is satisfied there is no electrical current normal to the surface and so no build up of charge. This is the quasistatic solution to the problem. If we choose $E_\rho=0$ at $\rho=R$ then $$\sum_{n=1}^{\infty} v_n \cos(k_n z) I_1'(k_n R) = \frac{G\omega R^2}{2s} \int_{-\infty}^{\infty} \frac{2I_1(kR)}{kR} e^{ik(z-z_0)} \frac{2\cos(kz_1)}{kR}(d_1 - d_2 e_1/e_2)dk$$

Then using the orthogonality of the $\cos(k_n z)$ functions gives $$v_n I_1'(k_n R) = \frac{G\omega R^2}{2s} \int_{-\infty}^{\infty} \frac{2I_1(kR)}{kR} \frac{2\cos(kz_1)}{k}(d_1 - d_2 e_1/e_2)dk \frac{2}{L_z} \int_0^{L_z} \cos(k_n z) e^{ik(z-z_0)} dz.$$

The integral $$\frac{2}{L_z} \int_0^{L_z} \cos(k_n z) e^{ik(z-z_0)} dz = \frac{2k}{iL_z(k^2 - k_n^2)} [\cos(n\pi) e^{ik(L_z-z_0)} - e^{-ikz_0}].$$

The rest of the integral over k is of an even function—remember that we defined $I_1(-kR)=I_1(kR)$. Hence $$v_n I_1'(k_n R) = \frac{G\omega R^2}{J} \int_0^{\infty} \frac{2I_1(y)}{y} \frac{2\cos(yz_1/R)}{y}(d_1 - d_2 e_1/e_2)$$

$$\frac{2yL_z/R}{(k^2 L_z^2/R^2 - n^2\pi^2)} [\cos(n\pi)\sin(y(L_z-z_0)/R + \sin(yz_0/R)]dy$$

We are then able to work out the electric field on the surface of the cylinder. The maximum values ($E_\phi$ when $\cos\phi=1$ and $E_z$ when $\sin\phi=1$) are shown in FIG. 45. The field is reduced and has a maximum value of 2.8 V m$^{-1}$.

Figure 46:
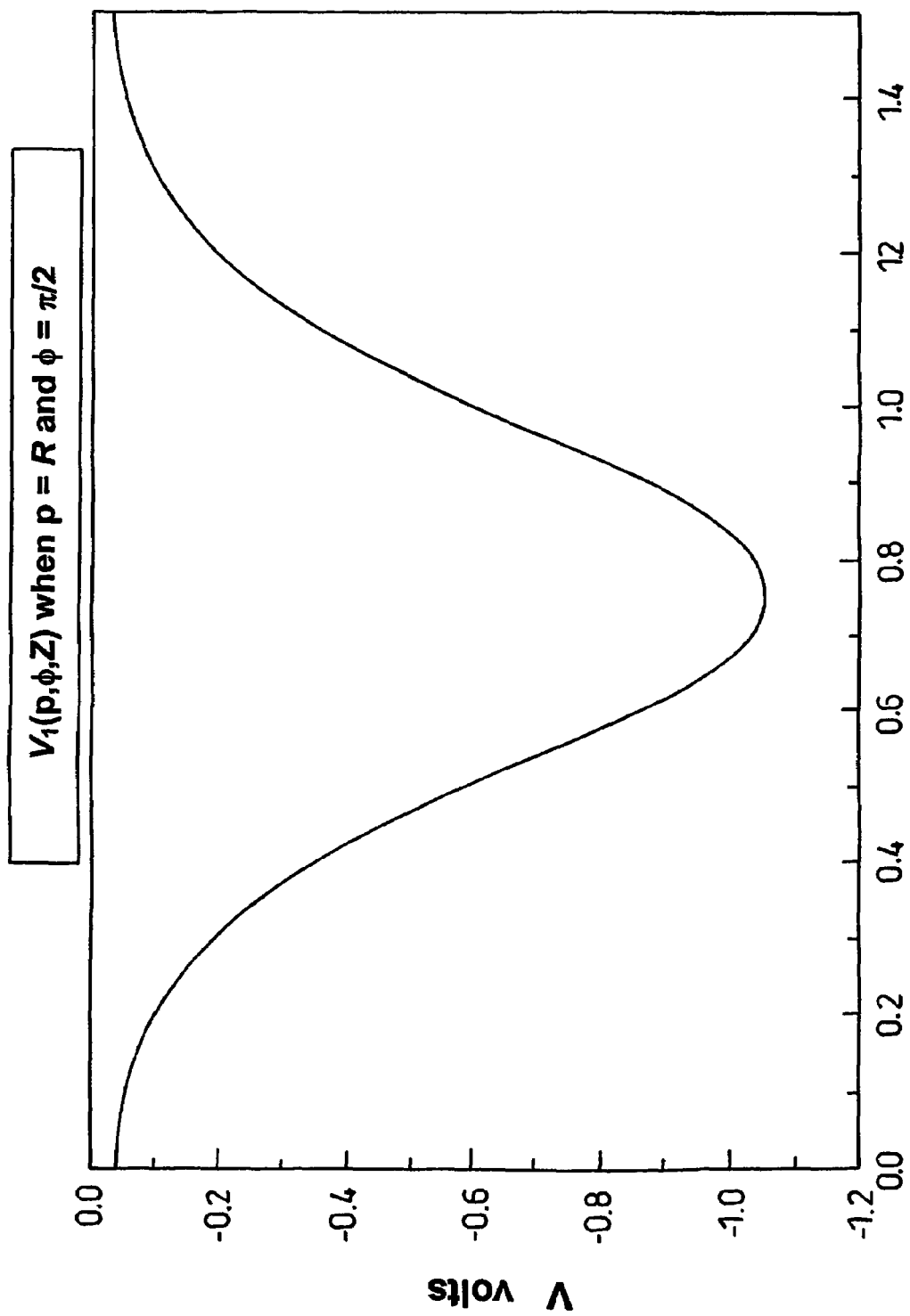

The scalar potential on the surface of the cylinder can also be worked out. The value on the curved surface $\rho=R$ it is $$V_1 = R\sin\phi\left(\frac{1}{2}v_0 + \sum_{n=1}^{\infty} v_n \frac{I_1(k_n R)}{k_n R} \cos(k_n z)\right)$$

is shown in FIG. 46 for $\sin\phi=1$ The potential at $z=0$ as a function of $\rho$ is $$V_1 = R\sin\phi\left(\frac{1}{2}v_0 + \sum_{n=1}^{\infty} v_n \frac{I_1(k_n \rho)}{k_n R}\right)$$

Figure 47:
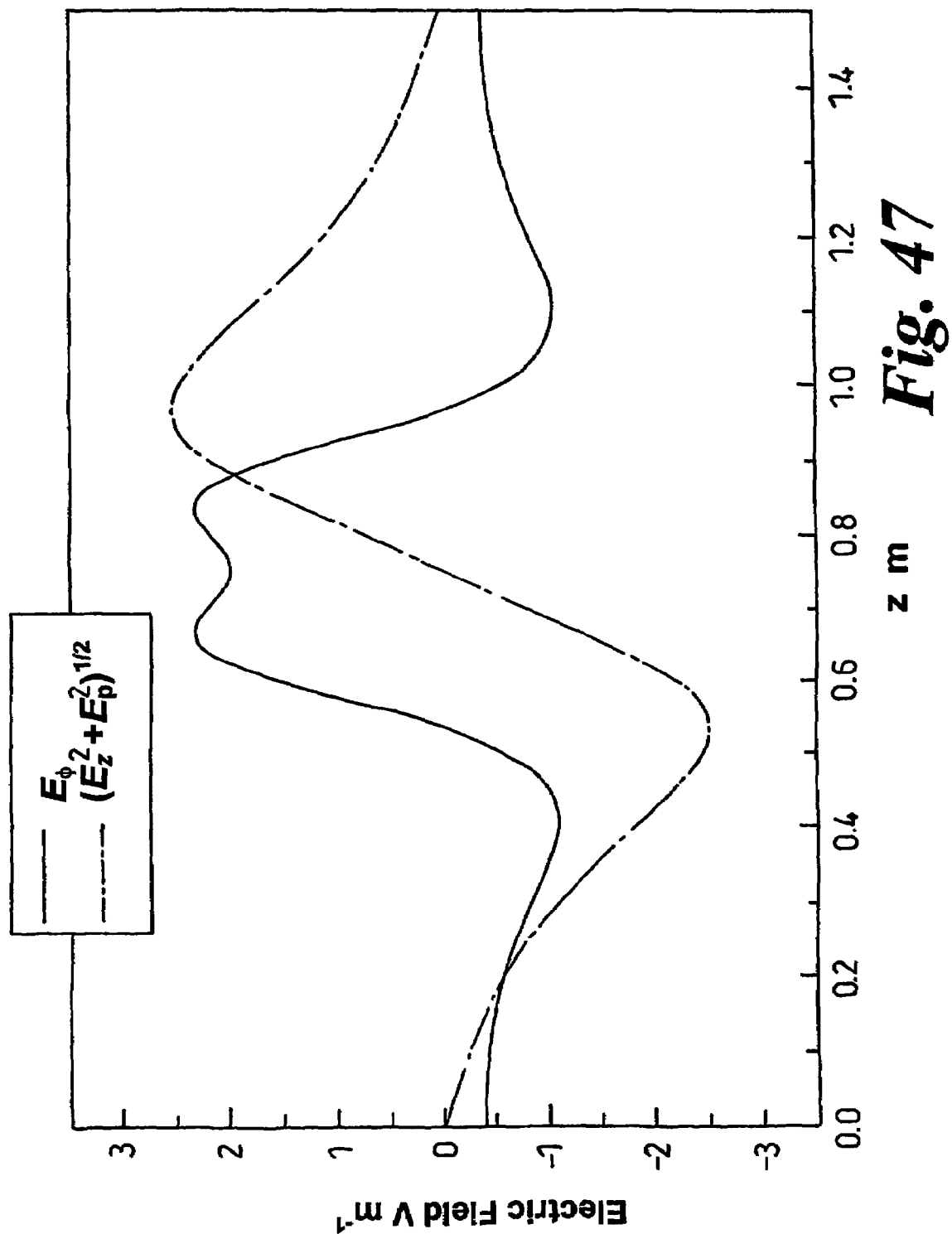

Another choice is to take the scalar potential to be 90% of the $V_1$ specified above so that the radial electric field is not cancelled completely. When $\sin\phi=1$ both $E_\rho$ and $E_z$ are finite at the surface $\rho=R$. In FIG. 47 we show $(E_\rho^2+E_z^2)^{1/2}$ for $\sin\phi=1$ at the surface $\rho=R$, and $E_\phi$ for $\cos\phi=1$. There is a slight reduction in the maximum electric field to 2.2 V m$^{-1}$, as shown in FIG. 47.

7.2.3 Use of this as a Head Coil

Now suppose the centre of the coils is at a position $z_0=-0.2$ m. We take the trunk of the human to be a cylinder of length 1.5 m with the head a sphere centred at say $z=-0.12$ m. The region of the coil where the gradient is uniform centres on the brain. Because the head is much smaller than the body, the electric field induced in the head is relatively small compared to that in the body. We now calculate the electric field inside the body (treated as a cylinder) starting off with the part due to the vector potential.

Figure 48:
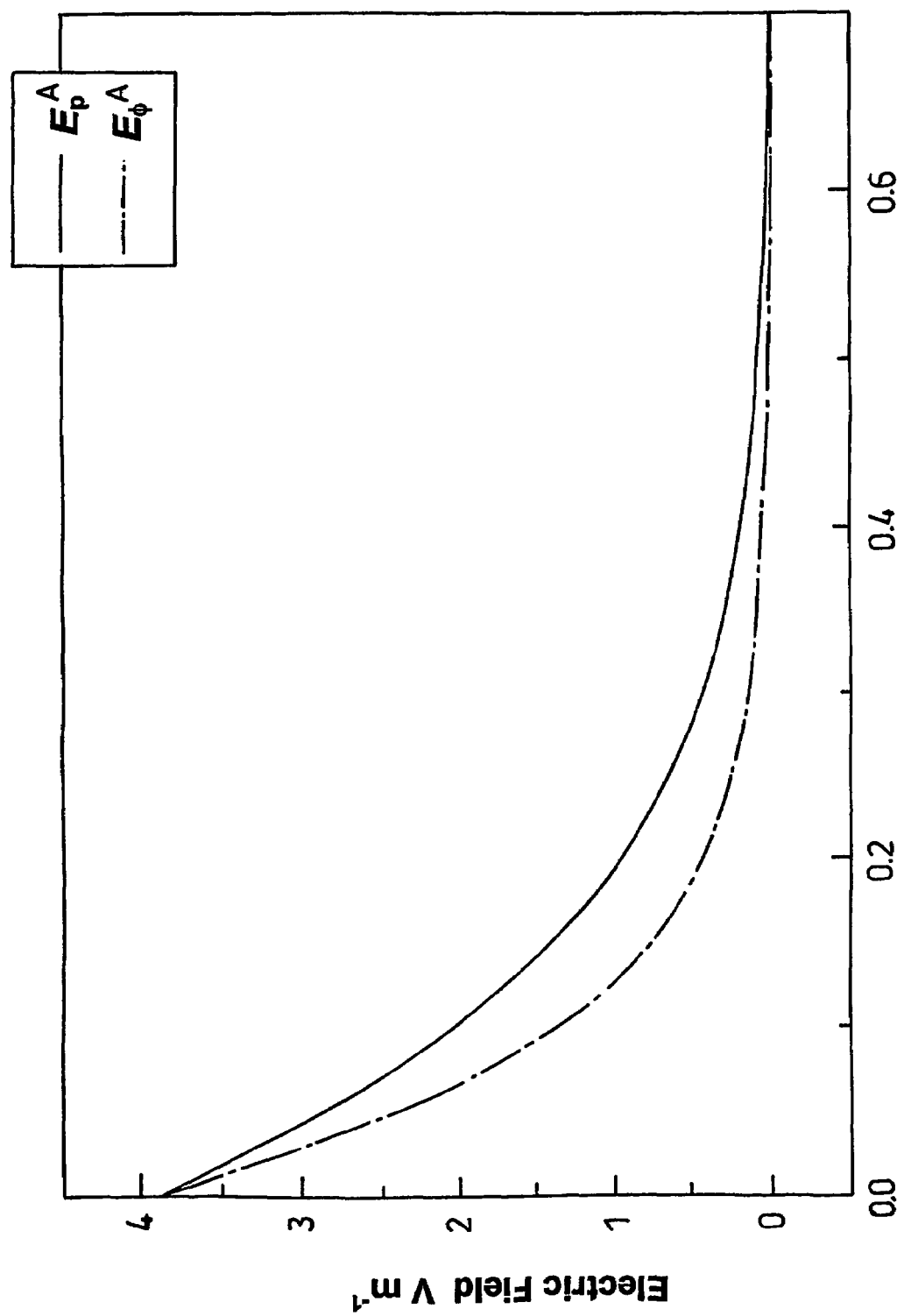
Figure 49:
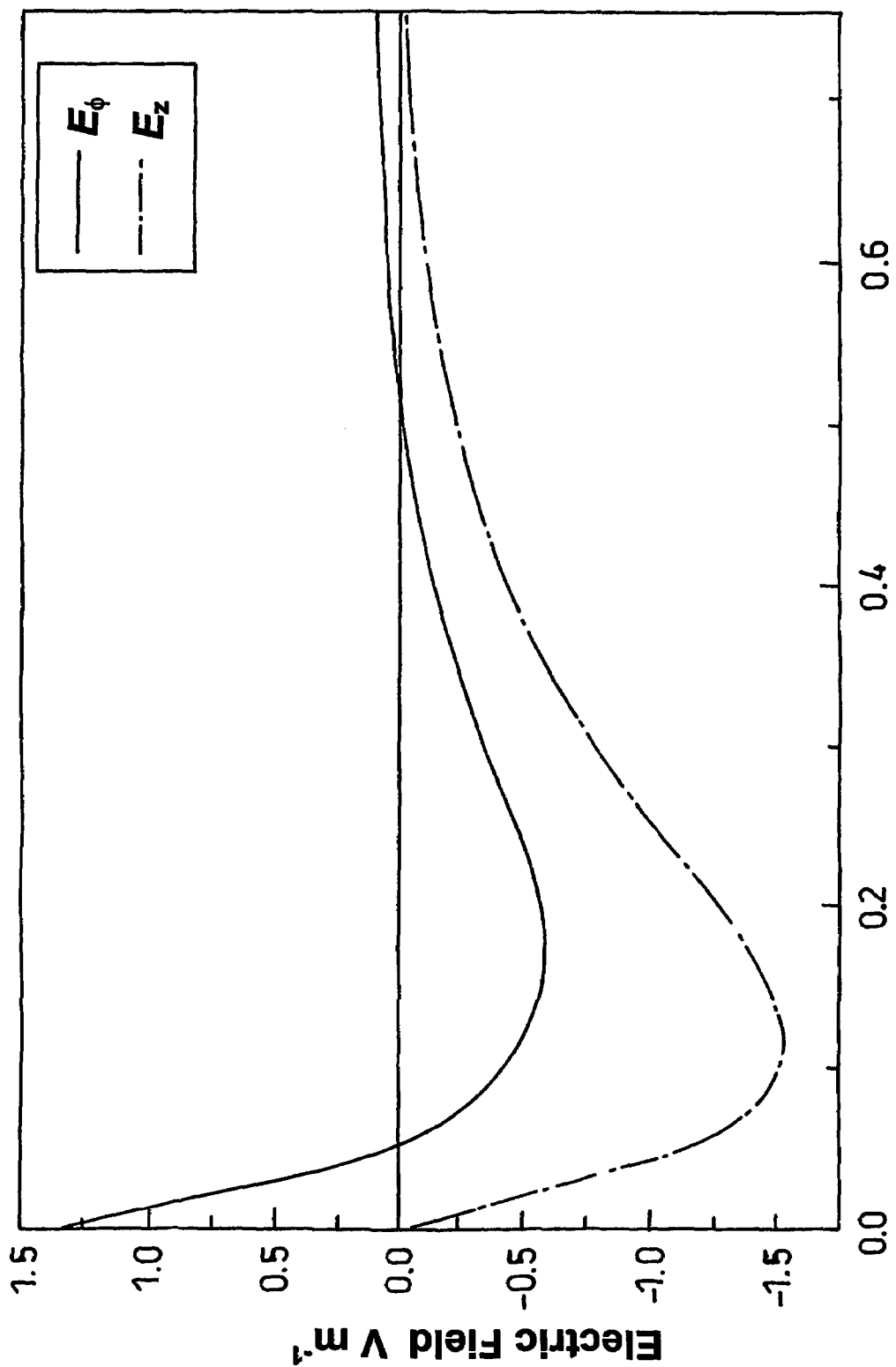

The electric field without any surface charge (that is V=0) is shown in FIG. 48. The maximum is about 4 V m$^{-1}$. Now let us repeat the analysis given above with the boundary condition that the normal component of electric field on the surfaces of the cylinder are zero. The electric field on the outer surface of the cylinder has values given in FIG. 49. The maximum value occurs at $z=0$ and is about 1.56 V m$^{-1}$.

We can improve on this slightly by adding an extra potential of the form $$V_2 = \sin\phi \sum \frac{A_n}{\alpha_n} e^{-\alpha_n z} J_1(\alpha_n \rho)$$

with $\alpha_n>0$ so that the potential decreases with increase in z. As a simple example, we can take $$V_2 = \sin\phi \frac{A_1}{\alpha_1} e^{-\alpha_1 z} J_1(\alpha_1 \rho)$$

with $\alpha_1 R$ to be fixed. In what follows we chose $\alpha_1 R=0.8$.

Then $$E_\rho^{V2} = -\sin\phi A_1 e^{-\alpha_1 z} J_1'(k_n\rho),$$

$$E_\phi^{V2} = -\cos\phi A_1 e^{-\alpha_1 z} \frac{J_1(\alpha_1\rho)}{\alpha_1\rho}$$

$$E_z^{V2} = \sin\phi A_1 e^{-\alpha_1 z} J_1(\alpha_1\rho).$$

Figure 50:
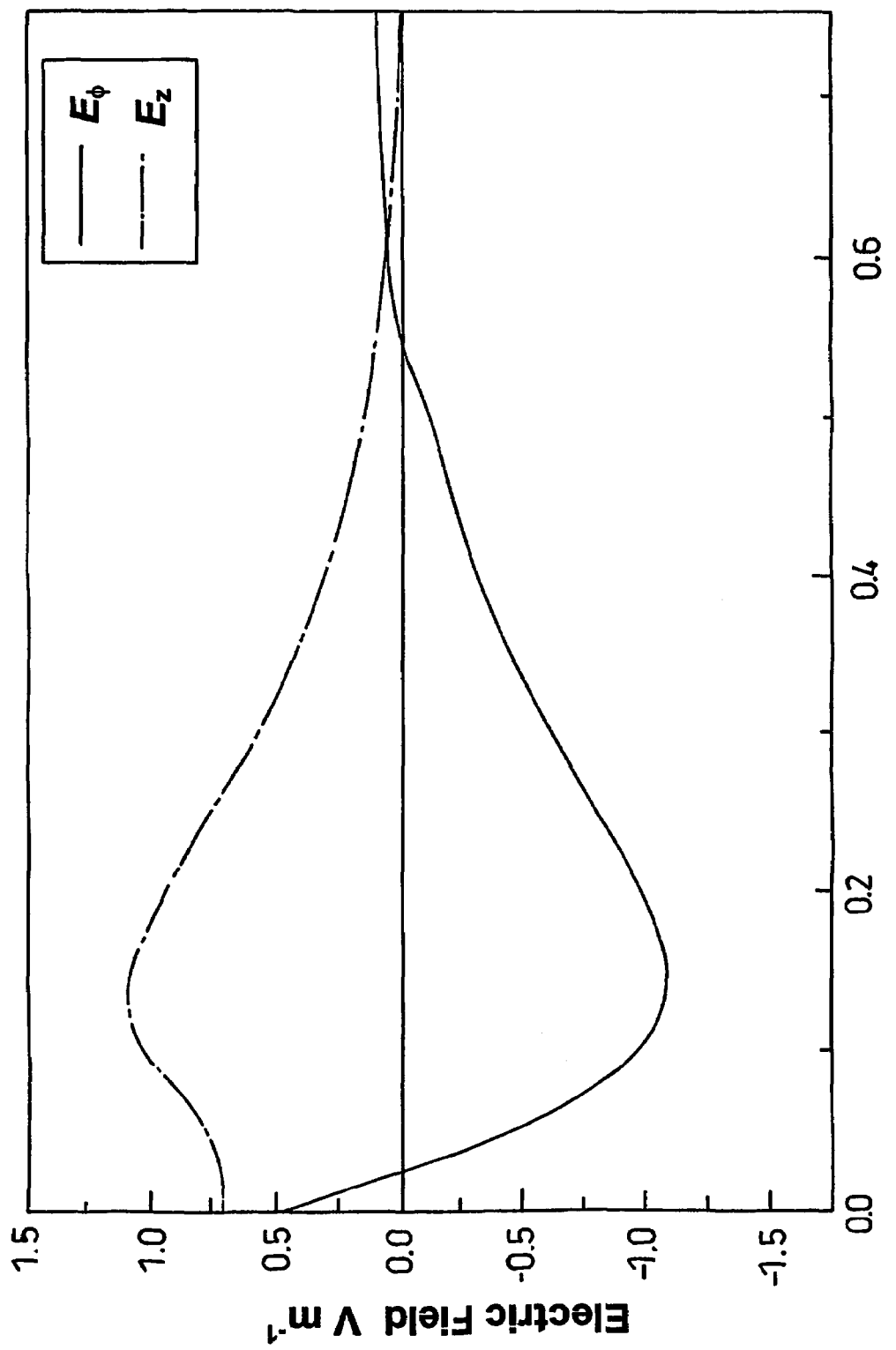

Then by adjusting $A_1$ we can get a smaller value of the maximum electric field. For $A_1=1.9\,V\,m^{-1}$. We get the curve shown in FIG. 50 with a maximum field of $1.1\,V\,m^{-1}$.

The parameters of the coil can also be adjusted. For example, if we take the coil to have $R_1=0.28$ m with the other radii unchanged and take a spacing of $z_0=0.09397$ m to optimize the field gradient the maximum electric field with $V_1$ and $V_2$ is $0.94\,V\,m^{-1}$ for $\alpha_1 R=0.8$ and $A_1=1.45\,V\,m^{-1}$. The region of uniformity of the field gradient is smaller, but the maximum electric field is reduced.

The invention claimed is:

1. A method of reducing induced electric fields and currents in a patient being scanned by MRI who is subjected to time dependent magnetic field gradients generated by a gradient coil, said gradient coil generating a vector potential A which gives rise to a non-zero electric induction field $E^A$, said method comprising backing off the electric induction field $E^A$ either by addition of an external electric field created actively or by conduction of at least one current external to the patient implemented passively so as to reduce the maximum magnitude of the electric field experienced by the patient.

2. A method of reducing induced electric fields and currents in the patient as claimed in claim 1 in which the backing off step is accomplished passively by placing at least two plate electrodes one either side of the patient, said electrodes being connected by a highly electrically conductive wire.

3. A method of reducing induced electric fields and currents in the patient as claimed in claim 2 in which each pair of plates are flat or curved in shape.

4. A method of reducing induced electric fields and currents in the patient as claimed in claim 3, each plate comprising a mosaic of smaller non-contiguous electrodes.

5. A method of reducing induced electric fields and currents in the patient as claimed in claim 1, in which the backing off step is accomplished actively by driving one or more pairs of plate electrodes, each pair of plate electrodes comprising a first plate and a second plate disposed on opposite sides of the patient and being driven from a suitable voltage source.

6. A method of reducing induced electric fields and currents in the patient as claimed in claim 5 in which each plate comprises a mosaic of smaller non-contiguous electrodes, each electrode in the first plate and its corresponding electrode in the second plate being actively driven in pairs from a plurality of suitable voltage sources.

7. A method of reducing induced electric fields and currents in the patient as claimed in claim 1 in which the backing off step is accomplished by independently creating a vector potential to oppose the vector potential created by the currents in the gradient coil.

8. A method of reducing induced electric fields and currents in patients as claimed in claim 7 in which the independently created vector potential is created by a set of long solenoids or by suitably placed and sized toroidal coils.

9. A method of reducing induced electric fields and currents in the patient as claimed in claim 1 in an MRI apparatus and including configuring a gradient coil system in the MRI apparatus such that a component of the vector potential along the body axis is substantially zero over a body volume.

10. A method of reducing electric fields and currents in the patient as claimed in claim 1 in an MRI apparatus including configuring a gradient coil system in the MRI apparatus such that a component of the vector potential along the body axis is substantially constant over a body volume.

11. A method of reducing induced electric fields and currents in the patient as claimed in claim 1 in an MRI apparatus and including the steps of magnetically screening a gradient coil in the MRI apparatus such that the gradient coil generates no magnetic field outside the coil assembly and a substantially zero component of magnetic vector potential along the body axis over the body volume within the MRI apparatus.

12. A method of reducing induced electric fields and currents in the patient as claimed in claim 1 including the step of surrounding the patient with deformable pillows or bags containing dielectric and conductive material selected to match the average characteristics of the patient's body with regard to resistivity and permittivity.

13. A method of reducing induced electric fields and currents in the patient as claimed in claim 12 in which the dielectric and conductive material is contained within beads of suitable material.

14. Apparatus for reducing induced electric fields and currents in a patient being scanned by MRI who is subjected to time dependent magnetic field gradients generated by a gradient coil, said apparatus comprising a patient-receiving volume and the gradient coil generating a vector potential A which gives rise to a non-zero electric induction field $E^A$ within the patient-receiving volume and means for backing off the electric induction field $E^A$ either by addition of an external electric field generated actively or by conduction of at least one current external to the patient implemented passively so as to reduce the maximum amplitude of the electric field experienced by the patient in the patient-receiving volume.

15. Apparatus for reducing induced electric fields and currents in the patient as claimed in claim 14, in which the apparatus comprises at least two plate electrodes placed on opposing sides of the patient-receiving volume, said electrodes being connected by a highly electrically conductive wire.

16. Apparatus for reducing induced electric fields and currents in the patient as claimed in claim 15 in which each pair of plates are flat or curved in shape.

17. Apparatus for reducing induced electric fields and currents in the patient as claimed in claim 15 in which each plate electrode comprises a mosaic of smaller non-contiguous electrodes.

18. Apparatus for reducing induced electric fields and currents in the patient as claimed in claim 14, in which the apparatus comprises at least a first plate electrode and a second plate electrode respectively placed on opposing sides of the patient-receiving volume, the electrodes being connected via a suitable voltage source.

19. Apparatus for reducing induced electric fields and currents in the patient as claimed in claim 18, in which each plate comprises a mosaic of smaller non-contiguous electrodes, each electrode in the first plate and its corresponding electrode in the second plate being actively driven in pairs and including a plurality of suitable voltage sources.

20. Apparatus for reducing induced electric fields and currents in the patient as claimed in claim 14, in which the apparatus comprises means for independently creating a vector potential to oppose the vector potential created by the currents in the gradient coil.

21. Apparatus for reducing induced electric fields and currents in the patient as claimed in claim 20, in which the independently created vector potential is created by a set of long solenoids or by suitably placed and sized torroidal coils.

22. Apparatus as claimed in claim 14 for reducing induced electric fields and currents in the patient in MRI apparatus, said apparatus comprising in combination a gradient coil system configured to produce a minimum in a component of the vector potential along a body axis and including a means for backing off the contribution to the electric field $E^A$ from the vector potential created by the currents in the gradient coil and in directions orthogonal to the body axis.

23. Apparatus for reducing induced electrical fields and currents in the patient as claimed in claim 14, including a coil for generating a gradient field for an MRI apparatus, said gradient field having a substantially zero component of magnetic vector potential along the body axis defined as a line substantially parallel to the spine of the patient.

24. Apparatus for reducing induced electric fields and currents in the patient as claimed in claim 14 and including means for magnetically screening a gradient coil such that the coil generates no magnetic field outside the coil assembly and a substantially zero component of magnetic vector potential along the body axis over the body volume within an MRI apparatus.

25. Apparatus as claimed in claim 24 in which said gradient coil and said means for magnetically screening said gradient coil both comprise fingerprint coils.

26. Apparatus as claimed in claim 24 in which said gradient coil and said means for magnetically screening said gradient coil both comprise arcuate coils.

27. Apparatus as claimed in claim 24 in which said gradient coil is an arcuate coil and said means for magnetically screening said gradient coil comprises a set of fingerprint coils.

28. Apparatus for reducing induced electric fields and currents in the patent as claimed in claim 14 in which the magnetic field is generated by at least four rectangular current loops suitably positioned so as to create a uniform transverse magnetic field gradient.

29. Apparatus for reducing electric fields and currents in the patient as claimed in claim 14 and including deformable pillows or bags containing dielectric and conductive material selected to match the average characteristics of the patient's body with regard to resistivity and permittivity.

30. Apparatus for reducing induced electric fields and currents in the patient as claimed in claim 29 in which the dielectric and conductive material is contained within beads of suitable material.

* * * * *